United States Patent
Shinohara et al.

(10) Patent No.: US 8,012,528 B2
(45) Date of Patent: *Sep. 6, 2011

(54) COMPOSITION FOR CONDUCTIVE MATERIALS COMPRISING TETRA ACRYLATE FUNCTIONALISED ARYLAMINES, CONDUCTIVE MATERIAL AND LAYER, ELECTRONIC DEVICE AND EQUIPMENT

(75) Inventors: Yuji Shinohara, Suwa (JP); Koichi Terao, Suwa (JP); Takashi Shinohara, Suwa (JP)

(73) Assignee: Seiko Epson Corporation, Toyko (JP)

( * ) Notice: Subject to any disclaimer, the term of this patent is extended or adjusted under 35 U.S.C. 154(b) by 1160 days.

This patent is subject to a terminal disclaimer.

(21) Appl. No.: 11/661,099

(22) PCT Filed: Aug. 25, 2005

(86) PCT No.: PCT/JP2005/015969
§ 371 (c)(1),
(2), (4) Date: May 3, 2007

(87) PCT Pub. No.: WO2006/022439
PCT Pub. Date: Mar. 2, 2006

(65) Prior Publication Data
US 2008/0107914 A1    May 8, 2008

(30) Foreign Application Priority Data

Aug. 26, 2004 (JP) .................. 2004-246365
Apr. 1, 2005 (JP) .................. 2005-105747

(51) Int. Cl.
*B05D 5/06* (2006.01)
*B05D 3/00* (2006.01)

(52) U.S. Cl. ....... 427/66; 427/384; 427/402; 427/419.8; 427/498; 427/511; 313/503; 313/506; 428/690; 438/29

(58) Field of Classification Search .............. 427/66, 427/384, 402, 419.8, 551, 553, 558, 559, 427/498, 511; 313/503, 504, 506; 428/690; 438/29

See application file for complete search history.

(56) References Cited

U.S. PATENT DOCUMENTS

| | | |
|---|---|---|
| 5,929,194 A | 7/1999 | Woo et al. |
| 2004/0161634 A1* | 8/2004 | Berntsen et al. ............. 428/690 |
| 2004/0161696 A1* | 8/2004 | Hsu et al. ..................... 430/200 |

FOREIGN PATENT DOCUMENTS

| | | |
|---|---|---|
| JP | A 9-255774 | 9/1997 |
| JP | 2000-147815 | * 11/1998 |
| JP | A 2000-208254 | 7/2000 |
| JP | A-2002-40686 | 2/2002 |
| WO | WO 03/074628 A1 | 9/2003 |

OTHER PUBLICATIONS

M. Bayerl et al., "Crosslinkable Hole-Transport Materials for Preparation of Multilayer Organic Light Emitting Devices by Spin-Coating", Macromolecular Rapid Communication, vol. 20, No. 4, 1999, pp. 224-228.

A. Bacher et al., "Photo-Cross-Linked Triphenylenes as Novel Insoluble Hole Transport Materials in organic LEDs", Macromolecules, vol. 32, 1999, pp. 4551-4557.

* cited by examiner

*Primary Examiner* — James Lin
(74) *Attorney, Agent, or Firm* — Oliff & Berridge, PLC

(57) ABSTRACT

The object of the present invention is to provide a composition for conductive materials from which a conductive layer having a high carrier transport ability can be made, a conductive material formed of the composition and having a high carrier transport ability, a conductive layer formed using the conductive material as a main material, an electronic device provided with the conductive layer and having high reliability, and electronic equipment provided with the electronic device. The composition for conductive materials of the present invention comprising a compound represented by the following general formula (A1): wherein eight Rs may be the same or different and each independently represents a hydrogen atom, a methyl group or an ethyl group, Y represents a group containing at least one substituted or unsubstituted aromatic hydrocarbon ring or substituted or unsubstituted heterocycle, and $X^1$, $X^2$, $X^3$ and $X^4$ may be the same or different and each independently represents a substituent represented by the following general formula (A2): wherein n is an integer of 2 to 8 and $Z^1$ represents a hydrogen atom or a methyl group.

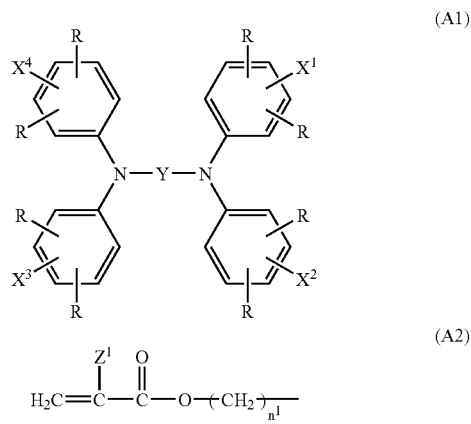

15 Claims, 7 Drawing Sheets

COMPOSITION FOR CONDUCTIVE MATERIALS COMPRISING TETRA ACRYLATE FUNCTIONALISED ARYLAMINES, CONDUCTIVE MATERIAL AND LAYER, ELECTRONIC DEVICE AND EQUIPMENT

TECHNICAL FIELD

The present invention relates to a composition for conductive materials, a conductive material, a conductive layer, an electronic device, and electronic equipment, and more specifically to a composition for conductive materials from which a conductive layer having a high carrier transport ability can be made, a conductive material formed of the composition and having a high carrier transport ability, a conductive layer formed using the conductive material as a main material, an electronic device provided with the conductive layer and having high reliability, and electronic equipment provided with the electronic device.

BACKGROUND ART

Electroluminescent devices using organic materials (hereinafter, simply referred to as an "organic EL device") have been extensively developed in expectation of their use as solid-state luminescent devices or emitting devices for use in inexpensive large full-color displays.

In general, such an organic EL device has a structure in which a light emitting layer is provided between a cathode and an anode. When an electric field is applied between the cathode and the anode, electrons are injected into the light emitting layer from the cathode side, and holes are injected into the light emitting layer from the anode side.

The injected electrons and holes are recombined in the light emitting layer, which then causes their energy level to return from the conduction band to the valence band. At this time, excitation energy is released as light energy so that the light emitting layer emits light.

In such organic EL devices, it has been known that a layered device structure, in which organic layers formed of organic materials having different carrier transport properties for electrons or holes are provided between a light emitting layer and a cathode and/or an anode, is effective in obtaining a high-efficiency organic EL device with high luminance.

For this purpose, it is necessary to laminate a light emitting layer and organic layers having different carrier transport properties from each other (hereinafter, these layers are collectively referred to as "organic layers") on the electrode. However, in the conventional manufacturing method using an application method, when such organic layers are laminated, mutual dissolution occurs between the adjacent organic layers, thereby causing the problem of deterioration in the light emitting efficiency of a resultant organic EL device, the color purity of emitted light, and/or the pattern precision.

For this reason, in the case where organic layers are laminated, these organic layers have to be formed using organic materials having different solubilities.

In order to solve such a problem, a method for improving the durability of a lower organic layer, that is, the solvent resistance of the lower organic layer has been disclosed (see, for example, JP-A No. 9-255774). In this method, organic materials constituting the lower organic layer are polymerized to improve the solvent resistance of the lower organic layer.

Another method for improving the solvent resistance of a lower organic layer is found in JP-A No. 2000-208254. This publication discloses a method in which a curing resin is added to an organic material constituting the lower organic layer to cure the organic material together with the curing resin.

However, even in the case where such a method is employed in manufacturing an organic EL device, the characteristics of the resultant organic EL device are not so improved as to meet expectations in actuality.

The problem described above has also been raised in thin film transistors using organic materials.

DISCLOSURE OF INVENTION

It is therefore the object of the present invention to provide a composition for conductive materials from which a conductive layer having a high carrier transport ability can be made, a conductive material having a high carrier transport ability obtained by using the composition for conductive materials, a conductive layer obtained by using the conductive material as a main material, a high-reliability electronic device provided with the conductive layer, and electronic equipment provided with the electronic device.

In order to achieve the above object, the present invention is directed to a composition for conductive materials, which comprises a compound represented by the following general formula (A1):

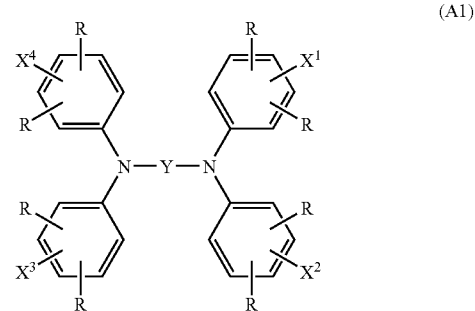

(A1)

wherein eight Rs may be the same or different and each independently represents a hydrogen atom, a methyl group, or an ethyl group, Y represents a group containing at least one substituted or unsubstituted aromatic hydrocarbon ring or substituted or unsubstituted heterocycle, and $X^1$, $X^2$, $X^3$ and $X^4$ may be the same or different and each independently represents a substituent represented by the following general formula (A2):

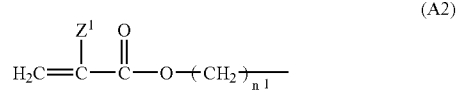

(A2)

wherein $n^1$ is an integer of 2 to 8 and $Z^1$ represents a hydrogen atom or a methyl group.

According to the present invention described above, it is possible to provide a composition for conductive materials from which a conductive layer having a high carrier transport ability can be made.

In the composition for conductive materials according to the present invention, it is preferred that the group Y contains at least one substituted or unsubstituted aromatic hydrocarbon ring.

By using such a composition, it is possible for a polymer obtained by polymerization reaction of the compounds represented by the above-mentioned general formula (A1) with each other at any one or more of their respective substituents $X^1$, $X^2$, $X^3$ and $X^4$ to exhibit a hole transport ability.

Further, in the composition for conductive materials according to the present invention, it is also preferred that the substituent $X^1$ and the substituent $X^3$ are identical with each other.

This makes it possible for adjacent main skeletons which are portions of the compounds represented by the above-mentioned general formula (A1) other than the substituents $X^1$, $X^2$, $X^3$ and $X^4$ thereof to make variation in their intervals small in a resultant polymer, thereby enabling to improve a hole transport ability of the polymer.

Further, in the composition for conductive materials according to the present invention, it is also preferred that the substituent $X^2$ and the substituent $X^4$ are identical with each other.

This also makes it possible to make variation in intervals between the adjacent main skeletons small in a resultant polymer, thereby enabling to further improve a hole transport ability of the polymer.

Further, in the composition for conductive materials according to the present invention, it is also preferred that the substituent $X^1$, the substituent $X^2$, the substituent $X^3$ and the substituent $X^4$ are identical with each other.

This also makes it possible to make variation in intervals between the adjacent main skeletons small in a resultant polymer, thereby enabling to further improve a hole transport ability of the polymer.

Furthermore, in the composition for conductive materials according to the present invention, it is also preferred that each of the substituent $X^1$, the substituent $X^2$, the substituent $X^3$ and the substituent $X^4$ is bonded to the 3-, 4- or 5-position of the benzene ring.

This makes it possible for the adjacent main skeletons to exist at a suitable interval more reliably in a resultant polymer.

Moreover, in the composition for conductive materials according to the present invention, it is also preferred that the group Y consists of carbon atoms and hydrogen atoms.

This makes it possible for a resultant polymer to have a high hole transport ability, and therefore a conductive layer to be formed from the polymer can also have a high hole transport ability.

Moreover, in the composition for conductive materials according to the present invention, it is also preferred that the group Y contains 6 to 30 carbon atoms in total.

This also makes it possible for the resultant polymer to have a higher hole transport ability, and therefore a conductive layer to be formed from the polymer can also have a higher hole transport ability.

Moreover, in the composition for conductive materials according to the present invention, it is also preferred that the group Y contains 1 to 5 aromatic hydrocarbon rings.

This also makes it possible for the resultant polymer to have a higher hole transport ability, and therefore a conductive layer to be formed from the polymer can also have a higher hole transport ability.

Moreover, in the composition for conductive materials according to the present invention, it is also preferred that the group Y is a biphenylene group or a derivative thereof.

This also makes it possible for the resultant polymer to have a higher hole transport ability, and therefore a conductive layer to be formed from the polymer can also have a higher hole transport ability.

Moreover, in the present invention, it is also preferred that the composition further comprises an acrylic cross-linking agent.

This makes it possible to obtain a polymer having a linking structure produced by polymerization reaction of any one or more of the substituent $X^1$, the substituent $X^2$, the substituent $X^3$ and the substituent $X^4$ of the compound (hereinafter, each of these substituents will be referred to as "substituent X" and all of these substituents will be collectively referred to as "the substituents X" depending on the occasions) and any one or more of the substituents X of the other compound via an acrylic cross-linking agent. According to such a polymer, since an interval between the main skeletons of the compounds is maintained at a more suitable interval, interaction between the main skeletons can be further decreased. As a result, the polymer can exhibit an especially high hole transport ability.

In the composition for conductive materials according to the present invention, it is preferred that the acrylic cross-linking agent mainly contains a polyester(meth)acrylate-based cross-linking agent.

According to the composition for conductive materials described above, it is possible to produce a polymer in which the substituents X and the polyester(meth)acrylate-based cross-linking agent are evenly distributed, thereby enabling a conductive layer having a uniform membrane property to be formed from the polymer.

In the composition described above, it is preferred that the polyester(meth)acrylate-based cross-linking agent contains at least two (meth)acryloyl groups.

This makes it possible to link the substituent X and the substituent X together via the polyester(meth)acrylate-based cross-linking agent more reliably.

Moreover, in the composition described above, it is also preferred that the polyester(meth)acrylate-based cross-linking agent contains a compound represented by the following general formula (B1) as a main ingredient thereof:

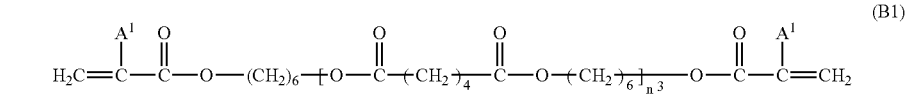

(B1)

wherein $n^3$ is an integer of 4,500 or less, and two $A^1$s may be the same or different and each independently represents a hydrogen atom or a methyl group.

This makes it possible to produce a polymer having an especially high hole transport material.

Further, in the composition described above, it is preferred that the substituent $X^1$ and the substituent $X^3$ are identical with each other.

This makes it possible to properly prevent the electron density in a resultant polymer from being biased, and thereby enabling to improve a hole transport ability of the polymer.

Further, in the composition described above, it is also preferred that the substituent $X^2$ and the substituent $X^4$ are identical with each other.

This also makes it possible to properly prevent the electron density in a resultant polymer from being biased, and thereby enabling to improve a hole transport ability of the polymer.

Furthermore, in the composition described above, it is preferred that the substituent $X^1$, the substituent $X^2$, the substituent $X^3$ and the substituent $X^4$ are identical with each other.

This also makes it possible to properly prevent the electron density in a resultant polymer from being biased, and thereby enabling to further improve a hole transport ability of the polymer.

Moreover, in the composition for conductive materials according to the present invention, it is also preferred that linking agent are evenly distributed, thereby enabling a conductive layer having a uniform membrane property to be formed from the polymer.

In the composition described above, it is preferred that the epoxy(meth)acrylate-based cross-linking agent contains at least two (meth)acryloyl groups.

This makes it possible to link the substituent X and the substituent X together via the epoxy(meth)acrylate-based cross-linking agent more reliably.

Further, in the composition described above, it is preferred that the epoxy(meth)acrylate-based cross-linking agent contains a compound represented by the following general formula (B4) as a main ingredient thereof:

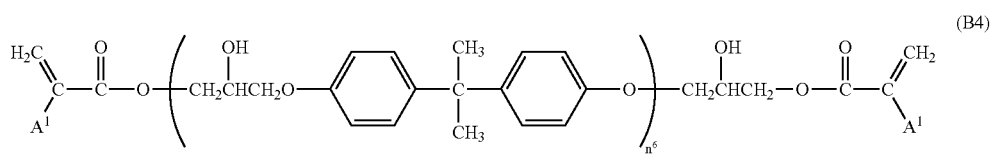

each of the substituent $X^1$, the substituent $X^2$, the substituent $X^3$ and the substituent $X^4$ is bonded to the 3-, 4- or 5-position of the benzene ring.

This makes it possible for the adjacent main skeletons to exist at a suitable interval more reliably in a resultant polymer.

Further, in the composition descried above, it is also preferred that the group Y consists of carbon atoms and hydrogen atoms.

This makes it possible for a resultant polymer to have a high hole transport ability, and therefore a conductive layer to be formed from the polymer can also have a high hole transport ability.

Moreover, in the composition described above, it is also preferred that the group Y contains 6 to 30 carbon atoms in total.

This also makes it possible for the resultant polymer to have a higher hole transport ability, and therefore a conductive layer to be formed from the polymer can also have a higher hole transport ability.

Moreover, in the composition described above, it is also preferred that the group Y contains 1 to 5 aromatic hydrocarbon rings.

This also makes it possible for the resultant polymer to have a higher hole transport ability, and therefore a conductive layer to be formed from the polymer can also have a higher hole transport ability.

Moreover, in the composition described above, it is also preferred that the group Y is a biphenylene group or a derivative thereof.

This also makes it possible for the resultant polymer to have a higher hole transport ability, and therefore a conductive layer to be formed from the polymer can also have a higher hole transport ability.

In the composition for conductive materials according to the present invention, it is also preferred that the acrylic cross-linking agent mainly contains an epoxy(meth)acrylate-based cross-linking agent.

According to the composition for conductive materials described above, it is possible to produce a polymer in which the substituents X and the epoxy(meth)acrylate-based crosswherein $n^6$ is an integer of 1 to 10, and two $A^1$s may be the same or different and each independently represents a hydrogen atom or a methyl group.

By using such a compound as described above, it is possible to produce a polymer having an especially high hole transport ability.

Further, in the composition described above, it is also preferred that the substituent $X^1$ and the substituent $X^3$ are identical with each other.

This makes it possible for adjacent main skeletons which are portions of the compounds represented by the above-mentioned general formula (A1) other than the substituents $X^1$, $X^2$, $X^3$ and $X^4$ thereof to make variation in their intervals small in a resultant polymer, thereby enabling to improve a hole transport ability of the polymer.

Further, in the composition described above, it is also preferred that the substituent $X^2$ and the substituent $X^4$ are identical with each other.

This also makes it possible to make variation in intervals between the adjacent main skeletons small in a resultant polymer, thereby enabling to further improve a hole transport ability of the polymer.

Further, in the composition described above, it is also preferred that the substituent $X^1$, the substituent $X^2$, the substituent $X^3$ and the substituent $X^4$ are identical with each other.

This also makes it possible to make variation in intervals between the adjacent main skeletons small in a resultant polymer, thereby enabling to further improve a hole transport ability of the polymer.

Furthermore, in the composition described above, it is also preferred that each of the substituent $X^1$, the substituent $X^2$, the substituent $X^3$ and the substituent $X^4$ is bonded to the 3-, 4- or 5-position of the benzene ring.

This makes it possible for the adjacent main skeletons to exist at a suitable interval more reliably in a resultant polymer.

Further, in the composition descried above, it is also preferred that the group Y consists of carbon atoms and hydrogen atoms.

This makes it possible for the resultant polymer to have a high hole transport ability, and therefore a conductive layer to be formed from the polymer can also have a high hole transport ability.

Moreover, in the composition described above, it is also preferred that the group Y contains 6 to 30 carbon atoms in total.

This also makes it possible for the resultant polymer to have a higher hole transport ability, and therefore a conductive layer to be formed from the polymer can also have a higher hole transport ability.

Moreover, in the composition described above, it is also preferred that the group Y contains 1 to 5 aromatic hydrocarbon rings.

This also makes it possible for the resultant polymer to have a higher hole transport ability, and therefore a conductive layer to be formed from the polymer can also have a higher hole transport ability.

Moreover, in the composition described above, it is also preferred that the group Y is a biphenylene group or a derivative thereof.

This also makes it possible for the resultant polymer to have a higher hole transport ability, and therefore a conductive layer to be formed from the polymer can also have a higher hole transport ability.

In the composition for conductive materials according to the present invention, it is preferred that the acrylic cross-linking agent mainly contains an urethane(meth)acrylate-based cross-linking agent.

According to the composition for conductive materials described above, it is possible to produce a polymer in which the substituents X and the urethane(meth)acrylate-based cross-linking agent are evenly distributed, thereby enabling a conductive layer having a uniform membrane property to be formed from the polymer.

In the composition described above, it is preferred that the urethane(meth)acrylate-based cross-linking agent mainly contains at least one of an aromatic urethane(meth)acrylate-based cross-linking agent, an alicyclic urethane(meth)acrylate-based cross-linking agent, and an aliphatic urethan(meth)acrylate-based cross-linking agent.

This makes it possible to obtain a polymer having excellent flexibility, stiffness and chemical resistance.

In the composition described above, it is preferred that the urethane(meth)acrylate-based cross-linking agent contains at least two (meth)acryloyl groups.

This makes it possible to link the substituent X and the substituent X together via the urethane(meth)acrylate-based cross-linking agent more reliably in a resultant polymer. In addition, it is also possible for adjacent main skeletons to exist at a suitable interval in the resultant polymer.

Further, in the composition described above, it is preferred that the urethane(meth)acrylate-based cross-linking agent contains a compound represented by the following general formula (B9) as a main ingredient thereof:

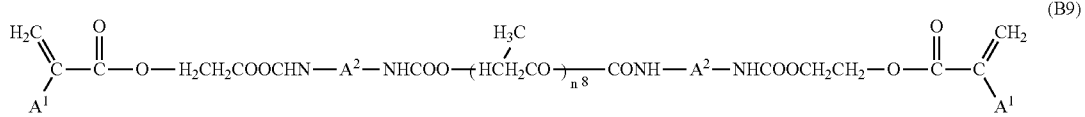

wherein $n^8$ is an integer of 1 to 100, two $A^1$s may be the same or different and each independently represents a hydrogen atom or a methyl group, and two $A^2$s may be the same or different and each independently represents a group obtained by removing two isocyanate groups from a diisocyanate compound.

This makes it possible for the adjacent main skeletons to exist at an appropriate interval in the resultant polymer. As a result, the resultant polymer can has an especially high hole transport ability.

In the composition described above, it is preferred that the urethane(meth)acrylate-based cross-linking agent contains a compound represented by the following general formula (B10) as a main ingredient thereof:

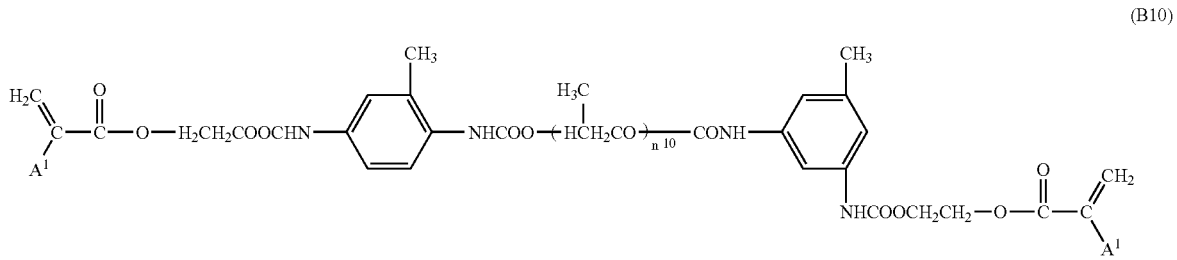

wherein $n^{10}$ is an integer of 1 to 90, and two $A^1$s may be the same or different and each independently represents a hydrogen atom or a methyl group.

According to the composition described above, it is possible to obtain a polymer which is hard to deteriorate or degrade even in the case where it is placed in a relatively high temperature atmosphere.

Further, in the composition described above, it is also preferred that the substituent $X^1$ and the substituent $X^3$ are identical with each other.

This makes it possible for adjacent main skeletons which are portions of the compounds represented by the above-mentioned general formula (A1) other than the substituents $X^1$, $X^2$, $X^3$ and $X^4$ thereof to make variation in their intervals small in a resultant polymer, thereby enabling to improve a hole transport ability of the polymer.

Further, in the composition described above, it is also preferred that the substituent $X^2$ and the substituent $X^4$ are identical with each other.

This also makes it possible to make variation in intervals between the adjacent main skeletons small in a resultant polymer, thereby enabling to further improve a hole transport ability of the polymer.

Further, in the composition described above, it is also preferred that the substituent $X^1$, the substituent $X^2$, the substituent $X^3$ and the substituent $X^4$ are identical with each other.

This also makes it possible to make variation in intervals between the adjacent main skeletons small in a resultant polymer, thereby enabling to further improve a hole transport ability of the polymer.

Furthermore, in the composition described above, it is also preferred that each of the substituent $X^1$, the substituent $X^2$, the substituent $X^3$ and the substituent $X^4$ is bonded to the 3-, 4- or 5-position of the benzene ring.

This makes it possible for the adjacent main skeletons to exist at a suitable interval more reliably in a resultant polymer.

Further, in the composition descried above, it is also preferred that the group Y consists of carbon atoms and hydrogen atoms.

This makes it possible for a resultant polymer to have a high hole transport ability, and therefore a conductive layer to be formed from the polymer can also have a high hole transport ability.

Moreover, in the composition described above, it is also preferred that the group Y contains 6 to 30 carbon atoms in total.

This also makes it possible for the resultant polymer to have a higher hole transport ability, and therefore a conductive layer to be formed from the polymer can also have a higher hole transport ability.

Moreover, in the composition described above, it is also preferred that the group Y contains 1 to 5 aromatic hydrocarbon rings.

This also makes it possible for the resultant polymer to have a higher hole transport ability, and therefore a conductive layer to be formed from the polymer can also have a higher hole transport ability.

Moreover, in the composition described above, it is also preferred that the group Y is a biphenylene group or a derivative thereof.

This also makes it possible for the resultant polymer to have a higher hole transport ability, and therefore a conductive layer to be formed from the polymer can also have a higher hole transport ability.

In the composition for conductive materials according to the present invention, it is also preferred that the group Y contains at least one substituted or unsubstituted heterocycle.

This makes it possible to easily adjust characteristics of a carrier transport ability in a resultant polymer.

Further, in the composition described above, it is also preferred that the substituent $X^1$ and the substituent $X^3$ are identical with each other.

This makes it possible for adjacent main skeletons which are portions of the compounds represented by the above-mentioned general formula (A1) other than the substituents $X^1$, $X^2$, $X^3$ and $X^4$ thereof to make variation in their intervals small in a resultant polymer, thereby enabling to improve a carrier transport ability of the polymer.

Further, in the composition described above, it is also preferred that the substituent $X^2$ and the substituent $X^4$ are identical with each other.

This also makes it possible to make variation in intervals between the adjacent main skeletons small in a resultant polymer, thereby enabling to further improve a carrier transport ability of the polymer.

Further, in the composition described above, it is also preferred that the substituent $X^1$, the substituent $X^2$, the substituent $X^3$ and the substituent $X^4$ are identical with each other.

This also makes it possible to make variation in intervals between the adjacent main skeletons small in a resultant polymer, thereby enabling to further improve a carrier transport ability of the polymer.

Furthermore, in the composition described above, it is also preferred that each of the substituent $X^1$, the substituent $X^2$, the substituent $X^3$ and the substituent $X^4$ is bonded to the 3-, 4- or 5-position of the benzene ring.

This makes it possible for the adjacent main skeletons to exist at a suitable interval more reliably in a resultant polymer.

Further, in the composition descried above, it is also preferred that the heterocycle contains at least one heteroatom selected from the group comprising nitrogen, oxygen, sulfur, selenium and tellurium.

By selecting such a heterocyclic ring which contains such a kind of heteroatom, the energy level of the valence and conduction bands or the size of the band gap of the polymer easily changes, so that it is possible to change the characteristics of the carrier transport ability of the polymer.

Further, in the composition descried above, the heterocycle may be either of an aromatic heterocycle or a nonaromatic heterocycle, but the aromatic heterocycle is more preferable.

By using such an aromatic heterocycle, it is possible to properly prevent the electron density of the main skeleton with a conjugated chemical structure from being biased, that is, it is possible to properly prevent the localization of π electrons. As a result, the carrier transport ability of the polymer is prevented from being impaired.

Further, in the composition descried above, it is preferred that the group Y contains 1 to 5 heterocycles.

By allowing the group Y to have such a number of heterocyclic rings, it is possible to sufficiently change the energy level of the valence and conduction bands or the size of the band gap of the polymer.

Further, in the composition descried above, it is preferred that the group Y contains at least one substituted or unsubstituted aromatic hydrocarbon ring in addition to the heterocycle.

By selecting such a group containing a heterocycle and an aromatic hydrocarbon ring as the group Y, it is possible to impart a desired carrier transport property to the polymer more reliably.

Further, in the composition descried above, it is preferred that the group Y contains two aromatic hydrocarbon rings respectively bonded to each N in the general formula (A1) directly and at least one heterocycle existing between these aromatic hydrocarbon rings.

This makes it possible to prevent the electron density in the polymer from being biased, and thereby enabling each polymer to have an even carrier transport ability.

Furthermore, in the composition described above, it is preferred that the group Y contains 2 to 75 carbon atoms in total.

According to this composition, the solubility of the compound represented by the general formula (A1) in a solvent tends to be increased, so that there is a possibility that the range of the choices of solvents to be used in preparing the composition for conductive materials becomes wide.

In the present invention, it is also preferred that the above composition further comprises an acrylic cross-linking agent.

This makes it possible to obtain a polymer having a linking structure produced by polymerization reaction of a substituent X and a substituent X with an acrylic cross-linking agent. According to such a polymer, since an interval between main skeletons which are portions of the compounds each represented by the above-mentioned general formula (A1) other than the substituents X thereof is maintained at a more suitable interval, interaction between the main skeletons can be further decreased. As a result, the polymer can exhibit an especially high carrier transport ability.

In the composition for conductive materials according to the present invention, it is also preferred that the acrylic cross-linking agent mainly contains a polyester(meth)acrylate-based cross-linking agent.

According to the composition for conductive materials described above, it is possible to produce a polymer in which the substituents X and the polyester (meth)acrylate-based cross-linking agent are evenly distributed, thereby enabling a conductive layer having a uniform membrane property to be formed.

In the composition described above, it is preferred that the polyester(meth)acrylate-based cross-linking agent contains at least two (meth)acryloyl groups.

This makes it possible to link the substituent X and the substituent X together via the polyester(meth)acrylate-based cross-linking agent more reliably.

Moreover, in the composition described above, it is also preferred that the polyester(meth)acrylate-based cross-linking agent contains a compound represented by the following general formula (B1) as a main ingredient thereof:

small in a resultant polymer, thereby enabling to improve a carrier transport ability of the polymer.

Further, in the composition described above, it is also preferred that the substituent $X^2$ and the substituent $X^4$ are identical with each other.

This also makes it possible to make variation in intervals between the adjacent main skeletons small in a resultant polymer, thereby enabling to further improve a carrier transport ability of the polymer.

Further, in the composition described above, it is also preferred that the substituent $X^1$, the substituent $X^2$, the substituent $X^3$ and the substituent $X^4$ are identical with each other.

This also makes it possible to make variation in intervals between the adjacent main skeletons small in a resultant polymer, thereby enabling to further improve a carrier transport ability of the polymer.

Furthermore, in the composition described above, it is also preferred that each of the substituent $X^1$, the substituent $X^2$, the substituent $X^3$ and the substituent $X^4$ is bonded to the 3-, 4- or 5-position of the benzene ring.

This makes it possible for the adjacent main skeletons to exist at a suitable interval more reliably in a resultant polymer.

Further, in the composition descried above, it is also preferred that the heterocycle contains at least one heteroatom selected from the group comprising nitrogen, oxygen, sulfur, selenium and tellurium.

By selecting such a heterocyclic ring which contains such a kind of heteroatom, the energy level of the valence and conduction bands or the size of the band gap of the polymer easily changes, so that it is possible to change the characteristics of the carrier transport ability of the polymer.

Further, in the composition descried above, the heterocycle may be either of an aromatic heterocycle or a nonaromatic heterocycle, but the aromatic heterocycle is more preferable.

By using such an aromatic heterocycle, it is possible to properly prevent the electron density of the main skeleton with a conjugated chemical structure from being biased, that is, it is possible to properly prevent the localization of π electrons. As a result, the carrier transport ability of the polymer is prevented from being impaired.

Further, in the composition descried above, it is preferred that the group Y contains 1 to 5 heterocycles.

By allowing the group Y to have such a number of heterocyclic rings, it is possible to sufficiently change the energy level of the valence and conduction bands or the size of the band gap of the polymer.

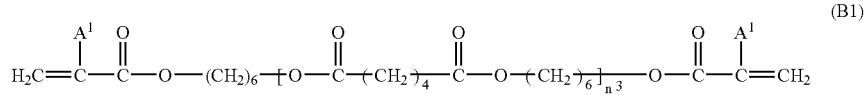

(B1)

wherein $n^3$ is an integer of 4,500 or less, and two $A^1$s may be the same or different and each independently represents a hydrogen atom or a methyl group.

This makes it possible to produce a polymer having an especially high carrier transport ability.

Further, in the composition described above, it is also preferred that the substituent $X^1$ and the substituent $X^3$ are identical with each other.

This makes it possible for adjacent main skeletons which are portions of the compounds represented by the above-mentioned general formula (A1) other than the substituents $X^1$, $X^2$, $X^3$ and $X^4$ thereof to make variation in their intervals Further, in the composition descried above, it is preferred that the group Y contains at least one substituted or unsubstituted aromatic hydrocarbon ring in addition to the heterocycle.

By selecting such a group containing a heterocycle and an aromatic hydrocarbon ring as the group Y, it is possible to impart a desired carrier transport property to the polymer more reliably.

Further, in the composition descried above, it is preferred that the group Y contains two aromatic hydrocarbon rings respectively bonded to each N in the general formula (A1) directly and at least one heterocycle existing between these aromatic hydrocarbon rings.

This makes it possible to prevent the electron density in the polymer from being biased, and thereby enabling each polymer to have an even carrier transport ability.

Furthermore, in the composition described above, it is preferred that the group Y contains 2 to 75 carbon atoms in total.

According to this composition, the solubility of the compound represented by the general formula (A1) in a solvent tends to be increased, so that there is a possibility that the range of the choices of solvents to be used in preparing the composition for conductive materials becomes wide.

In the composition for conductive materials according to the present invention, it is preferred that the acrylic cross-linking agent mainly contains an epoxy(meth)acrylate-based cross-linking agent.

According to the composition for conductive materials described above, it is possible to produce a polymer in which the substituents X and the epoxy(meth)acrylate-based cross-linking agent are evenly distributed, thereby enabling a conductive layer having a uniform membrane property to be formed.

In the composition described above, it is preferred that the epoxy(meth)acrylate-based cross-linking agent contains at least two (meth)acryloyl groups.

This makes it possible to link the substituent X and the substituent X together via the epoxy(meth)acrylate-based cross-linking agent more reliably.

Further, in the composition described above, it is preferred that the epoxy(meth)acrylate-based cross-linking agent contains a compound represented by the following general formula (B4) as a main ingredient thereof:

Further, in the composition described above, it is also preferred that the substituent $X^1$, the substituent $X^2$, the substituent $X^3$ and the substituent $X^4$ are identical with each other.

This also makes it possible to make variation in intervals between the adjacent main skeletons small in a resultant polymer, thereby enabling to further improve a carrier transport ability of the polymer.

Furthermore, in the composition described above, it is also preferred that each of the substituent $X^1$, the substituent $X^2$, the substituent $X^3$ and the substituent $X^4$ is bonded to the 3-, 4- or 5-position of the benzene ring.

This makes it possible for the adjacent main skeletons to exist at a suitable interval more reliably in a resultant polymer.

Further, in the composition descried above, it is also preferred that the heterocycle contains at least one heteroatom selected from the group comprising nitrogen, oxygen, sulfur, selenium and tellurium.

By selecting such a heterocyclic ring which contains such a kind of heteroatom, the energy level of the valence and conduction bands or the size of the band gap of the polymer easily changes, so that it is possible to change the characteristics of the carrier transport ability of the polymer.

Further, in the composition descried above, the heterocycle may be either of an aromatic heterocycle or a nonaromatic heterocycle, but the aromatic heterocycle is more preferable.

By using such an aromatic heterocycle, it is possible to properly prevent the electron density of the main skeleton with a conjugated chemical structure from being biased, that is, it is possible to properly prevent the localization of π electrons. As a result, the carrier transport ability of the polymer is prevented from being impaired.

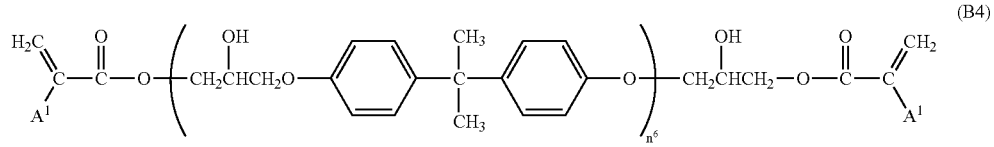

wherein $n^6$ is an integer of 1 to 10, and two $A^1$s may be the same or different and each independently represents a hydrogen atom or a methyl group.

By using such a compound described above, it is possible to produce a polymer having an especially high carrier transport material.

Further, in the composition described above, it is also preferred that the substituent $X^1$ and the substituent $X^3$ are identical with each other.

This makes it possible for adjacent main skeletons which are portions of the compounds represented by the above-mentioned general formula (A1) other than the substituents $X^1$, $X^2$, $X^3$ and $X^4$ thereof to make variation in their intervals small in a resultant polymer, thereby enabling to improve a carrier transport ability of the polymer.

Further, in the composition described above, it is also preferred that the substituent $X^2$ and the substituent $X^4$ are identical with each other.

This also makes it possible to make variation in intervals between the adjacent main skeletons small in a resultant polymer, thereby enabling to further improve a carrier transport ability of the polymer.

Further, in the composition descried above, it is preferred that the group Y contains 1 to 5 heterocycles.

By allowing the group Y to have such a number of heterocyclic rings, it is possible to sufficiently change the energy level of the valence and conduction bands or the size of the band gap of the polymer.

Further, in the composition descried above, it is preferred that the group Y contains at least one substituted or unsubstituted aromatic hydrocarbon ring in addition to the heterocycle.

By selecting such a group containing a heterocycle and an aromatic hydrocarbon ring as the group Y, it is possible to impart a desired carrier transport property to the polymer more reliably.

Further, in the composition descried above, it is preferred that the group Y contains two aromatic hydrocarbon rings respectively bonded to each N in the general formula (A1) directly and at least one heterocycle existing between these aromatic hydrocarbon rings.

This makes it possible to prevent the electron density in the polymer from being biased, and thereby enabling each polymer to have an even carrier transport ability.

Furthermore, in the composition described above, it is preferred that the group Y contains 2 to 75 carbon atoms in total.

According to this composition, the solubility of the compound represented by the general formula (A1) in a solvent tends to be increased, so that there is a possibility that the range of the choices of solvents to be used in preparing the composition for conductive materials becomes wide.

In the composition for conductive materials according to the present invention, it is also preferred that the acrylic cross-linking agent mainly contains an urethane(meth)acrylate-based cross-linking agent.

According to the composition for conductive materials described above, it is possible to produce a polymer in which the substituents X and the urethane(meth)acrylate-based cross-linking agent are evenly distributed, thereby enabling a conductive layer having a uniform membrane property to be formed.

In the composition described above, it is preferred that the urethane(meth)acrylate-based cross-linking agent mainly contains at least one of an aromatic urethane(meth)acrylate-based cross-linking agent, an alicyclic urethane(meth)acrylate-based cross-linking agent, and an aliphatic urethane(meth)acrylate-based cross-linking agent.

This makes it possible to obtain a polymer having excellent flexibility, stiffness and chemical resistance.

In the composition described above, it is preferred that the urethane(meth)acrylate-based cross-linking agent contains at least two (meth)acryloyl groups.

This makes it possible to link the substituent X and the substituent X together via the urethane(meth)acrylate-based cross-linking agent more reliably in a resultant polymer. In addition, it is also possible for adjacent main skeletons to exist at a suitable interval in the resultant polymer.

Further, in the composition described above, it is preferred that the urethane(meth)acrylate-based cross-linking agent contains a compound represented by the following general formula (B9) as a main ingredient thereof:

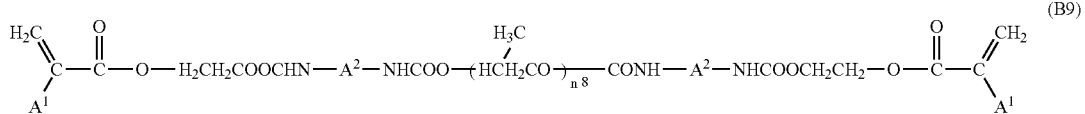

(B9)

wherein $n^8$ is an integer of 1 to 100, two $A^1$s may be the same or different and each independently represents a hydrogen atom or a methyl group, and two $A^2$s may be the same or different and each independently represents a group obtained by removing two isocyanate groups from a diisocyanate compound.

This makes it possible for the adjacent main skeletons to exist at an appropriate interval in the resultant polymer. As a result, the resultant polymer can has an especially high carrier transport ability.

In the composition described above, it is preferred that the urethane(meth)acrylate-based cross-linking agent contains a compound represented by the following general formula (B10) as a main ingredient thereof:

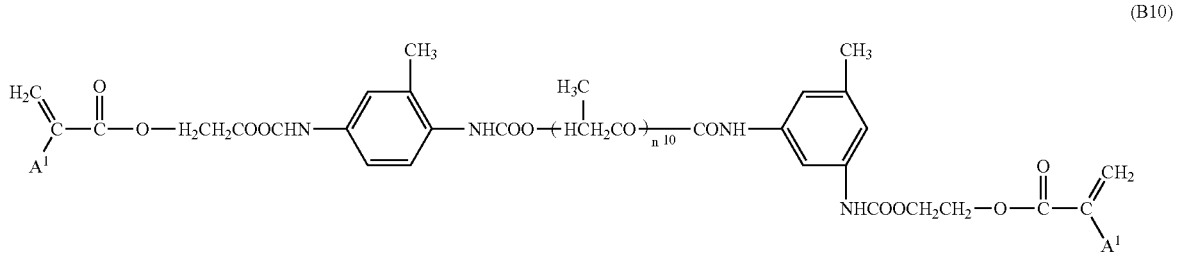

(B10)

wherein $n^{10}$ is an integer of 1 to 90, and two $A^1$s may be the same or different and each independently represent a hydrogen atom or a methyl group.

According to the composition described above, it is possible to obtain a polymer which is hard to deteriorate or degrade even in the case where it is placed in a relatively high temperature atmosphere.

Further, in the composition described above, it is also preferred that the substituent $X^1$ and the substituent $X^3$ are identical with each other.

This makes it possible for adjacent main skeletons which are portions of the compounds represented by the above-mentioned general formula (A1) other than the substituents $X^1$, $X^2$, $X^3$ and $X^4$ thereof to make variation in their intervals small in a resultant polymer, thereby enabling to improve a carrier transport ability of the polymer.

Further, in the composition described above, it is also preferred that the substituent $X^2$ and the substituent $X^4$ are identical with each other.

This also makes it possible to make variation in intervals between the adjacent main skeletons small in a resultant polymer, thereby enabling to further improve a carrier transport ability of the polymer.

Further, in the composition described above, it is also preferred that the substituent $X^1$, the substituent $X^2$, the substituent $X^3$ and the substituent $X^4$ are identical with each other.

This also makes it possible to make variation in intervals between the adjacent main skeletons small in a resultant polymer, thereby enabling to further improve a carrier transport ability of the polymer.

Furthermore, in the composition described above, it is also preferred that each of the substituent $X^1$, the substituent $X^2$, the substituent $X^3$ and the substituent $X^4$ is bonded to the 3-, 4- or 5-position of the benzene ring.

This makes it possible for the adjacent main skeletons to exist at a suitable interval more reliably in a resultant polymer.

Further, in the composition descried above, it is also preferred that the heterocycle contains at least one heteroatom selected from the group comprising nitrogen, oxygen, sulfur, selenium and tellurium.

By selecting such a heterocyclic ring which contains such a kind of heteroatom, the energy level of the valence and conduction bands or the size of the band gap of the polymer easily changes, so that it is possible to change the characteristics of the carrier transport ability of the polymer.

Further, in the composition descried above, the heterocycle may be either of an aromatic heterocycle or a nonaromatic heterocycle, but the aromatic heterocycle is more preferable.

By using such an aromatic heterocycle, it is possible to properly prevent the electron density of the main skeleton with a conjugated chemical structure from being biased, that is, it is possible to properly prevent the localization of π electrons. As a result, the carrier transport ability of the polymer is prevented from being impaired.

Further, in the composition descried above, it is preferred that the group Y contains 1 to 5 heterocycles.

By allowing the group Y to have such a number of heterocyclic rings, it is possible to sufficiently change the energy level of the valence and conduction bands or the size of the band gap of the polymer.

Further, in the composition descried above, it is preferred that the group Y contains at least one substituted or unsubstituted aromatic hydrocarbon ring in addition to the heterocycle.

By selecting such a group containing a heterocycle and an aromatic hydrocarbon ring as the group Y, it is possible to impart a desired carrier transport property to the polymer more reliably.

Further, in the composition descried above, it is preferred that the group Y contains two aromatic hydrocarbon rings respectively bonded to each N in the general formula (A1) directly and at least one heterocycle existing between these aromatic hydrocarbon rings.

This makes it possible to prevent the electron density in the polymer from being biased, and thereby enabling each polymer to have an even the carrier transport ability.

Furthermore, in the composition described above, it is preferred that the group Y contains 2 to 75 carbon atoms in total.

According to this composition, the solubility of the compound represented by the general formula (A1) in a solvent tends to be increased, so that there is a possibility that the range of the choices of solvents to be used in preparing the composition for conductive materials becomes wide.

Another aspect of the present invention is directed to a conductive material obtained by direct polymerization or polymerization via an acrylic cross-linking agent of substituents $X^1$, substituents $X^2$, substituents $X^3$ and substituents $X^4$ of compounds each represented by the following general formula (A1), each compound being contained in the composition for conductive materials according to the present invention defined in claim 1:

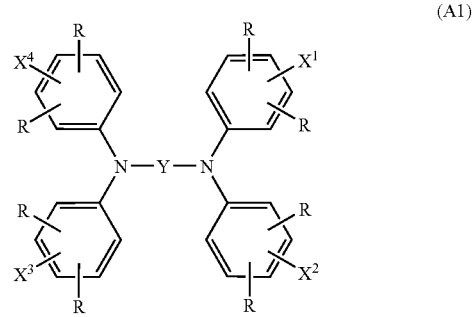

(A1)

wherein eight Rs may be the same or different and each independently represents a hydrogen atom, a methyl group, or an ethyl group, Y represents a group containing at least one substituted or unsubstituted aromatic hydrocarbon ring or substituted or unsubstituted heterocycle, and $X^1$, $X^2$, $X^3$ and $X^4$ may be the same or different and each independently represents a substituent represented by the following general formula (A2):

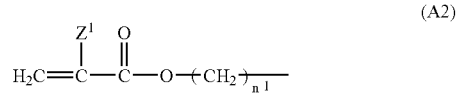

(A2)

wherein $n^1$ is an integer of 2 to 8, and $Z^1$ represents a hydrogen atom or a methyl group.

According to the conductive material described above, it is possible to produce a conductive layer (polymer) having a high carrier transport ability.

In the conductive material described above, it is preferred that the compounds are polymerized by light irradiation.

By employing light irradiation, it is possible to relatively easily select the area where polymerization reaction of the compounds each represented by the above-mentioned general formula (A1) occurs as well as the degree of the polymerization in a resultant conductive layer.

In the conductive material described above, it is preferred that both the compound and the acrylic cross-linking agent are polymerized by light irradiation.

In this case, it is also possible to relatively easily select the area where polymerization reaction of the compounds each represented by the above-mentioned general formula (A1) and the acrylic cross-linking agent occurs as well as the degree of the polymerization in a resultant conductive layer.

Other aspect of the present invention is directed to a conductive layer mainly comprising the conductive material as described above. This conductive layer can have a high hole transport ability.

In this case, it is preferred that the conductive layer is used for a hole transport layer. This hole transport layer can also have a high hole transport ability.

In this case, it is preferred that the average thickness of the hole transport layer is in the range of 10 to 150 nm.

When such a hole transport layer is used in an organic EL device, it is possible to increase the reliability of the organic EL device.

Further, the conductive layer of the present invention described above may be used for an electron transport layer. Such an electron transport layer can also have a high electron transport ability.

In this case, it is preferred that the average thickness of the electron transport layer is in the range of 10 to 150 nm.

When such an electron transport layer is used in an organic EL device, it is possible to increase the reliability of the organic EL device.

Furthermore, the conductive layer of the present invention described above may be used for an organic semiconductor layer. Such an organic semiconductor layer can exhibit excellent semiconductor characteristics.

In this case, it is preferred that the average thickness of the organic semiconductor layer is in the range of 0.1 to 1,000 nm.

When such an organic semiconductor layer is used in an organic thin film transistor, it is possible to increase the reliability of the organic thin film transistor.

The other aspect of the present invention is directed to an electronic device comprising a laminated body which includes the conductive layer as described above. Such an electronic device can have high reliability.

Examples of the electronic device may include a light emitting device and a photoelectric transducer. These light emitting device and photoelectric transducer can also have high reliability.

In this case, it is preferred that the light emitting device includes an organic EL device. Such an organic EL device can also have high reliability.

In the present invention, examples of the electronic device may also include a switching element. Such a switching element can also have high reliability.

In this case, it is preferred that the switching element includes an organic thin film transistor. Such an organic thin film transistor can also have high reliability.

Yet other aspect of the present invention is directed to electronic equipment comprising the electronic device described above. Such electronic equipment can also have high reliability.

BEST MODE FOR CARRYING OUT THE INVENTION

Figure 1:
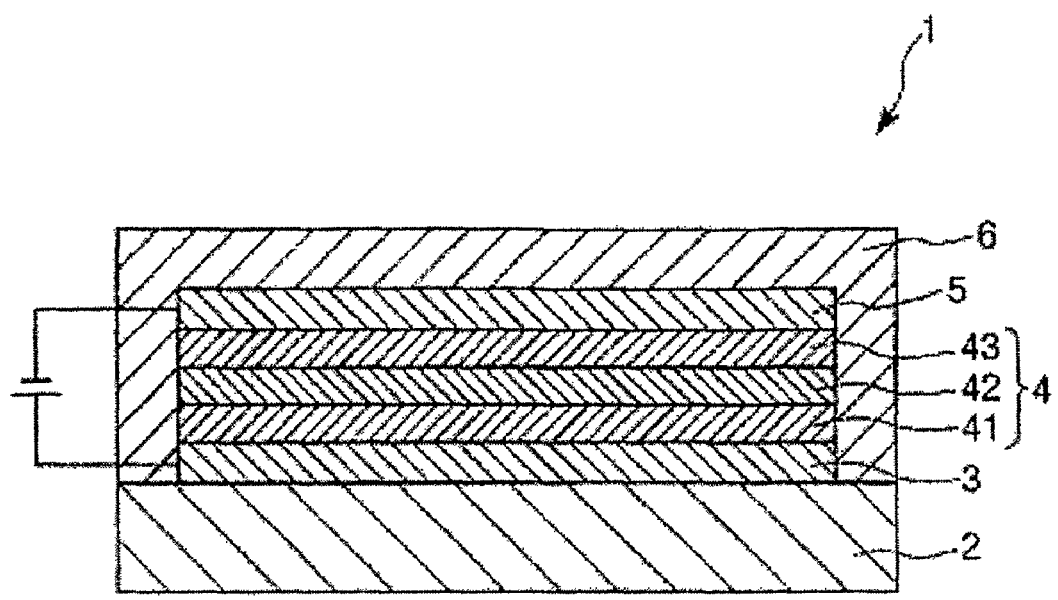
FIG. 1 is a cross-sectional view which shows an example of an organic EL device.

Hereinbelow, a composition for conductive materials, a conductive material, a conductive layer, an electronic device, and electronic equipment according to the present invention will be described in detail with reference to preferred embodiments shown in the accompanying drawings.

(Conductive Layer)

First, a conductive layer obtained by using a conductive material according to the present invention as its main material (that is, a conductive layer according to the present invention) will be described.

A conductive material according to the present invention contains as its main ingredient a polymer obtained by direct polymerization reaction at substituents $X^1$, $X^2$, $X^3$ and $X^4$ of compounds (which are an arylamine derivative) each represented by the following general formula (A1) (hereinafter, each of these substituents $X^1$, $X^2$, $X^3$ and $X^4$ will be referred to as "substituent X" and all of these substituents will be collectively referred to as "the substituents X" depending on the occasions).

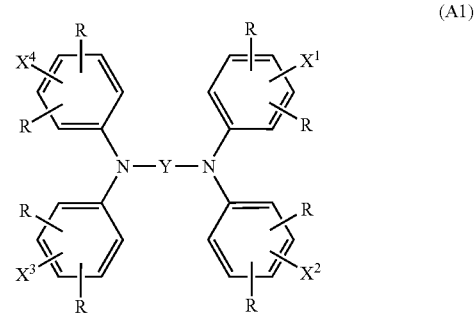

(A1)

wherein eight Rs may be the same or different and each independently represents a hydrogen atom, a methyl group, or an ethyl group, Y represents a group containing at least one substituted or unsubstituted aromatic hydrocarbon ring or substituted or unsubstituted heterocycle, and $X^1$, $X^2$, $X^3$ and $X^4$ may be the same or different and each independently represents a substituent represented by the following general formula (A2):

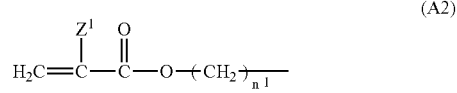

(A2)

wherein $n^1$ is an integer of 2 to 8, and $Z^1$ represents a hydrogen atom or a methyl group.

In such a polymer, adjacent main skeletons which are portions of the compounds other than the substituents X (that is, arylamine skeletons) are linked via a chemical structure formed by the direct reaction between the respective substituents X (hereinafter, this chemical structure will be referred to as "first link structure"), and thus a two-dimensional network of the main skeletons becomes easily to be formed.

Here, it is to be noted that each main skeleton has a conjugated chemical structure, and because of its unique spread of the electron cloud, the main skeletons contribute to smooth transport of carriers (holes or electrons) in the polymer.

In particular, in the polymer of the present invention, the main skeletons are linked via the first link structure so that the adjacent main skeletons exist at a predetermined interval therebetween. Therefore, the interaction between the adjacent main skeletons decreases, so that transfer of the carriers between the main skeletons can be carried out smoothly.

Further, in the polymer of the present invention, the main skeletons are linked to form the two-dimensional network as described above. Therefore, even in the case where the network has a portion in which the link structure between the main skeletons is cut off, carriers are smoothly transported through other routes.

Furthermore, in the polymer of the present invention, the network having two-dimensional expansion is likely to be formed as described above, and such a network makes it possible to prevent or suppress polymers from being interwoven to each other effectively. In other words, if polymers are interwoven complicatedly, interval between the adjacent main skeletons is shortened and thereby the interaction between the adjacent main skeletons becomes too large to decrease the carrier transport ability. For these reasons, in a conductive layer formed of the polymer of the present invention, carriers can be transported smoothly.

As described above, the polymer of the present invention which is the main ingredient of the composition for conductive materials of the present invention has the structure in which the main skeletons are linked via the first link structure so that the adjacent main skeletons exist at a predetermined interval therebetween as well as the characteristic by which the two-dimensional network of the main skeletons are likely to be formed. Because of the synergistic effect of these factors, the conductive material of the present invention can exhibit an especially high carrier transport ability. As a result, a conductive layer which is formed using the conductive material of the present invention as its major component can also have an especially high carrier transport ability.

In this regard, it is to be noted that if the interval between the adjacent main skeletons in the polymer is too small, interaction between the adjacent main skeletons tends to be strong. On the other hand, if the interval between the adjacent main skeletons in the polymer is too large, it becomes difficult to transfer carriers between the main skeletons, causing the carrier transport ability of the polymer to be impaired.

The structure of each substituent X should be determined in view of these facts. Specifically, it is preferred that each substituent X represented by the general formula (A2) has a straight-chain carbon-carbon link (i.e., an alkylene group) in which $n^1$ is 2 to 8, in particular 3 to 6. This makes it possible for the adjacent main skeletons to exist at a suitable interval, thereby reliably decreasing the interaction between the adjacent main skeletons in a resultant polymer. In addition, it is also possible to transfer carriers between the main skeletons more reliably, so that the resultant polymer can have a high carrier transport ability.

In the composition for conductive materials of the present invention, it is preferred that the substituent $X^1$ and the substituent $X^3$ are identical with each other. Namely, it is preferred that the substituent $X^1$ and the substituent $X^3$ have substantially the same number of carbon atoms and more preferably the same number of carbon atoms. This makes it possible for the adjacent main skeletons of the compounds which are to be linked by the polymerization reaction between the respective substituents X (that is, the substituent $X^1$ or the substituent $X^3$) to make variation in their intervals small. Namely, it is possible to make variation in the intervals between the main skeletons small in a resultant polymer. As a result, it is possible to prevent the electron density from being biased in the resultant polymer effectively, thereby enabling to improve a hole transport ability of the polymer.

In view of the above, it is also preferred that the substituent $X^2$ and the substituent $X^4$ are identical with each other. Namely, it is also preferred that the substituent $X^2$ and the substituent $X^4$ have substantially the same number of carbon atoms and more preferably the same number of carbon atoms. This makes it possible to improve the above-described effect further, thereby enabling to further improve the carrier transport ability of the polymer.

Further, it is also preferred that the substituent $X^1$, the substituent $X^2$, the substituent $X^3$ and the substituent $X^4$ are identical with each other. Namely, it is also preferred that the substituent $X^1$, the substituent $X^2$, the substituent $X^3$ and the substituent $X^4$ have substantially the same number of carbon atoms and more preferably the same number of carbon atoms. This makes it possible to exhibit the above-described effect conspicuously. Further, in this case, since the length of each of the substituents X which protrudes from the main skeleton is substantially the same (or exactly the same) with each other, it is possible to decrease a possibility of steric hindrance caused by the substituent X. This makes it possible that polymerization reaction is carried out reliably between the substituents X, that is the polymer is produced reliably. With this result, it is possible to further improve the carrier transport ability of the polymer.

As shown in the general formula (A2), each of the substituents X has a (meth)acryloyl group as a terminal group. Since the (meth)acryloly group has high reactivity and bonding stability, it is relatively easy to polymerize the substituents X directly to form a polymer having a long chain length.

In the first link structure obtained by polymerizing the substituents X by the use of (meth)acryloly groups, a double bond ($\pi$ bonds) exists between an oxygen atom and a carbon atom, so that the first link structure contains two double bonds. Therefore, even in the case where the interval between the main skeletons is relatively large, it is possible to transfer carriers between the main skeletons reliably through the two $\pi$ bonds.

Further, since a straight-chain carbon to carbon link (i.e., an alkylene group) exists between each of the two $\pi$ bonds and each main skeleton, it is possible to prevent the interaction between the main skeletons from being enhanced.

In this connection, it is to be noted that if the first link structure has a structure having many conjugated $\pi$ bonds such as a benzene ring, interaction occurs between the adjacent main skeletons through such a structure, which cancels the effect obtained by allowing the adjacent main skeletons to exist at a suitable interval.

Furthermore, it is also to be noted that the substituent X may be bonded to the 2-, 3-, 4-, 5- or 6-position of the benzene ring, but preferably bonded to the 3-, 4- or 5-position. This makes it possible to conspicuously exhibit the effect obtained by linking the adjacent main skeletons via the first link structure. Namely, it is possible for the adjacent main skeletons to exist at a suitable interval more reliably.

Hereinbelow, an explanation will be made with regard to the main skeleton(s) which contributes to a carrier transport ability in the resultant polymer.

In the main skeleton, that is, in the compound represented by the above-mentioned general formula (A1) (hereinafter, simply referred to as "compound (A1)"), it is possible to change the carrier transport properties of the polymer by appropriately setting the chemical structure of a group (or a linking group) Y. This is considered to result from the following. Namely, in the polymer, the energy level of the valence and conduction bands or the size of the band gap is changed according to changes in the spread of the electron cloud (i.e., distribution of electrons) in the main skeleton which contributes to carrier transportation.

In the compound (A1), the group Y contains at least one substituted or unsubstituted aromatic hydrocarbon ring or at least one substituted or unsubstituted heterocyclic ring. By selecting kinds of the aromatic hydrocarbon ring and/or heterocyclic ring appropriately, it is possible to adjust carrier transport properties in the resultant polymer relatively easily.

For example, by selecting a structure constituted from unsubstituted aromatic hydrocarbon ring as the group Y, it is possible to obtain a polymer which can exhibit a hole transport ability.

In more details, as for the structure constituted from the unsubstituted aromatic hydrocarbon ring, those represented by the following chemical formulas (C1) to (C16) can be mentioned.

(C1) to (C16)

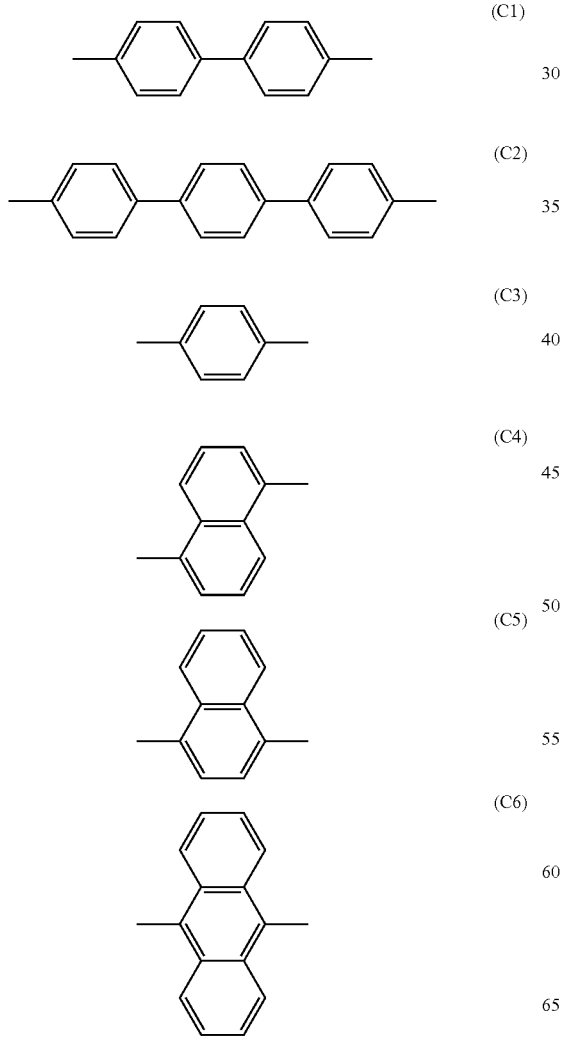
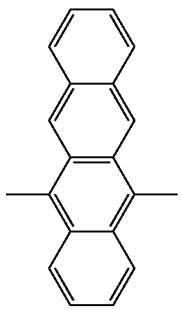
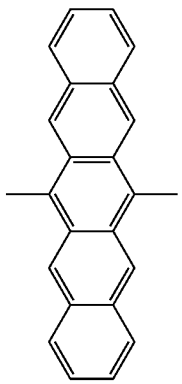
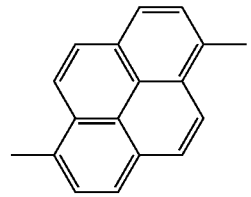
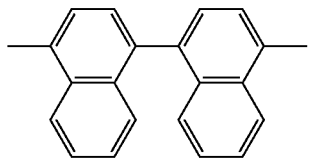
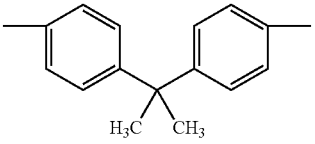
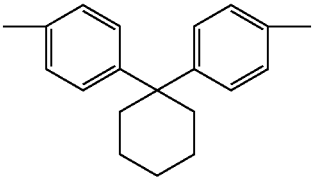
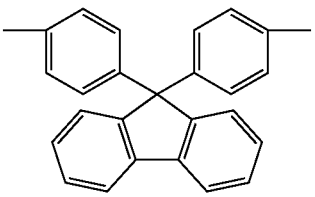

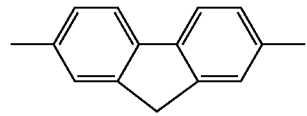
(C14)

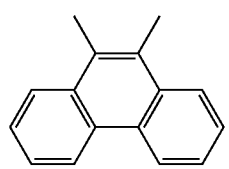
(C15)

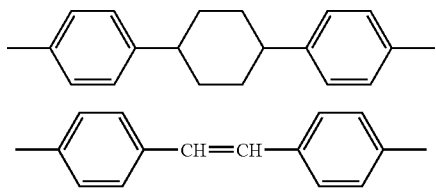
(C16)

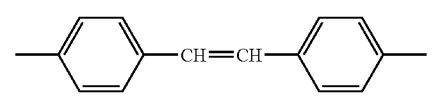
(C17)

In this case, it is preferred that the group Y has 6 to 30 carbon atoms, more preferably 10 to 25 carbon atoms, and even more preferably 10 to 20, in total.

Further, in the group Y, it is preferred that the number of aromatic hydrocarbon ring is 1 to 5, more preferably 2 to 5, and even more preferably 2 to 3.

Taking the above-mentioned factors into account, in the compound (A1) a biphenylene group represented by the chemical formula (C1) or its derivative is considered to be an especially preferable structure as the group Y.

By selecting such a group, the hole transport ability in the resultant polymer becomes excellent, and thus a conductive layer to be formed from the polymer can also have a higher hole transport ability.

Next, by selecting a structure which contains at least one substituted or unsubstituted heterocyclic ring as the group Y, it is possible to control the carrier transport property of the resultant polymer relatively easily.

As for such a heterocyclic ring, it is preferred to select a heterocyclic ring which contains at least one heteroatom selected from among nitrogen, oxygen, sulfur, selenium, and tellurium. By selecting such a heterocyclic ring that contains such a kind of heteroatom, it is particularly easy to change the energy level of the valence and conduction bands or the size of the band gap of the polymer.

The heterocyclic ring may be either an aromatic heterocycle or a nonaromatic heterocycle, but an aromatic heterocycle is preferably used. By using an aromatic heterocycle, it is possible to properly prevent the electron density of the main skeleton with a conjugated chemical structure from being biased, that is, it is possible to properly prevent the localization of π electrons. As a result, the carrier transport ability of the polymer is prevented from being impaired.

The group Y preferably contains 1 to 5 heterocyclic rings, more preferably 1 to 3 heterocyclic rings. In the case where the group Y contains 2 or more heterocyclic rings, these rings may be the same or different. By allowing the group Y to have such a number of heterocyclic rings, it is possible to sufficiently change the energy level of the valence and conduction bands or the size of the band gap of the polymer.

In the case where the group Y contains at least one substituted or unsubstituted heterocyclic ring, the group Y may further contain at least one aromatic hydrocarbon ring in addition to the at least one heterocyclic ring. By selecting a group containing a heterocycle and an aromatic hydrocarbon ring as the group Y, it is possible to impart a desired carrier transport property to the polymer more reliably.

Particularly, the group Y preferably contains two aromatic hydrocarbon rings each bonded to each N in the general formula (1) directly and at least one heterocyclic ring which exists between these aromatic hydrocarbon rings. By using such a group Y, it is possible to reliably prevent the electron density in the polymer from being biased. As a result, the polymer can have an even (uniform) carrier transport ability.

The group Y preferably has 2 to 75 carbon atoms, more preferably 2 to 50 carbon atoms, in total. If the group Y has too many carbon atoms in total, the solubility of the compound represented by the general formula (A1) in a solvent tends to be lowered depending on the kind of substituent X used, creating a possibility that the range of the choices of solvents to be used in preparing the composition for conductive materials according to the present invention becomes narrow.

On the other hand, by setting a total number of carbon atoms contained in the group Y to a value within the above range, it is possible to maintain the planarity of the main skeleton. As a result, the carrier transport ability of the polymer is reliably prevented from being impaired.

Taking these factors into account, as a structure constituted from unsubstituted heterocyclic rings, such structures as represented by any one of the following chemical formulas (D1) to (D20) are considered to be preferable structures.

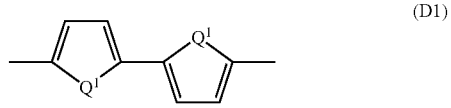
(D1)

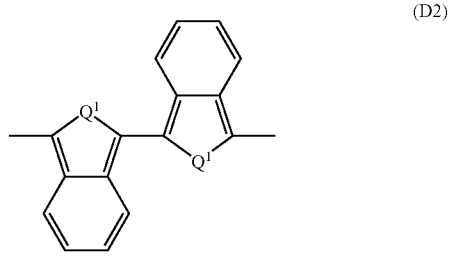
(D2)

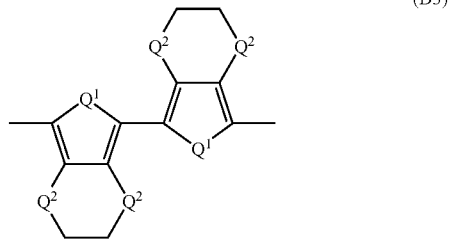
(D3)

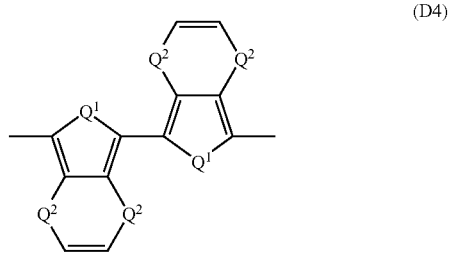
(D4)

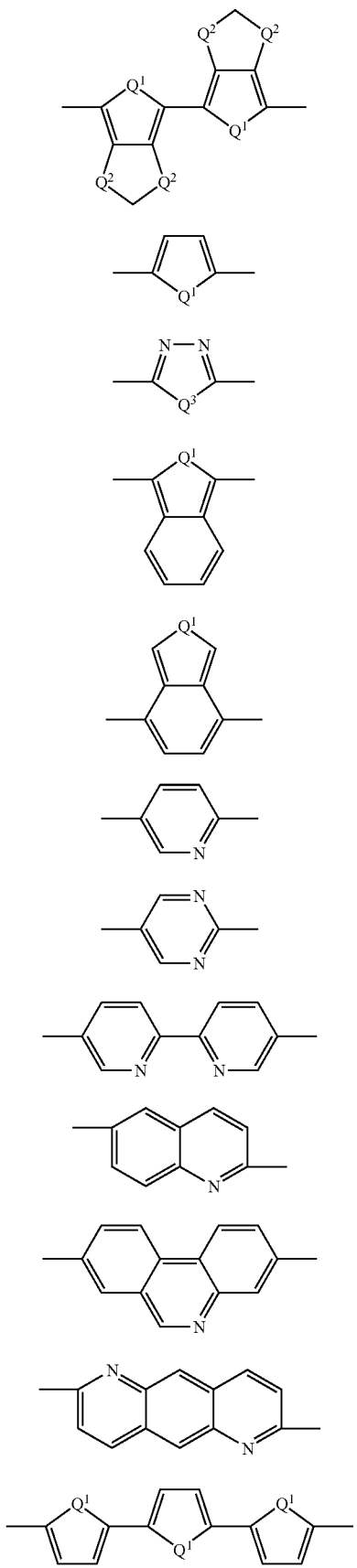

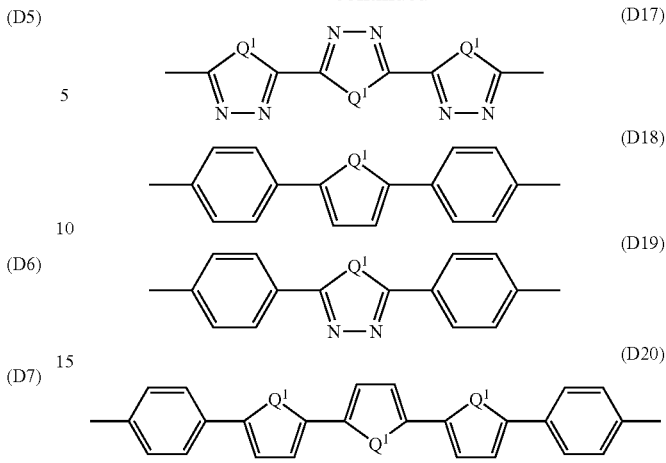

wherein in these chemical formulas each $Q^1$ may be the same or different and each independently represent $N-T^3$, S, O, Se, or Te (where $T^1$ represents H, $CH_3$, or Ph), each $Q^2$ may be the same or different and each independently represent S or O, and each $Q^3$ may be the same or different and each independently represent $N-T^3$, S, O, Se, or Te (where $T^3$ represents H, $CH_3$, $C_2H_5$ or Ph).

By appropriately determining the chemical structure of the group Y as described above, a polymer obtained by selecting, for example, any one of the chemical formulas (D2), (D16), (D18) and (D20) as the group Y can exhibit a high hole transport ability as compared with a polymer obtained by selecting the chemical formula (D17) and can exhibit an especially high hole transport ability as compared with a polymer obtained by selecting the chemical formula (D8) or (D19).

On the contrary, a polymer obtained by selecting any one of the chemical formulas (D8), (D17) and (D19) as the group Y can exhibit a high electron transport ability as compared with a polymer obtained by the chemical formula (D2) or (D16). Further, the polymer obtained by selecting any one of the chemical formulas (D8), (D17) and (D19) as the group Y can also exhibit an especially high electron transport ability as compared with a polymer obtained by selecting the chemical formula (D18) or (D20).

Further, the unsubstituted heterocyclic ring and/or the unsubstituted aromatic hydrocarbon ring contained in the group Y may introduce a substituent so long as the planarity of the main skeleton is not greatly affected. Examples of such a substituent include an alkyl group having a relatively small number of carbon atoms such as a methyl group or an ethyl group or and a halogen group and the like.

Furthermore, in the main skeleton, each of the substituents R is a hydrogen atom, a methyl group, or an ethyl group, and each substituent R is selected in accordance with the number of carbon atoms of the substituent X. For example, in the case where the number of carbon atoms is large, a hydrogen atom is selected as the substituent R, and in the case where the number of carbon atoms is small, a methyl group or an ethyl group is selected as the substituent R.

Now, in the present invention, it is preferred that the polymer contains a second link structure produced by polymerization reaction(s) of a substituent X and a substituent X with an acrylic cross-linking agent in addition to the first link structure produced by the direct polymerization reaction of the substituents X (which are any one of the substituents $X^1$, $X^2$, $X^3$ and $X^4$) as described above. According to such a polymer, since an interval between the main skeletons is maintained at a suitable interval, interaction between the main skeletons can be further decreased. As a result, the polymer containing the second link structure can exhibit an especially high hole transport ability.

In such a polymer, it is preferred that the substituent X represented by the general formula (A2) has a straight-chain carbon-carbon link (i.e., an alkylene group) in which $n^1$ is 2 to 8, in particular 2 to 6. This makes it possible for adjacent main skeletons to exist at a suitable interval, thereby reliably decreasing the interaction between the adjacent main skeletons in a resultant polymer in spite of the case where the first link structure and/or the second link structure is produced. In addition, it is also possible to transfer carriers between the main skeletons more reliably, so that the resultant polymer can have a high carrier transport ability.

Preferably, the substituent $X^1$ and the substituent $X^3$ contain substantially the same number of carbon atoms, more preferably the same number of carbon atoms. By selecting such substituents X, it is possible to adequately prevent the electrical affects to the main skeleton which would be given by the substituents X (the substituent $X^1$ and/or the substituent $X^3$) from varying, and as a result thereof the electron density in the polymer from being biased. This makes it possible to improve the carrier transport ability of the polymer.

In view of the above, it is also preferred that the substituent $X^2$ and the substituent $X^4$ have substantially the same number of carbon atoms and more preferably the same number of carbon atoms. This makes it possible to improve the above-described effect further, thereby enabling to further improve the carrier transport ability of the polymer.

Further, it is also preferred that the substituent $X^1$, the substituent $X^2$, the substituent $X^3$ and the substituent $X^4$ have substantially the same number of carbon atoms and more preferably the same number of carbon atoms. This makes it possible to exhibit the above-described effect conspicuously. Further, in this case, since the interval between the main skeletons in the polymer can be made larger than a certain distance in spite of the case where the first link structure is formed and/or the second link structure is formed, occurrence of the interaction between the main skeletons can be further prevented. With this result, it is possible to further improve the carrier transport ability of the polymer.

Examples of an acrylic cross-linking agent include, but are not limited thereto, (meth)acrylic ester-based cross-linking agents such as (meth)acrylic cross-linking agents, polyester (meth)acrylate-based cross-linking agents, epoxy(meth)acrylate-based cross-linking agents, urethane(meth)acrylate-based cross-linking agents, amine(meth)acrylate-based cross-linking agents, and melamine(meth)acrylate-based cross-linking agents. These acrylic cross-linking agents may be used singly or in combination of two or more of them. Among them, acrylic cross-linking agents mainly containing a polyester(meth)acrylate-based cross-linking agent, an epoxy(meth)acrylate-based cross-linking agent and an urethane(meth)acrylate-based cross-linking agent are preferably used.

Hereinbelow, a description will be made with regard to these cross-linking agents.

By using an acrylic cross-linking agent mainly containing a polyester(meth)acrylate-based cross-linking agent, it is possible to achieve cost reduction because a polyester(meth)acrylate-based cross-linking agent can be relatively easily synthesized in a small number of steps. Further, since such an acrylic cross-linking agent has a high degree of solubility, it extends the range of the choices of solvents to be used in dissolving a composition for conductive materials according to the present invention.

A (meth)acryloyl group contained in the cross-linking agent has a stable photopolymerizarion reactivity, and therefore the (meth)acryloyl group efficiently reacts with substituents X. This properly prevents unreacted substituents X from remaining. Therefore, it is possible to produce a polymer in which the substituents X and the polyester (meth)acrylate-based cross-linking agent are evenly distributed, thereby enabling a conductive layer having a uniform membrane property to be formed.

Further, since a polyester(meth)acrylate-based cross-linking agent has high transparency, a polymer obtained by using such a polyester(meth)acrylate-based cross-linking agent also has high transparency. Therefore, a conductive material (that is, a polymer) according to the present invention can be suitably used for producing a hole transport layer and the like to be contained in electronic devices that require transparency, such as organic EL devices.

The polyester(meth)acrylate-based cross-linking agent to be used is not particularly limited so long as a substituent X and a substituent X can be linked together via the polyester (meth)acrylate-based cross-linking agent. However, it is preferred that the polyester(meth)acrylate-based cross-linking agent contains at least two (meth)acryloyl groups. This makes it possible to link the substituent X and the substituent X together via the polyester(meth)acrylate-based cross-linking agent more reliably. In addition, it is also possible for adjacent main skeletons to exist at a suitable interval in a resultant polymer.

Examples of such a polyester(meth)acrylate-based cross-linking agent having at least two (meth)acryloyl groups include compounds represented by the following general formulas (B1) to (B3). These cross-linking agents may be used singly or in combination of two or more of them. Particularly, a polyester(meth)acrylate-based cross-linking agent containing a compound represented by the general formula (B1) as its main ingredient is preferably used.

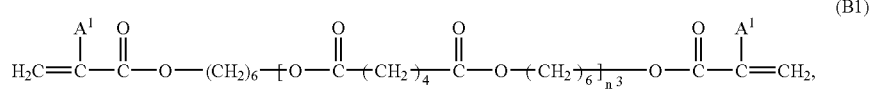

wherein $n^3$ is an integer of 4,500 or less, n4 is an integer of 1 to 3, and n5 is an integer of 0 to 1500, and two $R^3$s may be the same or different and each independently represents an alkylene group having 1 to 10 carbon atoms, $R^4$ represents an alkylene group having 1 to 100 carbon atoms, and two or more $A^1$s may be the same or different and each independently represents a hydrogen atom or a methyl group.

A compound represented by the general formula (B1) has a (meth)acryloyl group as a terminal group at each end, and therefore the polymerization of the compound with each substituent X occurs at each end of the compound.

Between the (meth)acryloyl groups, a moiety comprised of polyester exists. By appropriately setting the length of the moiety comprised of polyester, that is, the length of the moiety comprised of a carbon-carbon link (i.e., an alkylene group), it is possible to control the (chain) length of the second link structure, thereby allowing the adjacent main skeletons to exist at a suitable interval. As a result, a resultant polymer has a high carrier transport ability.

Due to the reasons described above, a resultant polymer obtained can have an excellent carrier transport ability.

In the general formula (B1), it is particularly preferred that $n^3$ is an integer of 1,300 or less. By setting $n^3$ to a value within the above range, it is possible for adjacent main skeletons to exist at a particularly suitable interval. Therefore, in a resultant polymer, interaction between the adjacent main skeletons is more reliably decreased, and carriers are more reliably transferred between the main skeletons. As a result, the resultant polymer can have a more excellent carrier transport ability.

Hereinafter, a description will be made with regard to an epoxy(meth)acrylate-based cross-linking agent. In the case of an epoxy(meth)acrylate-based cross-linking agent, its raw material is easily available at a low price, and it is synthesized relatively easily. Therefore, by using an acrylic cross-linking agent mainly containing an epoxy(meth)acrylate-based cross-linking agent for linking substituents X, it is possible to achieve cost reduction in producing a composition for conductive materials of the present invention.

Further, since such an epoxy cross-linking agent has a high degree of solubility, there is an advantage in that it extends the range of the choices of solvents to be used in dissolving the composition for conductive materials according to the present invention.

A (meth)acryloyl group contained in this cross-linking agent has a stable photopolymerizarion reactivity, and therefore the (meth)acryloyl group efficiently reacts with a substituent X. This properly prevents unreacted substituents X and epoxy(meth)acrylate-based cross-linking agent from remaining. Therefore, it is possible to prevent formation of a polymer in which a portion where the substituents X are directly bonded to each other (that is, the first link structure) and a portion where the substituents X are bonded via the epoxy(meth)acrylate-based cross-linking agent (that is, the second link structure) are unevenly distributed, thereby enabling a conductive layer having a uniform membrane property to be formed.

Further, since the epoxy(meth)acrylate-based cross-linking agent has high transparency, a polymer obtained by using such an epoxy(meth)acrylate-based cross-linking agent also has high transparency. Therefore, the conductive material (that is, polymer) according to the present invention can be suitably used for producing a hole transport layer and the like to be contained in electronic devices that require transparency, such as organic EL devices.

The epoxy(meth)acrylate-based cross-linking agent to be used is not particularly limited so long as a substituent X and a substituent X can be linked together via the epoxy(meth) acrylate-based cross-linking agent. However, it is preferred that the epoxy(meth)acrylate-based cross-linking agent contains at least two (meth)acryloyl groups. This makes it possible to link the substituent X and the substituent X together via the epoxy(meth)acrylate-based cross-linking agent more reliably. In addition, it is also possible for the adjacent main skeletons to exist at a suitable interval in a resultant polymer.

Examples of such an epoxy(meth)acrylate-based cross-linking agent having at least two (meth)acryloyl groups include compounds represented by the following general formulas (B4) to (B8). These cross-linking agents may be used singly or in combination of two or more of them. Particularly, an epoxy(meth)acrylate-based cross-linking agent containing a compound represented by the general formula (B4) as its main ingredient is preferably used.

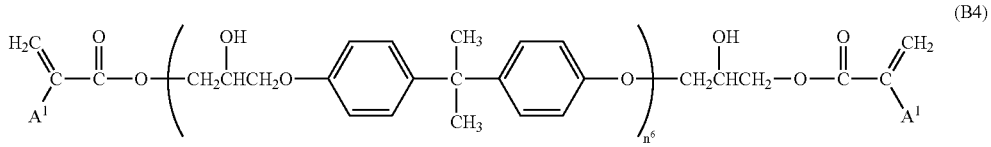

(B4)

wherein each $n^6$ may be the same or different and each independently represents an integer of 1 to 10, $n^7$ is an integer of 1 to 40, and two or more $A^1$s may be the same or different and each independently represent a hydrogen atom or a methyl group.

The compound represented by the general formula (B4) has a (meth)acryloyl group as a terminal group at each end, and therefore the polymerization of the compound with the substituents X occurs at each end of the compound.

Between the (meth)acryloyl groups, a moiety (unit) comprised of epoxy exists. By appropriately setting the length of the moiety comprised of epoxy, it is possible to control the (chain) length of a link structure, thereby allowing adjacent main skeletons to exist at a suitable interval.

Specifically, it is preferred that in the general formula (B4) $n^6$ is set to an integer of 1 to 10. By setting $n^6$ to the above range to control the length of the moiety comprised of epoxy, it is possible to allow adjacent main skeletons to exist at a suitable interval. With this result, the interaction between the adjacent main skeletons in the polymer can be reliably decreased, and thus transfer of holes between the adjacent main skeletons can be carried out reliably in the polymer.

In this regard, it is to be noted that although the epoxy unit has a chemical structure in which a benzene ring having a conjugated bonding exists, an unconjugated chemical structure such as a methylene group and a C—$CH_3$ bond and this unconjugated chemical structure becomes preferential. This makes it possible to properly prevent or suppress interaction between main skeletons via the benzene ring from occurring.

Due to the reasons described above, a resultant polymer obtained can have an excellent carrier transport ability.

Hereinafter, a description will be made with regard to an urethane(meth)acrylate-based cross-linking agent. Examples of such an urethane(meth)acrylate-based cross-linking agent include, but are not limited thereto, an aromatic urethane (meth)acrylate-based cross-linking agent, an alicyclic urethane(meth)acrylate-based cross-linking agent, and an aliphatic urethane(meth)acrylate-based cross-linking agent, and the like. These urethane(meth)acrylate-based cross-linking agents may be used singly or in combination of two or more of them.

A (meth)acryloyl group contained in this cross-linking agent has a stable photopolymerizarion reactivity, and therefore the (meth)acryloyl group efficiently reacts with a substituent X. This properly prevents unreacted substituents X and urethane(meth)acrylate-based cross-linking agent from remaining. Therefore, it is possible to prevent the formation of a polymer in which a portion where the substituents X are directly bonded to each other (that is, the first link structure) together via the urethane(meth)acrylate-based cross-linking agent more reliably. In addition, it is also possible for the adjacent main skeletons to exist at a suitable interval in a resultant polymer.

Examples of such an urethane(meth)acrylate-based cross-linking agent having at least two (meth)acryloyl groups include compounds represented by the following general formula (B9).

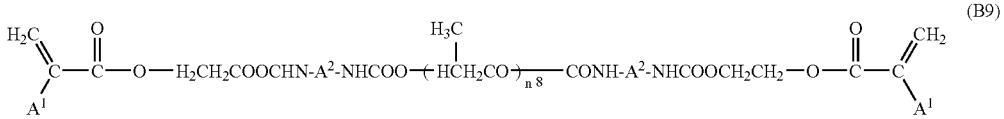

and a portion where the substituents X are bonded via the urethane (meth)acrylate-based cross-linking agent (that is, the second link structure) are unevenly distributed, thereby enabling a conductive layer having a uniform membrane property to be formed.

In this regard, it is preferred that an urethane(meth)acrylate-based cross-linking agent contains at least one of an aromatic urethane (meth)acrylate-based cross-linking agent, an alicyclic urethane (meth)acrylate-based cross-linking agent, and an aliphatic urethane (meth)acrylate-based cross-linking agent at its main constituent. In the case of such an urethane(meth)acrylate-based cross-linking agent, its raw material is easily available at a low price, and it is synthesized relatively easily. Therefore, by using such an urethane cross-linking agent mainly, there is an advantage in that it is possible to achieve cost reduction in producing a composition for conductive materials of the present invention.

Further, these urethane(meth)acrylate-based cross-linking agents have such properties as excellent flexibility, stiffness and chemical resistance. Therefore, a second link structure obtained by polymerizing the substituents X via the urethane (meth)acrylate-based cross-linking agent exhibits such properties derived from the urethane (meth)acrylate-based cross-linking agent. This means that it is possible to give such excellent flexibility, stiffness and chemical resistance to a conductive material (polymer) of the present invention as well as a conductive layer formed by using the polymer as its main material. As a result, it is possible to improve the performance of an electronic device provided with the conductive layer.

Furthermore, since such an urethane(meth)acrylate-based cross-linking agent has a high degree of solubility, it extends the range of the choices of solvents to be used in dissolving a composition for conductive materials according to the present invention.

Moreover, since an urethane(meth)acrylate-based cross-linking agent has high transparency, a polymer obtained by using such an urethane(meth)acrylate-based cross-linking agent also has high transparency. Therefore, the conductive material (that is, polymer) according to the present invention can be suitably used for producing a hole transport layer and the like to be contained in electronic devices that require transparency, such as organic EL devices.

The urethane(meth)acrylate-based cross-linking agent to be used is not particularly limited so long as a substituent X and a substituent X can be linked together via the urethane (meth)acrylate-based cross-linking agent. However, it is preferred that the urethane(meth)acrylate-based cross-linking agent contains at least two (meth)acryloyl groups. This makes it possible to link the substituent X and the substituent X wherein $n^8$ represents an integer of 1 to 100, two or more $A^1$s may be the same or different and each independently represents a hydrogen atom or a methyl group, two or more $A^2$s may be the same or different and each independently represents a group obtained by eliminating two isocyanate groups from a di-isocyanate compound.

A compound represented by the general formula (B9) has a (meth)acryloyl group as a terminal group at each end, and therefore the polymerization of the compound with the substituents X occurs at each end of the compound.

Between the (meth)acryloyl groups, a structure linked by an urethane bond exists. Therefore, by appropriately setting the length (size) of the structure, that is by appropriately setting the kind of the two $A^2$s or the number of $n^8$, it is possible to control the (chain) length of the link structure, thereby allowing adjacent main skeletons to exist at a suitable interval. As a result, a polymer formed of the conductive material can have an excellent hole transport ability.

Further, in a compound represented by the general formula (B9), it is possible to appropriately select the kind of $A^2$s, that is, to appropriately select the kind of di-isocyanate compound. In this way, if an aromatic di-isocyanate compound is selected as the di-isocyanate compound, it is possible to obtain an aromatic urethane(meth)acrylate-based cross-linking agent from the compound represented by the general formula (B9). Further, if an alicyclic di-isocyanate compound is selected as the di-isocyanate compound, it is possible to obtain an alicyclic urethane(meth)acrylate-based cross-linking agent from the compound represented by the general formula (B9). Furthermore, if an aliphatic di-isocyanate compound is selected as the di-isocyanate compound, it is possible to obtain an aliphatic urethane (meth)acrylate-based cross-linking agent from the compound represented by the general formula (B9).

Examples of aromatic di-isocyanate compound include tolylene diisocyanate (TDI) such as tolylene 2,4-diisocyanate, tolylene-2,6-diisocyanate, tolylene-2,5-diisocyanate, tolylene 3,5-diisocyanate, and tolylene α,4-diisocyanate; tetramethylkylylene diisocyanate such as 2,4,6-trimethyl-1,3-phenylene diisocyanate, diphenylmethane diisocyanate (MDI), naphthalene diisocyanate (NDI), p-phenylene diisocyanate, 1,3-bis-(isocyanatomethyl)-benzene (XDI), m-tetramethylkylylene diisocyanate (m-TMXDI), and p-tetramethylkylylene diisocyanate (p-TMXDI); 3,3'-dimethyldiphenylmethane-4,4'-diisocyanate; and 4,4'-methylenebis(phenyl isocyanate) and the like.

Examples of alicyclic diisocyanate compound include trans-1,4-cyclohexane diisocyanate (CHD I), 4,4'-dicyclohexylmethane di-isocyanate (H12MDI), 1,3-bis-(isocyanatomethyl)-cyclohexane (H6XDI), and 3-isocyanatomethyl-3,5,5'-trimethylcyclohexylisocyanate (IPDI) and the like.

Examples of aliphatic diisocyanate compound include hexamethylene diisocyanate (HDI), dimer diisocyanate (DDI), and norbornene diisocyanate (NBDI) and the like.

Among these compounds, tolylene diisocyanate (TDI) is preferable as a diisocyate compound used in the compound represented by the general formula (B9), which is represented by the general formula (B10). Namely, an urethane(meth)acrylate-based cross-linking agent represented by the general formula (B10) is preferably used.

reaction, and therefore the obtained conductive layer is highly resistant to a solvent. Therefore, in the case where an upper layer is formed on the conductive layer in such a manner that the upper layer comes into contact with the conductive layer, swelling or dissolution of the conductive layer is reliably prevented due to a solvent or dispersion medium contained in a material forming the upper layer.

Further, the conductive layer is obtained by using the polymer as its main material. Therefore, in the case where an electronic device (which will be described later) is constructed using a laminate having such a conductive layer, the mixing of a constituent material of the conductive layer and a

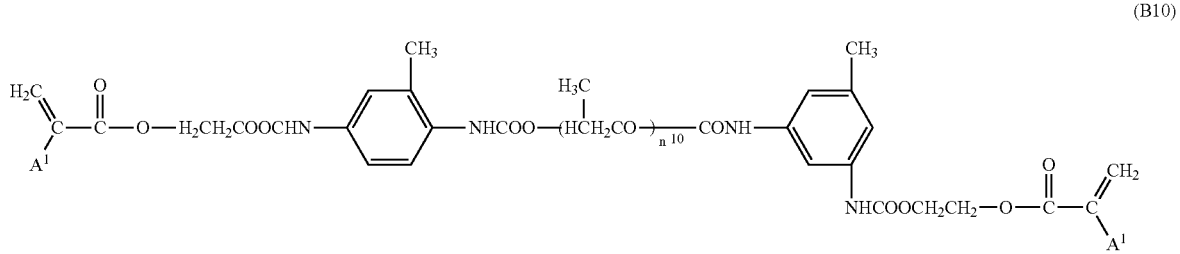

(B10)

wherein $n^{10}$ represents an integer of 1 to 100, and two or more $A^1$s may be the same or different and each independently represents a hydrogen atom or a methyl group.

Here, a benzene ring represented by the general formula (B10) has a methyl group as an electron-releasing substituent. Due to this structure, electron density is biased toward the side of the urethane bond. This makes it possible to prevent or suppress the urethane bond from being attacked from a compound having unshared electron pairs such as the water molecule, alcohol, ammonia, and the like, namely, being attacked from a nucleophile. Therefore, link cleavage is difficult to occur at the urethane bonding, and thus a polymer (conductive material) formed using the urethane(meth)acrylate-based cross-linking agent represented by the general formula (B10) is hard to deteriorate or degrade even in the case where it is placed in a relatively high temperature atmosphere. As a result, a conductive layer formed using the conductive material of the present invention as its main material can have excellent durability.

In the compound represented by the general formula (B10), it is preferred that $n^{10}$ is an integer of 1 to 90 as described above. By setting $n^{10}$ within the above range, it becomes possible to set an interval between the main skeletons at an appropriate range. With this result, the interaction between the adjacent main skeletons in the polymer can be reliably decreased, and therefore transferring holes between the adjacent main skeletons in the polymer can be carried out reliably. As a result, the resultant polymer formed of the composition can have an excellent carrier transport ability.

In this regard, it is to be noted that although an aromatic urethane(meth)acrylate-based cross-linking agent has a chemical structure in which a benzene ring having a conjugated bond exists, a nonconjugated chemical structure such as the methylene group and C—CH$_3$ bond also exists. Due to the existence of the nonconjugated chemical structure, this nonconjugated chemical structure appears in preference to the benzene ring structure, thereby enabling to properly prevent or suppress the interaction between the main skeletons via the benzene ring.

The conductive layer described above is obtained by using as its main material the polymer obtained by a polymerization constituent material of a layer that is in contact with the conductive layer (hereinafter, simply referred to as a "contact layer") is reliably prevented from occurring near the interface between the conductive layer and the contact layer with the lapse of time. As a result, it is possible to prevent the characteristics of the electronic device from being deteriorated with the lapse of time.

(Organic Electroluminescent Device)

Next, an embodiment of the electronic device according to the present invention will be described. In this embodiment, the electronic device of the present invention is embodied as an organic electroluminescent device (hereinafter, simply referred to as an "organic EL device") that is a light emitting device.

FIG. 1 is a cross-sectional view which shows an example of the organic EL device.

The organic EL device 1 shown in FIG. 1 includes a transparent substrate 2, an anode 3 provided on the substrate 2, an organic EL layer 4 provided on the anode 3, a cathode 5 provided on the organic EL layer 4 and a protection layer 6 provided so as to cover these layers 3, 4 and 5.

The substrate 2 serves as a support for the organic EL device 1, and the layers described above are formed on the substrate 2.

As a constituent material of the substrate 2, a material having a light-transmitting property and a good optical property can be used.

Examples of such a material include various resins such as polyethylene terephthalate, polyethylene naphthalate, polypropylene, cycloolefin polymer, polyamide, polyethersulfone, polymethylmethacrylate, polycarbonate, and polyarylate, and various glass materials, and the like. At least one of these materials can be used as a constituent material of the substrate 2.

The thickness of the substrate 2 is not particularly limited, but is preferably in the range of about 0.1 to 30 mm, more preferably in the range of about 0.1 to 10 mm.

The anode 3 is an electrode which injects holes into the organic EL layer 4 (that is, into a hole transport layer 41 described later). This anode 3 is made substantially transparent (which includes transparent and colorless, colored and transparent, or translucent) so that light emission from the organic EL layer 4 (that is, from a light emitting layer 42 described later) can be visually identified.

From such a viewpoint, a material having a high work function, excellent conductivity, and a light transmitting property is preferably used as the constituent material of the anode 3 (hereinafter, referred to as "anode material").

Examples of such an anode material include oxides such as ITO (Indium Tin Oxide), $SnO_2$, Sb-containing $SnO_2$, and Al-containing ZnO, Au, Pt, Ag, Cu, and alloys containing two or more of them. At least one of these materials can be used as an anode material.

The thickness of the anode 3 is not limited to any specific value, but is preferably in the range of about 10 to 200 nm, more preferably in the range of about 50 to 150 nm. If the thickness of the anode 3 is too thin, there is a case that a function of the anode 3 will not be sufficiently exhibited. On the other hand, if the anode 3 is too thick, there is a case that the light transmittance will be significantly lowered depending on, for example, the kind of anode material used, thus resulting in an organic EL device that is not suitable for practical use.

It is to be noted that conductive resins such as polythiophene, polypyrrole, and the like can also be used as the anode material.

On the other hand, the cathode 5 is an electrode which injects electrons into the organic EL layer 4 (that is, into an electron transport layer 43 described later).

As a constituent material of the cathode 5 (hereinafter, referred to as "cathode material"), a material having a low work function is preferably used.

Examples of such a cathode material include Li, Mg, Ca, Sr, La, Ce, Er, Eu, Sc, Y, Yb, Ag, Cu, Al, Cs, Rb, and alloys containing two or more of them. At least one of these materials can be used as a cathode material.

Particularly, in the case where an alloy is used as a cathode material, an alloy containing a stable metallic element such as Ag, Al, or Cu, specifically an alloy such as MgAg, AlLi, or CuLi is preferably used. The use of such an alloy as a cathode material makes it possible to improve the electron injection efficiency and stability of the cathode 5.

The thickness of the cathode 5 is preferably in the range of about 1 nm to 1 μm, more preferably in the range of about 100 to 400 nm. If the thickness of the cathode 5 is too thin, there is a case that a function of the cathode 5 will not be sufficiently exhibited. On the other hand, if the cathode 5 is too thick, there is a case that the light emitting efficiency of the organic EL device 1 will be lowered.

The organic EL layer 4 is provided between the anode 3 and the cathode 5. The organic EL layer 4 includes the hole transport layer 41, the light emitting layer 42, and the electron transport layer 43. These layers 41, 42 and 43 are formed on the anode 3 in this order.

The hole transport layer 41 has the function of transporting holes, which are injected from the anode 3, to the light emitting layer 42. The electron transport layer 43 has the function of transporting electrons, which are injected from the cathode 5, to the light emitting layer 42.

As a constituent material for one of the hole transport layer 41 and the electron transport layer 43 or for both the layers 41, 43, the conductive material according to the present invention can be used.

For example, in the case where the conductive material of the present invention is used as the constituent material of the hole transport layer 41, a compound having a chemical structure of the group Y which is constituted from a substituted or unsubstituted aromatic hydrocarbon ring can be used.

In more detail, compounds having chemical structures of the group Y represented by the above-mentioned chemical formulas (C1) to (C-16) can be used.

In this regard, it is to be noted that the constituent material of the electron transport layer 43 are not limited to specific materials, and various materials can be used for the electron transport layer 43.

Examples of such materials that can be used for the electron transport layer 43 include: benzene-based compounds (starburst-based compounds) such as 1,3,5-tris[(3-phenyl-6-tri-fluoromethyl)quinoxaline-2-yl]benzene (TPQ1), and 1,3,5-tris[{3-(4-t-butylphenyl)-6-trisfluoromethyl}quinoxaline-2-yl]benzene (TPQ2); naphthalene-based compounds such as naphthalene; phenanthrene-based compounds such as phenanthrene; chrysene-based compounds such as chrysene; perylene-based compounds such as perylene; anthracene-based compounds such as anthracene; pyrene-based compounds such as pyrene; acridine-based compounds such as acridine; stilbene-based compounds such as stilbene; thiophene-based compounds such as BBOT; butadiene-based compounds such as butadiene; coumarin-based compounds such as coumarin; quinoline-based compounds such as quinoline; bistyryl-based compounds such as bistyryl; pyrazine-based compounds such as pyrazine and distyrylpyrazine; quinoxaline-based compounds such as quinoxaline; benzoquinone-based compounds such as benzoquinone, and 2,5-diphenyl-para-benzoquinone; naphthoquinone-based compounds such as naphthoquinone; anthraquinone-based compounds such as anthraquinone; oxadiazole-based compounds such as oxadiazole, 2-(4-biphenylyl)-5-(4-t-butylphenyl)-1,3,4-oxadiazole (PBD), BMD, BND, BDD, and BAPD; triazole-based compounds such as triazole, and 3,4,5-triphenyl-1,2,4-triazole; oxazole-based compounds; anthrone-based compounds such as anthrone; fluorenone-based compounds such as fluorenone, and 1,3,8-trinitro-fluorenone (TNF); diphenoquinone-based compounds such as diphenoquinone, and MBDQ; stilbenequinone-based compounds such as stilbenequinone, and MBSQ; anthraquinodimethane-based compounds; thiopyran dioxide-based compounds; fluorenylidenemethane-based compounds; diphenyldicyanoethylene-based compounds; florene-based compounds such as florene; metallic or non-metallic phthalocyanine-based compounds such as phthalocyanine, copper phthalocyanine, and iron phthalocyanine; and various metal complexes such as 8-hydroxyquinoline aluminum ($Alq_3$), and complexes having benzooxazole or benzothiazole as a ligand. These compounds may be used singly or in combination of two or more of them.

In the case where both of the hole transport layer 41 and the electron transport layer 43 are formed using the conductive material according to the present invention as a main material, a constituent material of the hole transport layer 41 and a constituent material of the electron transport layer 43 are selected in consideration of their hole transport ability and electron transport ability.

Specifically, these constituent materials are selected so that the hole transport ability of the hole transport layer 41 becomes relatively higher than that of the electron transport layer 43 and the electron transport ability of the hole transport layer 41 becomes relatively lower than that of the electron transport layer 43. In other words, these constituent materials are selected so that the electron transport ability of the electron transport layer 43 becomes relatively higher than that of the hole transport layer 41 and the hole transport ability of the electron transport layer 43 becomes relatively lower than that of the hole transport layer 41.

For example, in the case where a polymer of a compound represented by the general formula (1) in which the group Y has a chemical structure represented by the chemical formula (D18) or (D20) is used as a conductive material for forming a hole transport layer 41, a conductive material for forming an electron transport layer 43 is preferably a polymer of a compound represented by the general formula (1) in which the group Y has a chemical structure represented by the chemical formula (D7) or (D19). In this case, a polymer of a compound represented by the general formula (1) in which the group Y has a chemical structure represented by the chemical formula (D17)_may also be used as a conductive material for forming the electron transport layer 43. In the case where a polymer of a compound represented by the general formula (1) in which the group Y has a chemical structure represented by the chemical formula (D7), (D19), or (D17) is used as a conductive material for forming an electron transport layer 43, the conductive material for forming the hole transport layer 41 may also be a polymer of a compound represented by the general formula (1) in which the group Y has a chemical structure represented by the chemical formula (D2) or (D16).

Further, the volume resistivity of the hole transport layer 41 is preferably 10 Ω·cm or larger, more preferably $10^2$ Ω·cm or larger. This makes it possible to provide an organic EL device 1 having a higher light emitting efficiency.

The thickness of the hole transport layer 41 is not limited to any specific value, but is preferably in the range of about 10 to 150 nm, more preferably in the range of about 50 to 100 nm. If the thickness of the hole transport layer 41 is too thin, there is a case that a pin hole may be produced. On the other hand, if the thickness of the hole transport layer 41 is too thick, there is a case that the transmittance of the hole transport layer 41 may be lowered so that the chromaticity (hue) of luminescent color of the organic EL device 1 is changed.

The thickness of the electron transport layer 43 is not limited to any specific value, but is preferably in the range of about 1 to 100 nm, more preferably in the range of about 20 to 50 nm. If the thickness of the electron transport layer 43 is too thin, there is a case that a pin hole may be produced, thereby causing a short-circuit. On the other hand, if the electron transport layer 43 is too thick, there is a case that the value of resistance may become high.

Further, the conductive material according to the present invention is particularly useful for forming a relatively thin hole transport layer 41 or electron transport layer 43.

When a current flows between the anode 3 and the cathode 5 (that is, a voltage is applied across the anode 3 and the cathode 5), holes are moved in the hole transport layer 41 and electrons are moved in the electron transport layer 43, and the holes and the electrons are then recombined in the light emitting layer 42. Then, in the light emitting layer 42, excitons are produced by energy released upon the recombination, and the excitons release energy (in the form of fluorescence or phosphorescence) or emit light when returning to the ground state.

Any material can be used as a constituent material of the light emitting layer 42 (hereinafter, referred to as "light emitting material") so long as it can provide a field where holes can be injected from the anode 3 and electrons can be injected from the cathode 5 during the application of a voltage to allow the holes and the electrons to be recombined.

Such light emitting materials include various low-molecular light emitting materials and various high-molecular light emitting materials (which will be mentioned below). At least one of these materials can be used as a light emitting material.

In this regard, it is to be noted that the use of a low-molecular light emitting material makes it possible to obtain a dense light emitting layer 42, thereby improving the light emitting efficiency of the light emitting layer 42. Further, since a high-molecular light emitting material is relatively easily dissolved in a solvent, the use of such a high-molecular light emitting material makes it easy to form a light emitting layer 42 by means of various application methods such as an ink-jet method and the like. Furthermore, if the low-molecular light emitting material and the high-molecular light emitting material are used together, it is possible to obtain the synergistic effect resulting from the effect of the low-molecular light emitting material and the effect of the high-molecular light emitting material. That is, it is possible to obtain the effect that a dense light emitting layer 42 having excellent light emitting efficiency can be easily formed by means of various application methods such as the ink-jet method and the like.

Examples of such a low-molecular light emitting material include: benzene-based compounds such as distyrylbenzene (DSB), and diaminodistyrylbenzene (DADSB); naphthalene-based compounds such as naphthalene and Nile red; phenanthrene-based compounds such as phenanthrene; chrysene-based compounds such as chrysene and 6-nitrochrysene; perylene-based compounds such as perylene and N,N'-bis(2,5-di-t-butylphenyl)-3,4,9,10-perylene-di-carboxyimide (BPPC); coronene-based compounds such as coronene; anthracene-based compounds such as anthracene and bis-styrylanthracene; pyrene-based compounds such as pyrene; pyran-based compounds such as 4-(di-cyanomethylene)-2-methyl-6-(para-dimethylaminostyryl)-4H-pyran (DCM); acridine-based compounds such as acridine; stilbene-based compounds such as stilbene; thiophene-based compounds such as 2,5-dibenzooxazolethiophene; benzooxazole-based compounds such as benzooxazole; benzoimidazole-based compounds such as benzoimidazole; benzothiazole-based compounds such as 2,2'-(para-phenylenedivinylene)-bisbenzothiazole; butadiene-based compounds such as bistyryl(1,4-diphenyl-1,3-butadiene) and tetraphenylbutadiene; naphthalimide-based compounds such as naphthalimide; coumarin-based compounds such as coumarin; perynone-based compounds such as perynone; oxadiazole-based compounds such as oxadiazole; aldazine-based compounds; cyclopentadiene-based compounds such as 1,2,3,4,5-pentaphenyl-1,3-cyclopentadiene (PPCP); quinacridone-based compounds such as quinacridone and quinacridone red; pyridine-based compounds such as pyrrolopyridine and thiadiazolopyridine; spiro compounds such as 2,2',7,7'-tetraphenyl-9,9'-spirobifluorene; metallic or non-metallic phthalocyanine-based compounds such as phthalocyanine ($H_2Pc$) and copper phthalocyanine; florene-based compounds such as florene; and various metallic complexes such as 8-hydroxyquinoline aluminum ($Alq_3$), tris(4-methyl-8-quinolinolate) aluminum(III) ($Almq_3$), (8-hydroxyquinoline) zinc ($Znq_2$), (1,10-phenanthroline)-tris-(4,4,4-trifluoro-1-(2-thienyl)-butan e-1,3-dionate) europium(III) ($Eu(TTA)_3(phen)$), fac-tris(2-phenylpyridine) iridium ($Ir(ppy)_3$), and (2,3,7,8,12,13,17,18-octaethyl-21H,23H-porphin) platinum(II).

Examples of a high-molecular light emitting material include polyacetylene-based compounds such as trans-type polyacetylene, cis-type polyacetylene, poly(di-phenylacetylene) (PDPA), and poly(alkyl, phenylacetylene) (PAPA); polyparaphenylenevinylene-based compounds such as poly(para-phenylenevinylene) (PPV), poly(2,5-dialkoxy-para-phenylenevinylene) (RO-PPV), cyano-substituted-poly(para-phenylenevinylene) (CN-PPV), poly(2-dimethyloctylsilyl-para-phenylenevinylene) (DMOS-PPV), and poly(2-methoxy-5-(2'-ethylhexoxy)-para-phenylenevinylene) (MEH-PPV); polythiophene-based compounds such as poly(3-alkylthiophene) (PAT), and poly(oxypropylene)

triol (POPT); polyfluorene-based compounds such as poly(9,9-dialkylfluorene) (PDAF), α,ω-bis[N,N'-di(methylphenyl)aminophenyl]-poly[9,9-bis(2-ethylhexyl)fluorene-2,7-diyl] (PF2/6am4), poly(9,9-dioctyl-2,7-divinylenefluorenyl)-alt-co(anthracene-9,10-diyl); polyparaphenylene-based compounds such as poly(para-phenylene) (PPP), and poly(1,5-dialkoxy-para-phenylene) (RO-PPP); polycarbazole-based compounds such as poly(N-vinylcarbazole) (PVK); and polysilane-based compounds such as poly(methylphenylsilane) (PMPS), poly(naphthylphenylsilane) (PNPS), and poly(biphenylylphenylsilane) (PBPS).

Further, the conductive material according to the present invention can also be used as the light emitting material depending on the combination of constituent materials used for forming a hole transport layer 41 and an electron transport layer 43.

For example, in the case where poly(thiophene/styrenesulfonic acid) such as poly(3,4-ethylenedioxythiophene/styrenesulfonic acid) or an arylamine compound such as N,N'-bis(1-naphthyl)-N,N'-diphenyl-benzidine(α-NPD) is used as a constituent material of the hole transport layer 41 and a triazole-based compound such as 3,4,5-triphenyl-1,2,4-triazole or an oxadiazole compound such as 2-(4-t-butylphenyl)-5-(biphenyl-4-yl)-1,3,5-oxadiazole (PBD) is used as a constituent material of the electron transport layer 43, a polymer of the compound represented by the general formula (1) in which the group Y has a chemical structure represented by the chemical formula (D12) or (D14) can be used as a conductive material for forming a light emitting layer 42.

The thickness of the light emitting layer 42 is not limited to any specific value, but is preferably in the range of about 10 to 150 nm, more preferably in the range of about 50 to 100 nm. By setting the thickness of the light emitting layer to a value within the above range, recombination of holes and electrons efficiently occurs, thereby enabling the light emitting efficiency of the light emitting layer 42 to be further improved.

It is to be noted here that any one of the electron transport layer 41, the light emitting layer 42, and the electron transport layer 43 in the organic EL device 1 may be formed using the conductive material according to the present invention or all the layers 41, 42, and 43 may be formed using the conductive material according to the present invention.

Although, in the present embodiment, each of the light emitting layer 42, the hole transport layer 41, and the electron transport layer 43 is separately provided, they may be formed into a hole-transportable light emitting layer which combines the hole transport layer 41 with the light emitting layer 42 or an electron-transportable light emitting layer which combines the electron transport layer 43 with the light emitting layer 42. In this case, an area in the vicinity of the interface between the hole-transportable light emitting layer and the electron transport layer 43 or an area in the vicinity of the interface between the electron-transportable light emitting layer and the hole transport layer 41 functions as the light emitting layer 42.

Further, in the case where the hole-transportable light emitting layer is used, holes injected from an anode into the hole-transportable light emitting layer are trapped by the electron transport layer, and in the case where the electron-transportable light emitting layer is used, electrons injected from a cathode into the electron-transportable light emitting layer are trapped in the electron-transportable light emitting layer. In both cases, there is an advantage in that the recombination efficiency of holes and electrons can be improved.

In this regard, it is to be noted that between the adjacent layers in the layers 3, 4 and 5, any additional layer may be provided according to its purpose. For example, a hole injecting layer for improving the injection efficiency of holes from the anode 3 may be provided between the hole transport layer 41 and the anode 3, or an electron injecting layer for improving the injection efficiency of electrons from the cathode 5 may be provided between the electron transport layer 43 and the cathode 5. In such a case where the organic EL device 1 includes a hole injecting layer and/or an electron injecting layer, the conductive material according to the present invention can be used as a constituent material of the hole injecting layer and/or the electron injecting layer.

As a constituent material of a hole injecting layer other than the conductive material according to the present invention, for example, copper phthalocyanine, 4,4',4"-tris(N,N-phenyl-3-methylphenylamino)triphenylamine (M-MTDATA), or the like can be used.

As described above, the protection layer 6 is provided so as to cover the layers 3, 4 and 5 constituting the organic EL device 1. This protection layer 6 has the function of hermetically sealing the layers 3, 4 and 5 constituting the organic EL device 1 to shut off oxygen and moisture. By providing such a protection layer 6, it is possible to obtain the effect of improving the reliability of the organic EL device 1 and the effect of preventing the alteration and deterioration of the organic EL device 1.

Examples of a constituent material of the protection layer 6 include Al, Au, Cr, Nb, Ta and Ti, alloys containing them, silicon oxide, various resin materials, and the like. In this regard, it is to be noted that in the case where a conductive material is used as a constituent material of the protection layer 6, it is preferred that an insulating film is provided between the protection layer 6 and each of the layers 3, 4 and 5 to prevent a short circuit therebetween, if necessary.

The organic EL device 1 can be used for a display, for example, but it can also be used for various optical purposes such as a light source and the like.

In the case where the organic EL device 1 is used for a display, the drive system thereof is not particularly limited, and either of an active matrix system or a passive matrix system may be employed.

The organic EL device 1 as described above can be manufactured in the following manner, for example.

[A1] Step of Forming Anode

First, a substrate 2 is prepared, and then an anode 3 is formed on the substrate 2.

The anode 3 can be formed by, for example, chemical vapor deposition (CVD) such as plasma CVD, thermal CVD, and laser CVD, vacuum deposition, sputtering, dry plating such as ion plating, wet plating such as electrolytic plating, immersion plating, and electroless plating, thermal spraying, a sol-gel method, a MOD method, bonding of a metallic foil, or the like.

[A2] Step of Forming Hole Transport Layer

[A2-1]

First, a composition for conductive materials of the present invention (hereinafter, also referred to as a "hole transport material") is applied or supplied onto the anode 3.

In the case where the composition for conductive materials contains an acrylic cross-linking agent in addition to a compound represented by the general formula (A1), the mixing ratio between the compound represented by the general formula (A1) and the acrylic cross-linking agent in the composition for conductive materials is preferably 1:9 to 9:1, more preferably 1:4 to 4:1, in terms of mole ratio. By setting the mixing ratio of the acrylic cross-linking agent within the above range, it is possible for adjacent main skeletons to exist at a more suitable interval in a resultant polymer.

In the application of the hole transport material, various application methods such as a spin coating method, a casting method, a micro gravure coating method, a gravure coating method, a bar coating method, a roll coating method, a wire-bar coating method, a dip coating method, a spray coating method, a screen printing method, a flexographic printing method, an offset printing method, an ink-jet method, and the like can be employed. According to such an application method, it is possible to relatively easily supply the hole transport material onto the anode 3.

In the case where the composition for conductive materials are prepared using a solvent or dispersion medium, examples of such a solvent or dispersion medium include: inorganic solvents such as nitric acid, sulfuric acid, ammonia, hydrogen peroxide, water, carbon disulfide, carbon tetrachloride, and ethylene carbonate; and various organic solvents such as ketone-based solvents e.g., methyl ethyl ketone (MEK), acetone, diethyl ketone, methyl isobutyl ketone (MIBK), methyl isopropyl ketone (MIPK), and cyclohexanone, alcohol-based solvents e.g., methanol, ethanol, isopropanol, ethylene glycol, diethyleneglycol (DEG), and glycerol, ether-based solvents e.g., diethyl ether, diisopropyl ether, 1,2-dimethoxy ethane (DME), 1,4-dioxane, tetrahydrofuran (THF), tetrahydropyran (THP), anisole, diethylene glycol dimethyl ether (diglyme), and diethylene glycol ethyl ether (Carbitol), cellosolve-based solvents e.g., methyl cellosolve, ethyl cellosolve, and phenyl cellosolve, aliphatic hydrocarbon-based solvents e.g., hexane, pentane, heptane, and cyclohexane, aromatic hydrocarbon-based solvents e.g., toluene, xylene, and benzene, aromatic heterocyclic compound-based solvents e.g., pyridine, pyrazine, furan, pyrrole, thiophene, and methylpyrrolidone, amide-based solvents e.g., N,N-dimethylformamide (DMF) and N,N-dimethylacetamide (DMA), halogen compound-based solvents e.g., dichloromethane, chloroform, and 1,2-dichloroethane, ester-based solvents e.g., ethyl acetate, methyl acetate, and ethyl formate, sulfur compound-based solvents e.g., dimethyl sulfoxide (DMSO) and sulfolane, nitrile-based solvents e.g., acetonitrile, propionitrile, and acrylonitrile, organic acid-based solvents e.g., formic acid, acetic acid, trichloroacetic acid, and trifluoroacetic acid, and mixed solvents containing them.

It is to be noted that the composition for conductive materials preferably contains a polymerization initiator. By adding a polymerization initiator to the composition for conductive materials, it is possible to promote direct polymerization of substituents X or polymerization of substituents X via the acrylic cross-linking agent when predetermined treatment such as heating or light irradiation is carried out in the next step [A2-2].

Examples of a polymerization initiator include, but are not limited thereto, photopolymerization initiators such as radical photopolymerization initiators and cationic photopolymerization initiators, heat polymerization initiators, and anaerobic polymerization initiators. Among them, radical photopolymerization initiators are particularly preferably used. By using a radical photopolymerization initiator, it is possible to relatively easily promote direct polymerization of substituents X or polymerization of substituents X via the acrylic cross-linking agent in the next step [A2-2].

As such a radical photopolymerization initiator, various radical photopolymerization initiators can be used. Examples of such radical photopolymerization initiators include benzophenone-based radical photopolymerization initiators, benzoin-based radical photopolymerization initiators, acetophenone-based radical photopolymerization initiators, benzylketal-based radical photopolymerization initiators, Michler's keton-based radical photopolymerization initiators, acylphosphine oxide-based radical photopolymerization initiators, ketocoumarin-based radical photopolymerization initiators, xanthene-based radical photopolymerization initiators, and thioxanthone-based radical photopolymerization initiators.

Further, in the case where a photopolymerization initiator is used as a polymerization initiator, a sensitizer suitable for the photopolymerization initiator to be used may be added to the composition for conductive materials.

[A2-2]

Next, the hole transport material supplied onto the anode 3 is irradiated with light.

By this light irradiation, substituents X of the compounds each represented by the general formula (A1) and contained in the hole transport material are polymerized directly or via the acrylic cross-linking agent to obtain a polymer (that is, a conductive material according to the present invention). As a result, a hole transport layer 41 mainly comprised of the conductive material according to the present invention is formed on the anode 3.

By forming a hole transport layer 41 using the conductive material according to the present invention as its main material, it is possible to prevent the hole transport layer 41 from swelling and being dissolved due to a solvent or dispersion medium contained in a light emitting layer material to be supplied onto the hole transport layer 41 in the next step [A3]. As a result, mutual dissolution between the hole transport layer 41 and the light emitting layer 42 is reliably prevented.

In addition, by forming a hole transport layer 41 using the conductive material (that is, the polymer) according to the present invention as its main material, it is also possible to reliably prevent the mixing of the constituent materials of the hole transport layer 41 and the light emitting layer 42 from occurring near the interface between these layers 41 and 42 in a resultant organic EL device 1 with the lapse of time.

The weight-average molecular weight of the polymer is not particularly limited, but is preferably in the range of about 1,000 to 1,000,000, more preferably in the range of about 10,000 to 300,000. By setting the weight-average molecular weight of the polymer to a value within the above range, it is possible to suppress or prevent the swelling and dissolution of the polymer more reliably.

It is to be noted that the hole transport layer 41 may contain a monomer or oligomer of the compound represented by the general formula (A1) and/or a monomer or oligomer of the acrylic cross-linking agent to the extent that mutual dissolution between the hole transport layer 41 and the light emitting layer 42 can be prevented.

As light with which the hole transport material is irradiated, for example, infrared rays, visible light, ultraviolet rays, or X-rays can be used. These types of light can be used singly or in combination of two or more of them. Among them, ultraviolet rays are particularly preferably used. By using ultraviolet rays, it is possible to easily and reliably polymerize the substituents X directly or via the acrylic cross-linking agent.

The wavelength of ultraviolet rays to be used for light irradiation is preferably in the range of about 100 to 420 nm, more preferably in the range of about 150 to 400 nm.

The irradiation intensity of ultraviolet rays is preferably in the range of about 1 to 600 mW/cm$^2$, more preferably in the range of about 1 to 300 mW/cm$^2$.

Further, the irradiation time of ultraviolet rays is preferably in the range of about 60 to 600 seconds, more preferably in the range of about 90 to 500 seconds.

By setting each of the wavelength, irradiation intensity, and irradiation time of ultraviolet rays to a value within the above range, it is possible to relatively easily control the progress of polymerization reaction of the hole transport material supplied onto the anode 3.

It is to be noted that the resultant hole transport layer 41 may be subjected to heat treatment in the atmosphere or an inert atmosphere or under reduced pressure (or under vacuum) when necessary. By doing so, it is possible to dry (that is, it is possible to remove a solvent or a dispersion medium) or solidify the hole transport layer 41. The hole transport layer 41 may be dried by means other than heat treatment.

Further, examples of predetermined treatment for polymerizing the substituents X directly or via the acrylic cross-linking agent other than light irradiation include heating and anaerobic treatment. Among these treatment methods, light irradiation as described above is preferably employed. By employing light irradiation, it is possible to relatively easily select the area where a polymerization reaction is carried out and the degree of polymerization.

[A3] Step of Forming Light Emitting Layer

Next, a light emitting layer 42 is formed on the hole transport layer 41.

The light emitting layer 42 can be formed by, for example, applying onto the hole transport layer 41, a light emitting layer material (that is, a material for forming a light emitting layer) obtained by dissolving the light emitting material as described above in a solvent or dispersing the light emitting material in a dispersion medium.

As solvents or dispersion media in which the light emitting material is to be dissolved or dispersed, the same solvents or dispersion media that have been mentioned with reference to the step of forming the hole transport layer [A2] can be used.

Further, as methods for applying the light emitting layer material onto the hole transport layer 41, the same application methods that have been mentioned with reference to the step of forming the hole transport layer [2A] can be employed.

[A4] Step of Forming Electron Transport Layer

Next, an electron transport layer 43 is formed on the light emitting layer 42.

In the case where a constituent material of the electron transport layer 43 is formed of the conductive material according to the present invention, the electron transport layer 43 can be formed using the composition for conductive materials according to the present invention in the same manner that has been described with reference to the step of forming the hole transport layer [A2].

On the other hand, in the case where a constituent material of the electron transport layer 43 is not formed of the conductive material according to the present invention, the electron transport layer 43 can be formed using the known electron transport materials described above in the same manner that has been described with reference to the step of forming the light emitting layer [A3].

It is to be noted that in the case where the light emitting layer 42 is not formed using a polymer such as the conductive material according to the present invention, a solvent or dispersion medium in which the composition for conductive materials for use in forming the electron transport layer 43 is to be dissolved or dispersed is selected from among those which do not cause swelling and dissolution of the light emitting layer 42. By using such a solvent or a dispersion medium, it is possible to reliably prevent mutual dissolution between the light emitting layer 42 and the electron transport layer 43.

[A5] Step of Forming Cathode

Next, a cathode 5 is formed on the electron transport layer 43.

The cathode 5 can be formed by, for example, vacuum deposition, sputtering, bonding of a metallic foil, or the like.

[A6] Step of Forming Protection Layer

Next, a protection layer 6 is formed so as to cover the anode 3, the organic EL layer 4, and the cathode 5.

The protection layer 6 can be formed or provided by, for example, bonding a box-like protection cover made of the material as mentioned above by the use of various curable resins (adhesives).

As for such curable resins, all of thermosetting resins, photocurable resins, reactive curable resins, and anaerobic curable resins can be used.

The organic EL device 1 is manufactured through these steps as described above.

(Organic Thin Film Transistor)

Next, another embodiment of the electronic device according to the present invention will be described. In this embodiment, the electronic device of the present invention is embodied as an organic thin film transistor that is a switching element (hereinafter, simply referred to as an "organic TFT").

Figure 2:
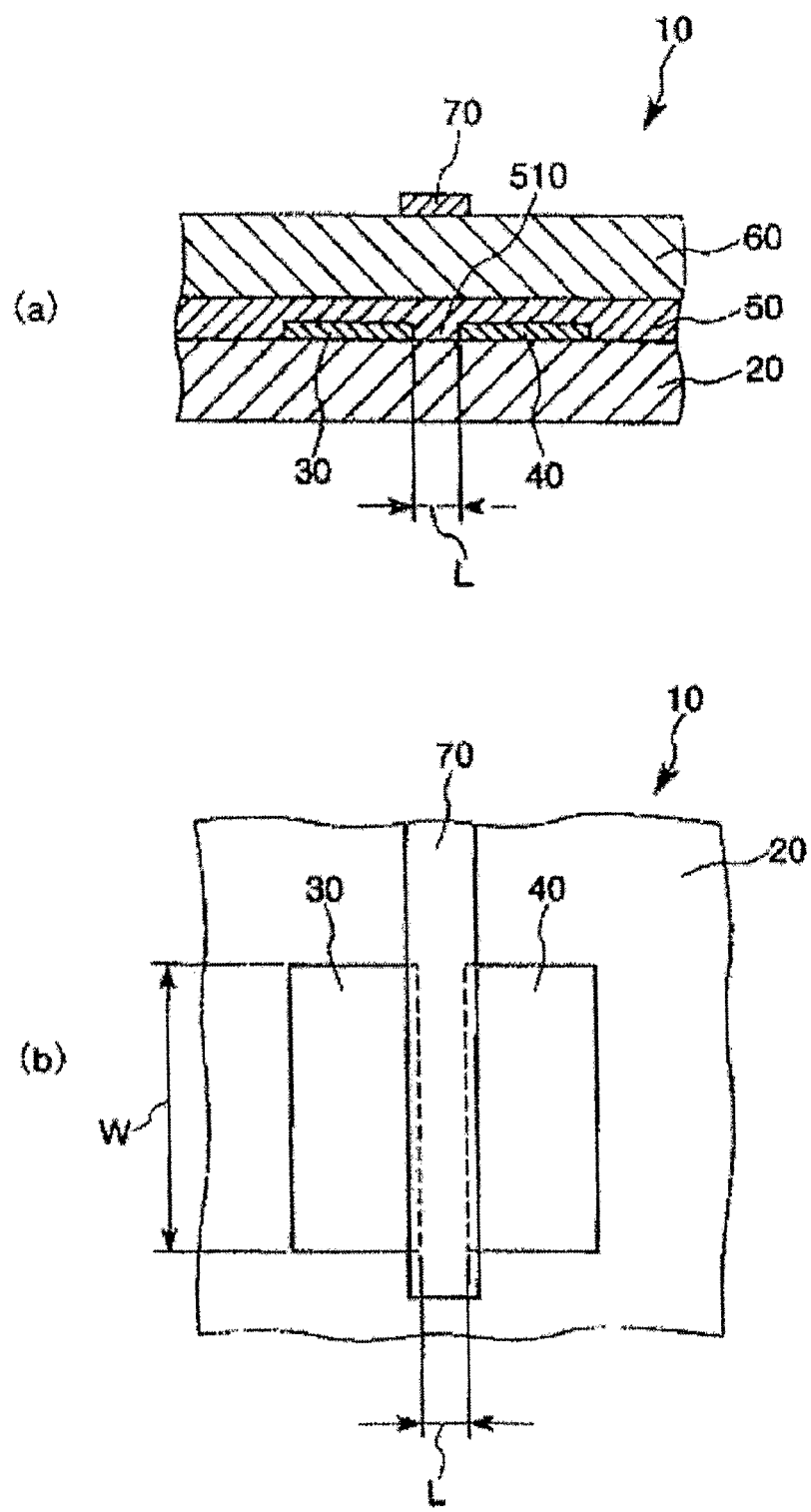
FIG. 2(a) is a cross-sectional view of an organic TFT.
FIG. 2(b) is a plan view of the organic TFT.

FIG. 2(*a*) is a cross-sectional view of an organic TFT 10, and FIG. 2(*b*) is a plan view of the organic TFT 10. It is to be noted that in the following description, the upper side and the lower side in FIG. 2(*a*) will be referred to as "upper side" and "lower side", respectively.

The organic TFT 10 shown in FIG. 2 is provided on a substrate 20. On the substrate 20, a source electrode 30, a drain electrode 40, an organic semiconductor layer (that is, a conductive layer according to the present invention) 50, a gate insulating layer 60, and a gate electrode 70 are laminated in this order from the side of the substrate 20.

Specifically, in the organic TFT 10, the source electrode 30 and the drain electrode 40 are separately provided on the substrate 20, and the organic semiconductor layer 50 is provided so as to cover these electrodes 30 and 40. On the organic semiconductor layer 50, the gate insulating layer 60 is provided. On the gate insulating layer 60, the gate electrode 70 is provided so as to overlap with at least a region between the source electrode 30 and the drain electrode 40.

In the organic TFT 10, the region in the organic semiconductor layer 50 which is existed between the source electrode 30 and the drain electrode 40 functions as a channel region 510 where carriers are moved. Hereinafter, the length of the channel region 510 in a direction that carriers are moved, that is, the distance between the source electrode 30 and the drain electrode 40 is referred to as "channel length L", and the length of the channel region 510 in a direction orthogonal to the direction of the channel length L is referred to as "channel width W".

The organic TFT 10 is an organic TFT having a structure in which the source electrode 30 and the drain electrode 40 are provided so as to be closer to the substrate 20 than the gate electrode 70 provided through the gate insulating layer 60. That is, the organic TFT 10 is an organic TFT having a top gate structure.

Hereinbelow, components of the organic TFT 10 will be described one by one.

The substrate 20 supports the layers (or the components) constituting the organic TFT 10. As such a substrate 20, for example, the same substrate that has been described with reference to the substrate 2 of the organic EL device 1 can be used. Alternatively, a silicon substrate or a gallium arsenide substrate may be used as the substrate 20.

On the substrate 20, the source electrode 30 and the drain electrode 40 are provided side by side at a predetermined distance in the direction of the channel length L.

The constituent material of the source electrode 30 and the drain electrode 40 is not particularly limited so long as it has conductivity. Examples of such a constituent material include metallic materials such as Pd, Pt, Au, W, Ta, Mo, Al, Cr, Ti, Cu, and alloys containing two or more of them, conductive oxide materials such as ITO, FTO, ATO, and $SnO_2$, carbon materials such as carbon black, carbon nanotube, and fullerene, and conductive polymeric materials such as polyacetylene, polypyrrole, polythiophene e.g., PEDOT (polyethylenedioxythiophene), polyaniline, poly(p-phenylene), poly(p-phenylenevinylene), polyfluorene, polycarbazole, polysilane, and derivatives thereof. Among them, the conductive polymeric materials are usually doped with iron chloride, iodine, strong acid, organic acid, or a polymer such as polystyrenesulfonic acid so as to have conductivity when used. These conductive materials can be used singly or in combination of two or more of them.

The thickness of each of the source electrode 30 and the drain electrode 40 is not particularly limited, but is preferably in the range of about 30 to 300 nm, more preferably in the range of about 50 to 200 nm.

The distance between the source electrode 30 and the drain electrode 40, that is, the channel length L is preferably in the range of about 2 to 30 μm, more preferably in the range of about 2 to 20 μm.

The channel width W is preferably in the range of about 0.1 to 5 mm, more preferably in the range of about 0.3 to 3 mm.

As described above, the organic semiconductor layer 50 is provided on the substrate 20 so as to cover the source electrode 30 and the drain electrode 40. As a constituent material of the organic semiconductor layer 50, the conductive material according to the present invention can be used.

As described above, by appropriately setting the chemical structure of the group Y of the compound represented by the general formula (1), it is possible to impart a desired carrier transport property to a resultant polymer (that is, to a conductive material according to the present invention).

Therefore, the conductive material according to the present invention is useful for forming an organic semiconductor layer 50 because it is possible to impart good semiconductivity to the polymer by appropriately setting the chemical structure of the group Y.

As a conductive material constituting such an organic semiconductor layer 50, for example, a polymer of the compound represented by the general formula (A1) in which the group Y has a chemical structure represented by the chemical formula (D2), (D3), (D16), (D17), or (D20) is preferably selected.

The thickness of the organic semiconductor layer 50 is preferably in the range of about 0.1 to 1,000 nm, more preferably in the range of about 1 to 500 nm, and even more preferably in the range of about 10 to 100 nm. By setting the thickness of the organic semiconductor layer 50 to a value within the above range, it is possible to prevent an increase in size of the organic TFT 10 (especially, an increase in thickness of the organic TFT 10) while maintaining a high carrier transport ability of the organic TFT 10.

By using the organic semiconductor layer 50 which is obtained by using a polymer such as the conductive material according to the present invention as its main material, it is possible to obtain an organic TFT 10 having reduced size and weight. In addition, it is also possible for the organic TFT 10 to have excellent flexibility. Such an organic TFT 10 is suitably used for a switching element of a flexible display provided with the organic EL devices described above.

The organic semiconductor layer 50 is not limited to one provided so as to cover the source electrode 30 and the drain electrode 40. The organic semiconductor layer 50 should be provided in at least the region between the source electrode 30 and the drain electrode 40 (that is, in at least the channel region 510).

As described above, the gate insulating layer 60 is provided on the organic semiconductor layer 50.

The gate insulating layer 60 is provided to insulate the gate electrode 70 from the source electrode 30 and the drain electrode 40.

The gate insulating layer 60 is preferably formed using an organic material (especially, an organic polymeric material) as its main material. By using an organic polymeric material as a main material of the gate insulating layer 60, it is possible to form the gate insulating layer 60 easily as well as to bring the gate insulating layer 60 into closer contact with the organic semiconductor layer 50.

Examples of such an organic polymeric material include polystyrene, polyimide, polyamideimide, polyvinylphenylene, polycarbonate (PC), acrylic resins such as polymethylmethacrylate (PMMA), fluorinated resins such as polytetrafluoroethylene (PTFE), phenolic resins such as polyvinyl phenol and novolac resins, and olefin-based resins such as polyethylene, polypropylene, polyisobutylene, and polybutene. These organic polymeric materials may be used singly or in combination of two or more of them.

The thickness of the gate insulating layer 60 is not particularly limited, but is preferably in the range of about 10 to 5,000 nm, more preferably in the range of about 100 to 1,000 nm. By setting the thickness of the gate insulating layer 60 to a value within the above range, it is possible to prevent the size of the organic TFT 10 from being increased (especially, an increase in thickness of the organic TFT 10) while reliably insulating the gate electrode 70 from the source electrode 3 and the drain electrode 40.

It is to be noted that the gate insulating layer 60 is not limited to one comprised of a single layer and may have two or more layers.

As described above, the gate electrode 70 is provided on the gate insulating layer 60.

As constituent materials of the gate electrode 70, the same constituent materials that have been mentioned with reference to the source electrode 30 and the drain electrode 40 can be used.

The thickness of the gate electrode 70 is not particularly limited, but is preferably in the range of about 0.1 to 5,000 nm, more preferably in the range of about 1 to 5,000 nm, even more preferably in the range of about 10 to 5,000 nm.

In the organic TFT 10 as described above, the amount of current flowing between the source electrode 30 and the drain electrode 40 is controlled by changing voltage applied to the gate electrode 70.

Namely, in the OFF-state where voltage is not applied to the gate electrode 70, only a little current flows even by applying voltage across the source electrode 30 and the drain electrode 40 because carriers hardly exist in the organic semiconductor layer 50. On the other hand, in the ON-state where voltage is applied to the gate electrode 70, an electric charge is induced in the surface of the organic semiconductor layer 50 that is in contact with the gate insulating layer 60 so that a channel for carriers is formed in the channel region 510. In such a state, by applying voltage across the source electrode 30 and the drain electrode 40, it is possible to allow carriers (holes or electrons) to pass through the channel region 510.

Such an organic TFT 10 as described above can be manufactured in the following manner, for example.

Figure 3:
FIG. 3(a) to FIG. 3(d) are illustrations which explain the manufacturing method of the organic TFT shown in FIG. 2.
Figure 3:
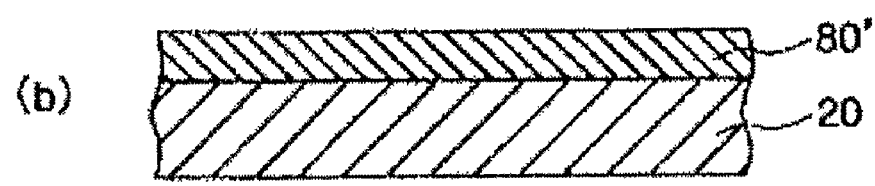
Figure 3:
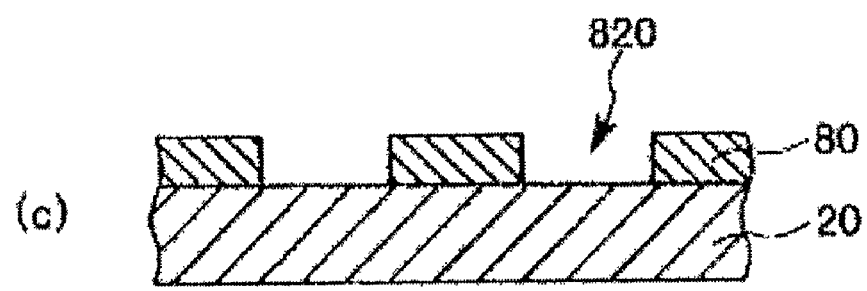
Figure 3:
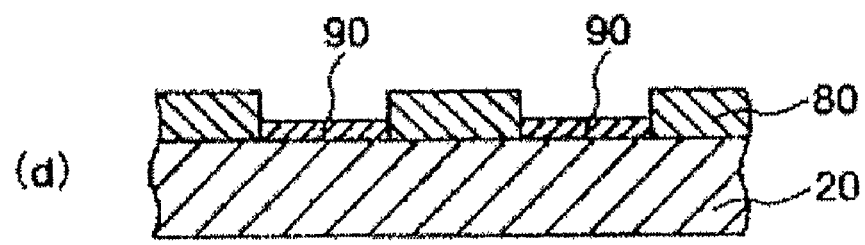
Figure 4:
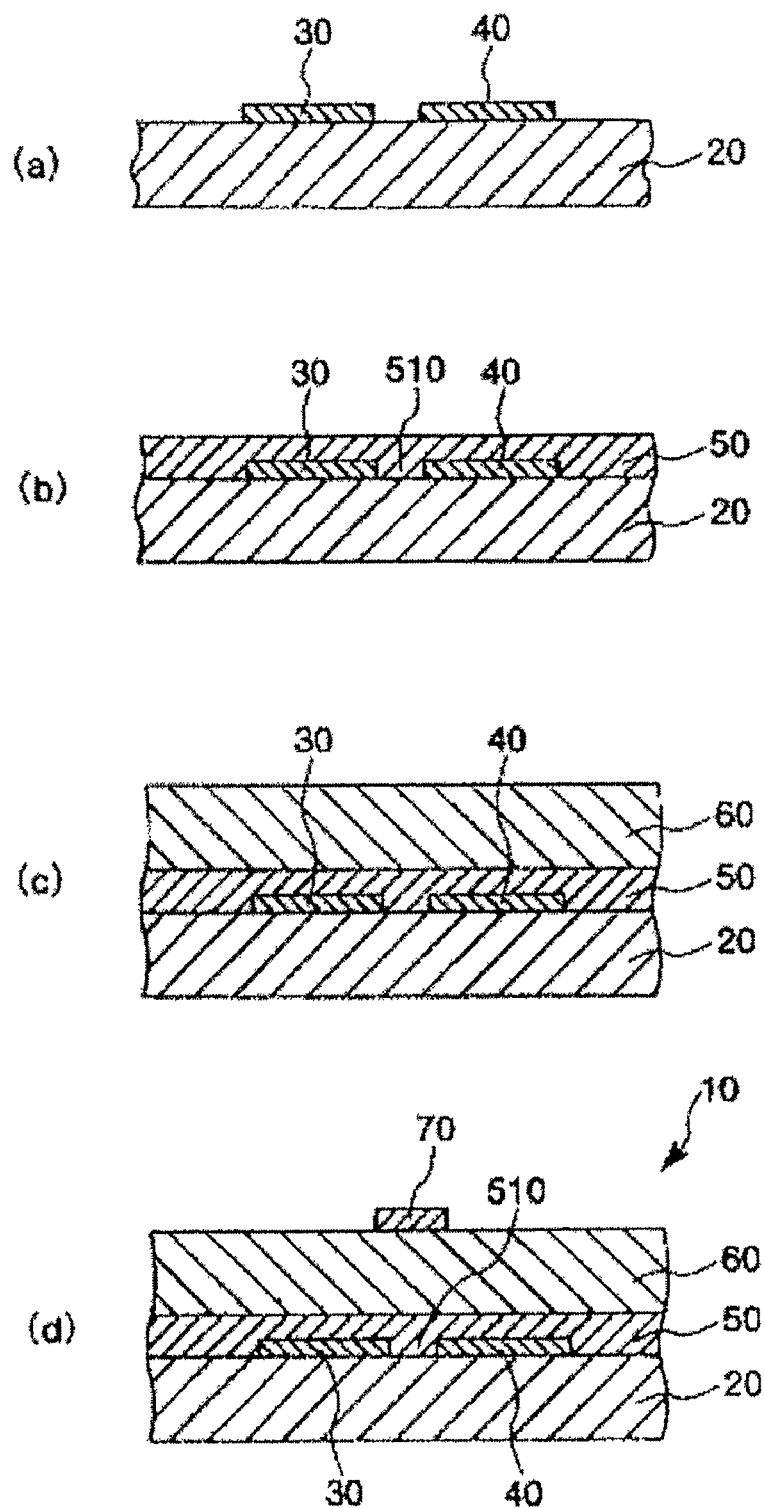
FIG. 4(a) to FIG. 4(d) are illustrations which explain the manufacturing method of the organic TFT shown in FIG. 2.

FIGS. 3 and 4 are drawings (cross-sectional views) to be used for explaining a manufacturing method of the organic TFT 10 shown in FIG. 2. It is to be noted that, in the following description, the upper side and lower side in FIGS. 3 and 4 will be referred to as the "upper side" and the "lower side", respectively.

[B1] Step of Forming Source Electrode and Drain Electrode

[B1-1]

First, a substrate 20 as shown in FIG. 3 (*a*) is prepared. The substrate 20 is washed with, for example, water (e.g., pure water) and/or organic solvents. Water and organic solvents may be used singly or in combination of two or more of them.

Next, a photoresist is supplied onto the substrate 20 to form a film 80' (see FIG. 3 (*b*)).

As a photoresist to be supplied onto the substrate 20, either a negative-type photoresist or a positive-type photoresist may be used. When the negative-type photoresist is used, an area irradiated with light (that is, an area exposed to light) is cured and then an area other than the area exposed to light is dissolved by development to be removed. When the positive-type photoresist is used, an area exposed to light is dissolved by development to be removed.

Examples of such a negative-type photoresist include water-soluble photoresists such as rosin-dichromate, polyvinyl alcohol (PVA)-dichromate, shellac-dichromate, casein-dichromate, PVA-diazo, and acrylic photoresists and oil-soluble photoresists such as polyvinyl cinnamate, cyclized rubber-azide, polyvinyl cinnamylidene acetate, and polycinnamic acid β-vinyloxyethyl ester.

Examples of a positive-type photoresist include oil-soluble photoresists such as o-naphthoquinonediazide.

Any method can be used for supplying a photoresist onto the substrate 20, but various application methods are preferably employed.

As such application methods, the same methods that have been mentioned with reference to the step of forming the hole transport layer [A2] in the manufacturing method of the organic EL device 1 can be employed.

Next, the film 80' is exposed to light through a photomask and is then developed to form a resist layer 80 having openings 820 where a source electrode 30 and a drain electrode 40 are to be formed (see FIG. 3(C)).

[B1-2]

Next, as shown in FIG. 3 (*d*), a predetermined amount of a liquid material 90 containing a constituent material of a source electrode 30 and a drain electrode 40 to be formed or a precursor thereof is supplied to the openings 820 provided on the substrate 20.

As solvents or dispersion media in which a constituent material of a source electrode 30 and a drain electrode 40 or a precursor thereof is dissolved or dispersed for preparing a liquid material 90, the same solvents or dispersion media that have been mentioned with reference to the step of forming hole transport layer [A2] can be used.

As methods for supplying the liquid material 90 to the openings 820, the same application methods that have been mentioned above can be employed. Among these application methods, an inkjet method (that is, a liquid droplet ejecting method) is preferably employed. By employing the inkjet method, it is possible to eject the liquid material 90 in the form of liquid droplets from a nozzle of a liquid droplet ejecting head, thereby enabling the liquid material 90 to be reliably supplied to the openings 820. As a result, adhesion of the liquid material 90 to the resist layer 80 is reliably prevented.

[B1-3]

Next, the solvent or dispersion medium contained in the liquid material 90 supplied to the openings 820 is removed to form a source electrode 30 and a drain electrode 40.

The temperature at which the solvent or dispersion medium is removed is not particularly limited, and slightly varies depending on the kind of solvent or dispersion medium used. However, the temperature at which the solvent or dispersion medium is removed is preferably in the range of about 20 to 200° C., more preferably in the range of about 50 to 100° C. By removing the solvent or dispersion medium at a temperature within the above range, it is possible to reliably remove the solvent or dispersion medium from the liquid material 90.

In this connection, it is to be noted that the solvent or dispersion medium contained in the liquid material 90 may be removed by heating under reduced pressure. By doing so, it is possible to more reliably remove the solvent or dispersion medium from the liquid material 90.

[B1-4]

Next, the resist layer 80 provided on the substrate 20 is removed to obtain the substrate 20 on which the source electrode 30 and the drain electrode 40 are formed (see FIG. 4(*a*)).

A method for removing the resist layer 80 is appropriately selected depending on the kind of resist layer 80. For example, ashing such as plasma treatment or ozone treatment, irradiation with ultraviolet rays, or irradiation with a laser such as a Ne—He laser, an Ar laser, a $CO_2$ laser, a ruby laser, a semiconductor laser, a YAG laser, a glass laser, a $YVO_4$ laser, or an excimer laser may be carried out. Alternatively, the resist layer 80 may removed by being brought into contact with a solvent capable of dissolving or decomposing the resist layer 80 by, for example, immersing the resist layer 80 in such a solvent.

[B2] Step of Forming Organic Semiconductor Layer

Next, as shown in FIG. 4(*b*), an organic semiconductor layer 50 is formed on the substrate 20 so as to cover the source electrode 30 and the drain electrode 40 provided on the substrate 20.

At this time, a channel region 510 is formed between the source electrode 30 and the drain electrode 40 (that is, in an area corresponding to an area where a gate electrode 70 is to be formed).

The organic semiconductor layer 50 can be formed using the composition for conductive materials according to the present invention by the same method that has been described with reference to the step of forming the hole transport layer [A2] in the manufacturing method of the organic EL device 1.

The organic semiconductor layer 50 is formed using the conductive material (that is, the polymer) according to the present invention as its main material. Therefore, when a gate insulating layer material is supplied onto the organic semiconductor layer 50 in the next step [B3], swelling and dissolution of the polymer due to a solvent or dispersion medium contained in the gate insulating layer material is properly inhibited or prevented. As a result, mutual dissolution between the organic semiconductor layer 50 and a gate insulating layer 60 is reliably prevented.

By forming an organic semiconductor layer 50 using a polymer such as the conductive material according to the present invention as its main material, it is possible to reliably prevent the mixing of the constituent materials of the organic semiconductor layer 50 and the gate insulating layer 60 from occurring near the interface between these layers 50 and 60 with the lapse of time.

[B3] Step of Forming Gate Insulating Layer

Next, as shown in FIG. 4(*c*), a gate insulating layer 60 is formed on the organic semiconductor layer 50 by an application method.

Specifically, the gate insulating layer 60 can be formed by applying or supplying a solution containing an insulating material or a precursor thereof onto the organic semiconductor layer 50 by the application method described above. When necessary, the thus obtained layer is subjected to aftertreatment such as heating, irradiation with infrared rays, or exposure to ultrasound.

[B4] Step of Forming Gate Electrode

Next, as shown in FIG. 4(*d*), a gate electrode 70 is formed on the gate insulating layer 60 by an application method.

Specifically, the gate electrode 70 can be formed by applying or supplying a solution containing an electrode material or a precursor thereof onto the gate insulating layer 60 by the application method. When necessary, the thus obtained layer is subjected to aftertreatment such as heating, irradiation with infrared rays, or exposure to ultrasound.

As application methods to be used, the same methods that have been mentioned above can be employed. Particularly, an inkjet method is preferably employed. By employing the inkjet method, it is possible to eject a solution containing an electrode material or a precursor thereof in the form of liquid droplets from a nozzle of a liquid droplet ejecting head to carry out patterning. As a result, a gate electrode 70 having a predetermined shape is easily and reliably formed on the gate insulating layer 60.

The organic TFT 10 is manufactured through the steps described above.

(Electronic Equipment)

The electronic devices according to the present invention such as the organic EL device (which is a light emitting device) 1 and the organic TFT (which is a switching element) 10 as described above can be used for various electronic equipment.

Figure 5:
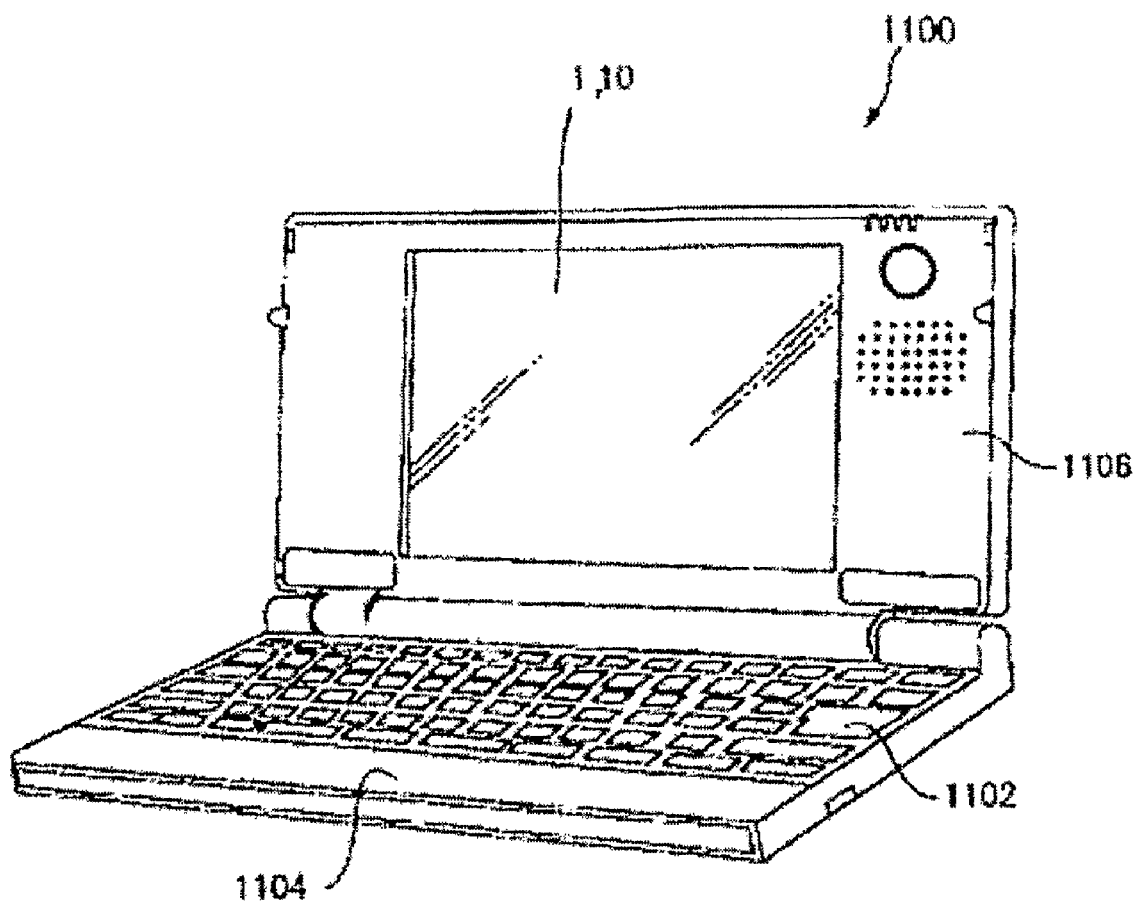
FIG. 5 is a perspective view which shows the structure of a personal mobile computer (or a personal notebook computer) to which the electronic equipment according to the present invention is applied.

FIG. 5 is a perspective view which shows the structure of a personal mobile computer (or a personal notebook computer) to which the electronic equipment according to the present invention is applied.

In FIG. 5, a personal computer 1100 is comprised of a main body 1104 provided with a keyboard 1102 and a display unit 1106 provided with a display. The display unit 1106 is rotatably supported by the main body 1104 via a hinge structure.

In the personal computer 1100, for example, the display unit 1106 includes the organic EL device (which is a light emitting device) 1 and the organic TFT (which is a switching element) 10 described above.

Figure 6:
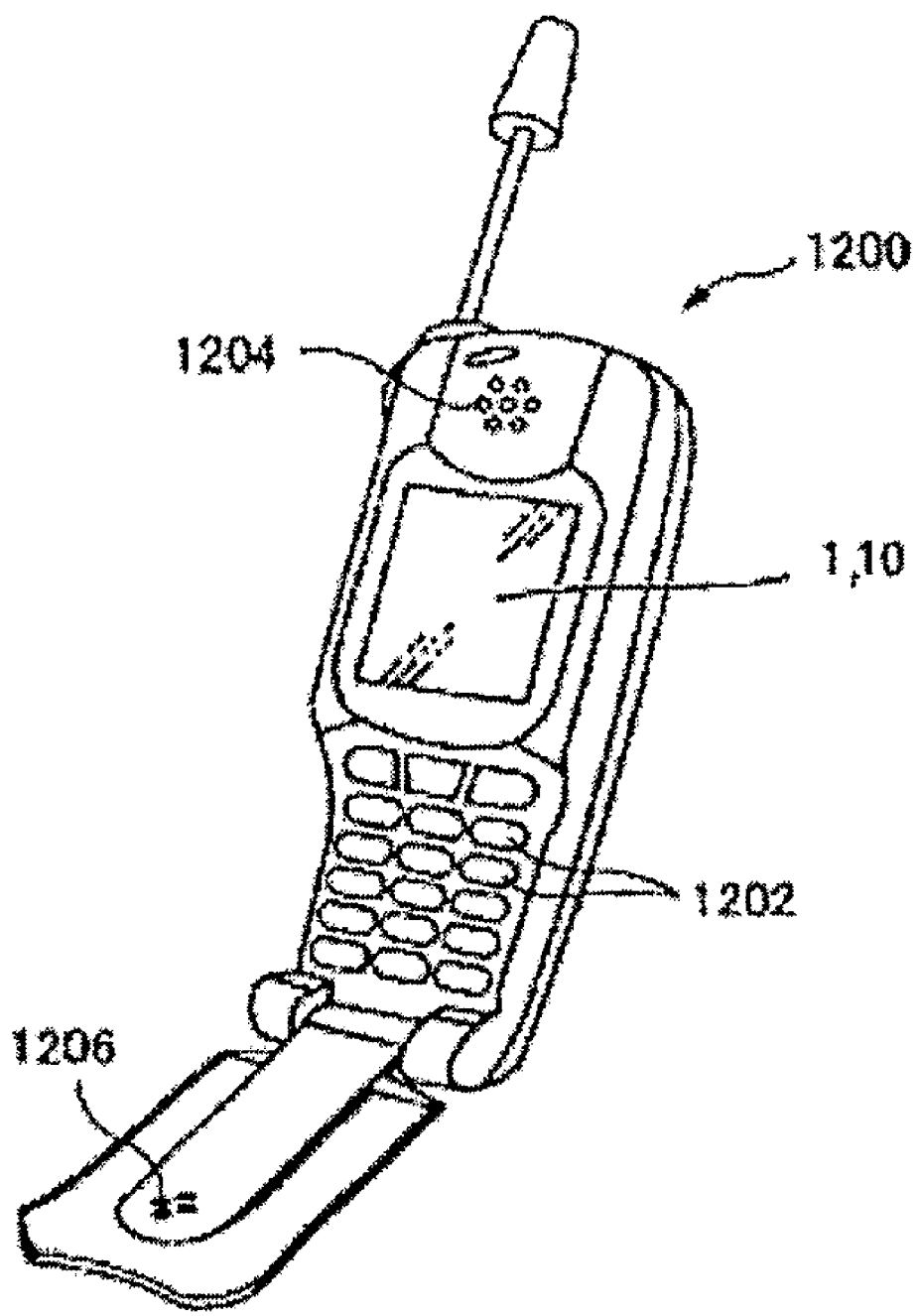
FIG. 6 is a perspective view which shows the structure of a mobile phone (including the personal handyphone system (PHS)) to which the electronic equipment according to the present invention is applied.

FIG. 6 is a perspective view which shows the structure of a mobile phone (including the personal handyphone system (PHS)) to which the electronic equipment according to the present invention is applied.

The mobile phone 1200 shown in FIG. 6 includes a plurality of operation buttons 1202, an earpiece 1204, a mouthpiece 1206, and a display.

In this mobile phone 1200, for example, the display includes the organic EL device (which is a light emitting device) 1 and the organic TFT (which is a switching element) 10 described above.

Figure 7:
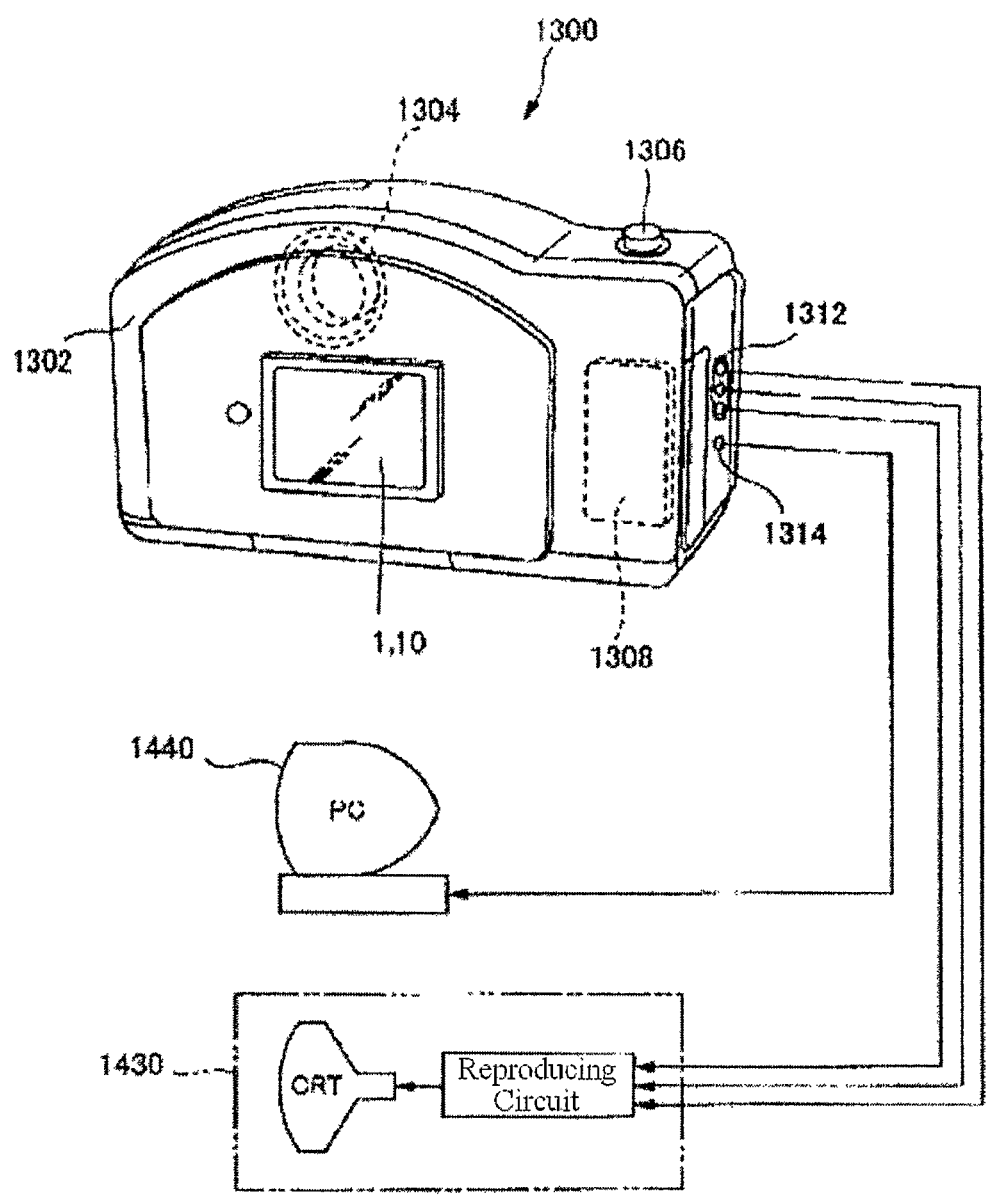
FIG. 7 is a perspective view which shows the structure of a digital still camera to which the electronic equipment according to the present invention is applied.

FIG. 7 is a perspective view which shows the structure of a digital still camera to which the electronic equipment according to the present invention is applied. In this drawing, interfacing to external devices is simply illustrated.

In a conventional camera, a silver salt film is exposed to the optical image of an object. On the other hand, in the digital still camera 1300, an image pickup device such as a CCD (Charge Coupled Device) generates an image pickup signal (or an image signal) by photoelectric conversion of the optical image of an object.

In the rear surface of a case (or a body) 1302 of the digital still camera 1300, there is provided a display which provides an image based on the image pickup signal generated by the CCD. That is, the display functions as a finder which displays the object as an electronic image.

In this digital still camera 1300, for example, the display includes the organic EL device (which is alight emitting device) 1 and the organic TFT (which is a switching element) 10 described above.

In the inside of the case, there is provided a circuit board 1308. The circuit board 1308 has a memory capable of storing an image pickup signal.

In the front surface of the case 1302 (in FIG. 7, the front surface of the case 1302 is on the back side), there is provided a light receiving unit 1304 including an optical lens (an image pickup optical system) and a CCD.

When a photographer presses a shutter button 1306 after checking an object image on the display, an image pickup signal generated by the CCD at that time is transferred to the memory in the circuit board 1308 and then stored therein.

Further, in the side surface of the case 1302 of the digital still camera 1300, there are provided a video signal output terminal 1312 and an input-output terminal for data communication 1314. As shown in FIG. 7, when necessary, a television monitor 1430 and a personal computer 1440 are connected to the video signal output terminal 1312 and the input-output terminal for data communication 1314, respectively. In this case, an image pickup signal stored in the memory of the circuit board 1308 is outputted to the television monitor 1430 or the personal computer 1440 by carrying out predetermined operation.

The electronic equipment according to the present invention can be applied not only to the personal computer (which is a personal mobile computer) shown in FIG. 5, the mobile phone shown in FIG. 6, and the digital still camera shown in FIG. 7 but also to a television set, a video camera, a view-finer or monitor type of video tape recorder, a laptop-type personal computer, a car navigation device, a pager, an electronic notepad (which may have communication facility), an electronic dictionary, an electronic calculator, a computerized game machine, a word processor, a workstation, a videophone, a security television monitor, an electronic binocular, a POS terminal, an apparatus provided with a touch panel (e.g., a cash dispenser located on a financial institute, a ticket vending machine), medical equipment (e.g., an electronic thermometer, a sphygmomanometer, a blood glucose meter, an electrocardiograph monitor, ultrasonic diagnostic equipment, an endoscope monitor), a fish detector, various measuring instruments, gages (e.g., gages for vehicles, aircraft, and boats and ships), a flight simulator, various monitors, and a projection display such as a projector.

The composition for conductive materials, the conductive material, the conductive layer, the electronic device, and the electronic equipment according to the present invention have been described based on the embodiments shown in the drawings, but the present invention is not limited thereto.

For example, in the case where the electronic device according to the present invention has a hole transport layer as a conductive layer, such an electronic device can be used for, for example, a solar cell that is an example of light receiving devices (or photoelectric transducers) as well as the organic EL device as described above that is an example of display devices (or light emitting devices).

Further, in the case where the electronic device according to the present invention has an organic semiconductor layer as a conductive layer, such an electronic device can be used for, for example, a semiconductor device as well as the organic TFT as described above that is an example of switching elements.

Furthermore, the conductive layer according to the present invention can be used as, for example, wiring or an electrode as well as the hole transport layer as described above. In this case, a resultant electronic device according to the present invention can be used for a wiring board and the like.

EXAMPLES

Next, the present invention will be described with reference to Examples.

1. Synthesis of Compound

First, compounds (AI) to (SII) described below were prepared.

<Compound (AI)>

6-(p-aminophenyl)hexanol was treated with benzyl bromide and sodium hydroxide in anhydrous dimethylformamide to transform hydroxyl group into benzyl ether group and then it was protected.

Then, 1 mol of thus obtained compound was dissolved in 150 mL of acetic acid, and acetic anhydride was dropped therein at room temperature and then they were stirred. After the completion of the reaction, solid matter precipitated was filtered and then dried after washing with water to obtain a dry substance (benzyl ether derivative).

Next, 6-(p-bromophenyl)hexanol was subjected to the same treatment as that for 6-(p-aminophenyl)hexanol to transform hydroxyl group into benzyl ether group and then it was protected to obtain a dry substance (benzyl ether derivative).

Next, 0.37 mol of benzyl ether derivative obtained from 6-(p-aminophenylhexanol, 0.66 mol of benzyl ether derivative obtained from 6-(p-bromophenyl)hexanol, 1.1 mol of potassium carbonate, copper powder, and iodine were mixed and heated at 200° C. After the mixture was allowed to cool, 130 mL of isoamyl alcohol, 50 mL of pure water, and 0.73 mol of potassium hydroxide were added to the mixture, and then they were stirred and dried.

Further, 130 mmol of the thus obtained compound, 62 mmol of 4,4'-diiodobiphenyl, 1.3 mmol of palladium acetate, 5.2 mmol of t-butylphosphine, 260 mmol of sodium t-butoxide, and 700 mL of xylene were mixed, and then they were stirred at 120° C. Thereafter, the mixture was allowed to cool for crystallization.

The thus obtained compound was reduced by hydrogen gas under Pd—C catalyst so that transformation was made from the benzyl ether group to the hydroxyl group to come off the protection.

Next, 100 mmol of the compound and 400 mmol of acryloyl chloride were added to a xylene solution, and then they were stirred with heating. Thereafter, the mixture was allowed to cool for crystallization to obtain a compound.

Then, the thus obtained compound was confirmed to be the following compound (AI) by means of a mass spectrum (MS) method, a $^1$H-nuclear magnetic resonance ($^1$H-NMR) spectrum method, a $^{13}$C-nuclear magnetic resonance ($^{13}$C-NMR) spectrum method, and a Fourier transform infrared absorption (FT-IR) spectrum method.

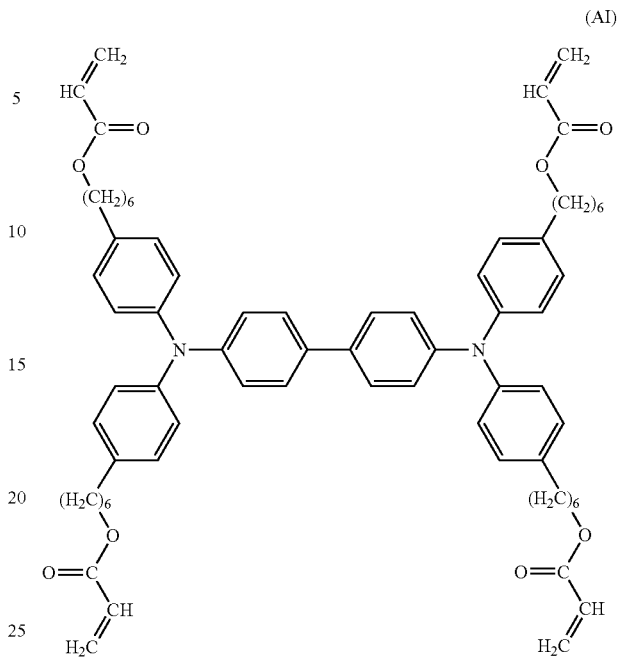

(AI)

<Compound (BI)>

A compound (BI) was obtained in the same manner as the compound (AI) except that 4,4'-diiodobiphenyl was changed to 4,4'-diiodo-2,2'-dimethylbiphenyl.

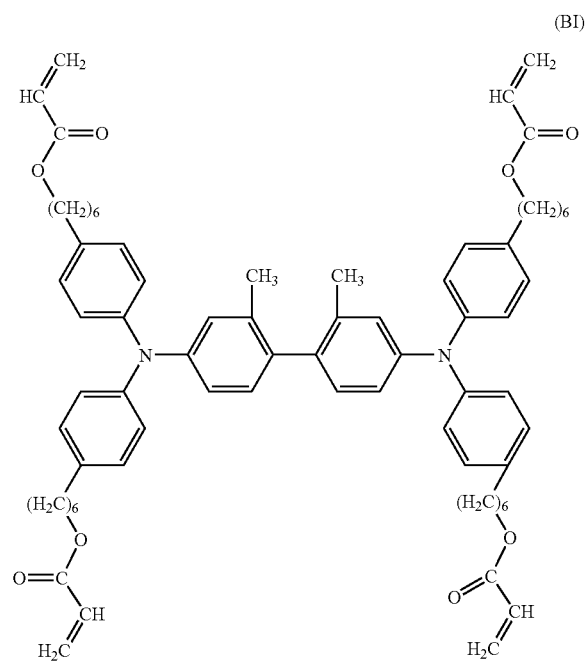

(BI)

<Compound (CI)>

A compound (CI) was obtained in the same manner as the compound (AI) except that 6-(p-aminophenyl)hexanol was changed to 2-(p-aminophenyl)ethanol and 6-(p-bromophenyl)hexanol was changed to 2-(p-bromophenyl)ethanol, respectively.

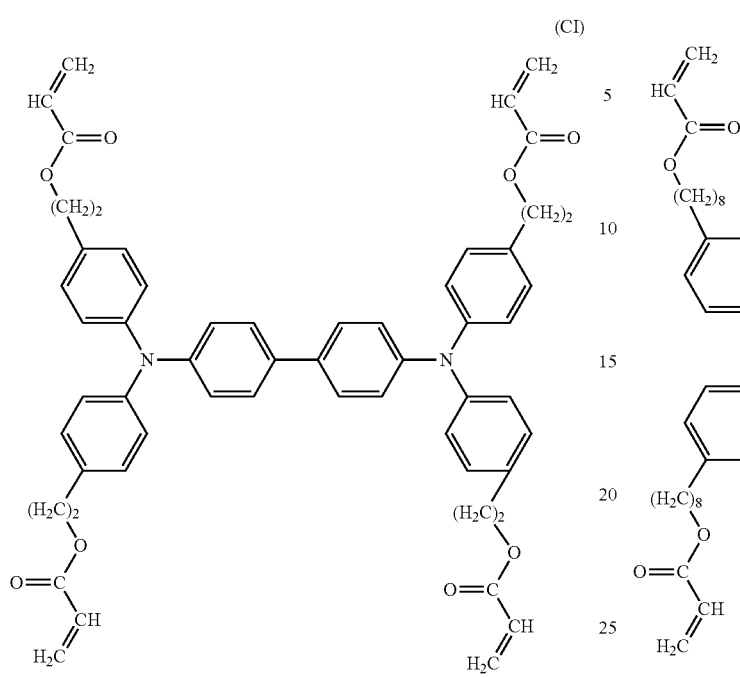

(CI)

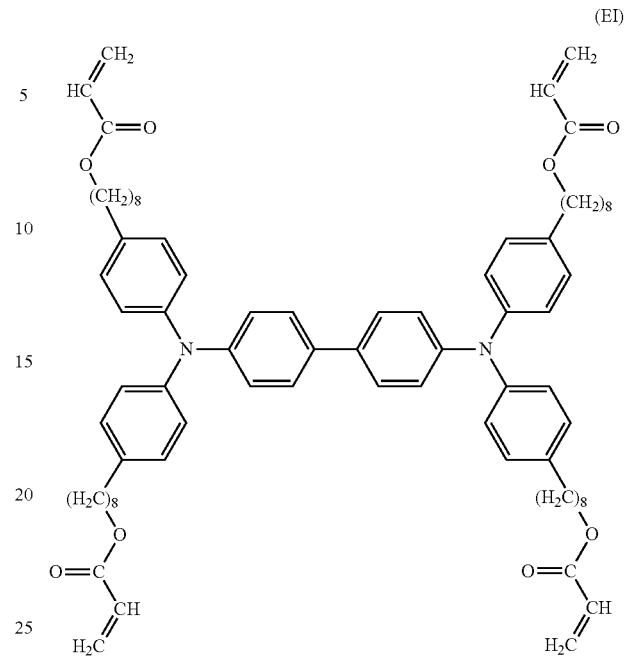

(EI)

<Compound (DI)>

A compound (DI) was obtained in the same manner as the compound (CI) except that 2-(p-aminophenyl)ethanol was changed to 2-(2',6'-dimethyl-4'-aminophenyl)ethanol.

<Compound (FI)>

A compound (FI) was obtained in the same manner as the compound (AI) except that 6-(p-aminophenyl)hexanol was changed to 8-(p-aminophenyl)octanol.

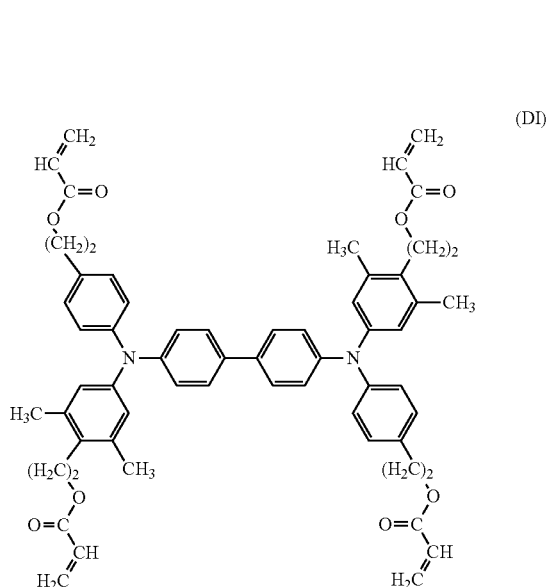

(DI)

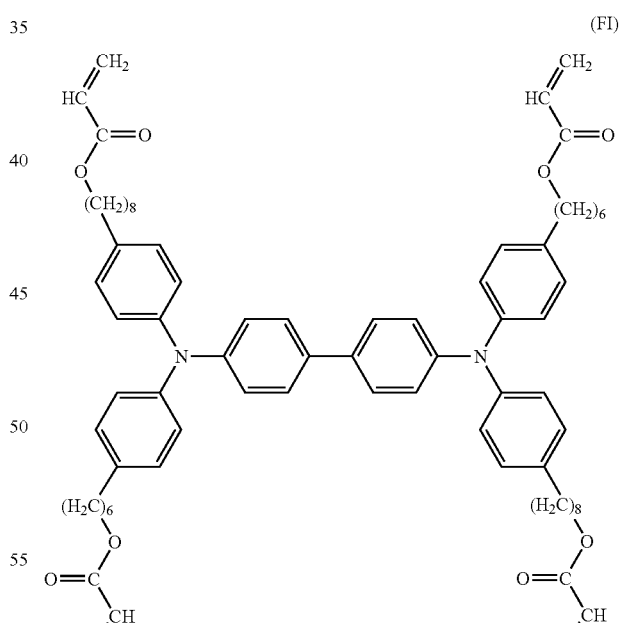

(FI)

<Compound (EI)>

A compound (EI) was obtained in the same manner as the compound (AI) except that 6-(p-aminophenyl)hexanol was changed to 8-(p-aminophenyl)octanol and 6-(p-bromophenyl)hexanol was changed to 8-(p-bromophenyl)octanol, respectively.

<Compound (GI)>

A compound (GI) was obtained in the same manner as the compound (AI) except that 6-(p-aminophenyl)hexanol was changed to (p-aminophenyl)methanol and 6-(p-bromophenyl)hexanol was changed to (p-bromophenyl)methanol, respectively.

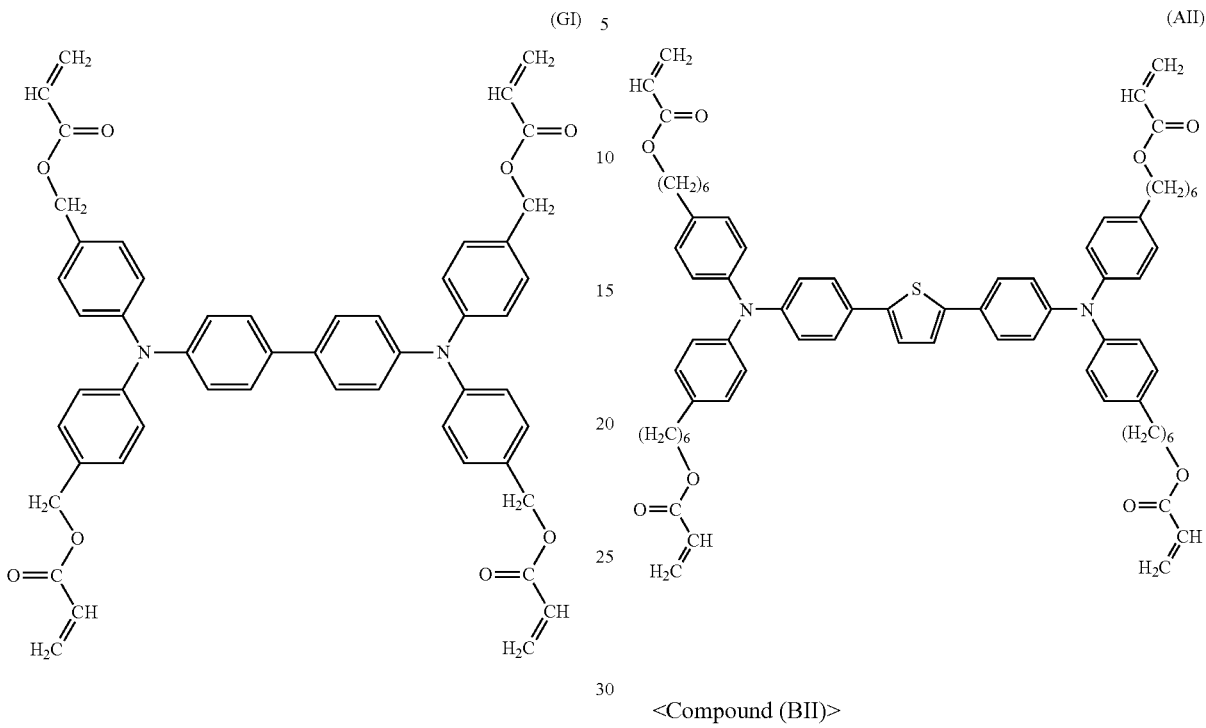

<Compound (HI).

As for the following compound (HI), N,N,N',N'-tetrakis(4-methylphenyl)-benzidine ("OSA 6140" provided by TOSCO CO., LTD.) was prepared.

<Compound (BII)>

A compound (BII) was obtained in the same manner as the compound (AII) except that 2,5-bis(4-iodophenyl)-thiophene was changed to 2,5-bis(2-methyl-4-iodophenyl)-thiophene.

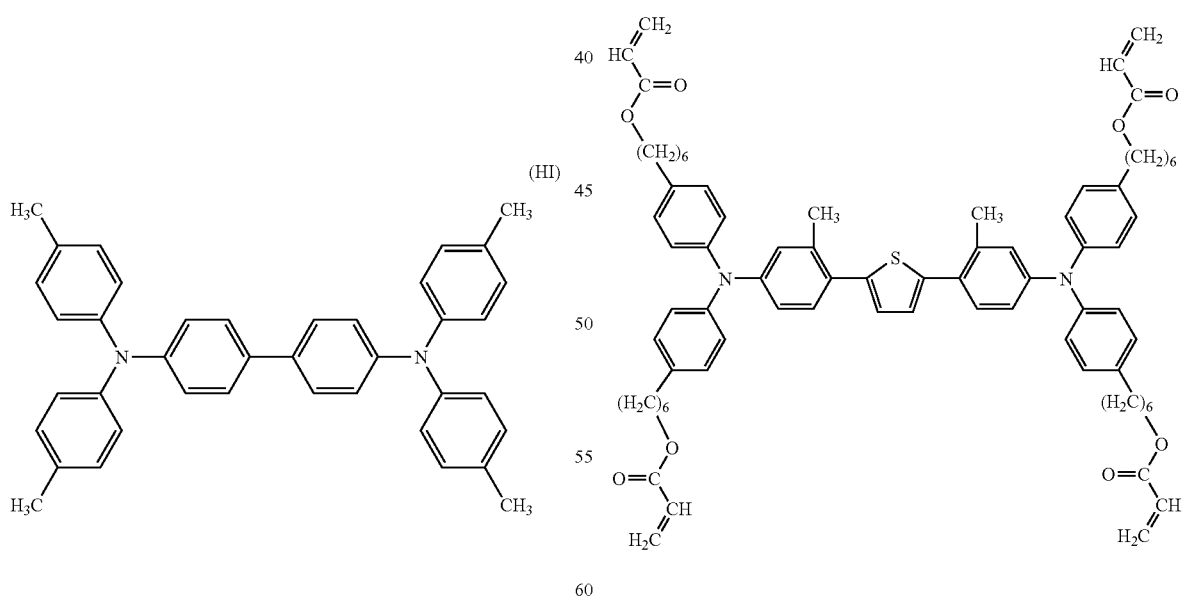

<Compound (AII)>

A compound (AII) was obtained in the same manner as the compound (AI) except that 4,4'-diiodobiphenyl was changed to 2,5-bis(4-iodophenyl)-thiophene.

<Compound (CII)>

A compound (CII) was obtained in the same manner as the compound (AII) except that 6-(p-aminophenyl)hexanol was changed to 2-(p-aminophenyl)ethanol and 6-(p-bromophenyl)hexanol was changed to 2-(p-bromophenyl)ethanol, respectively.

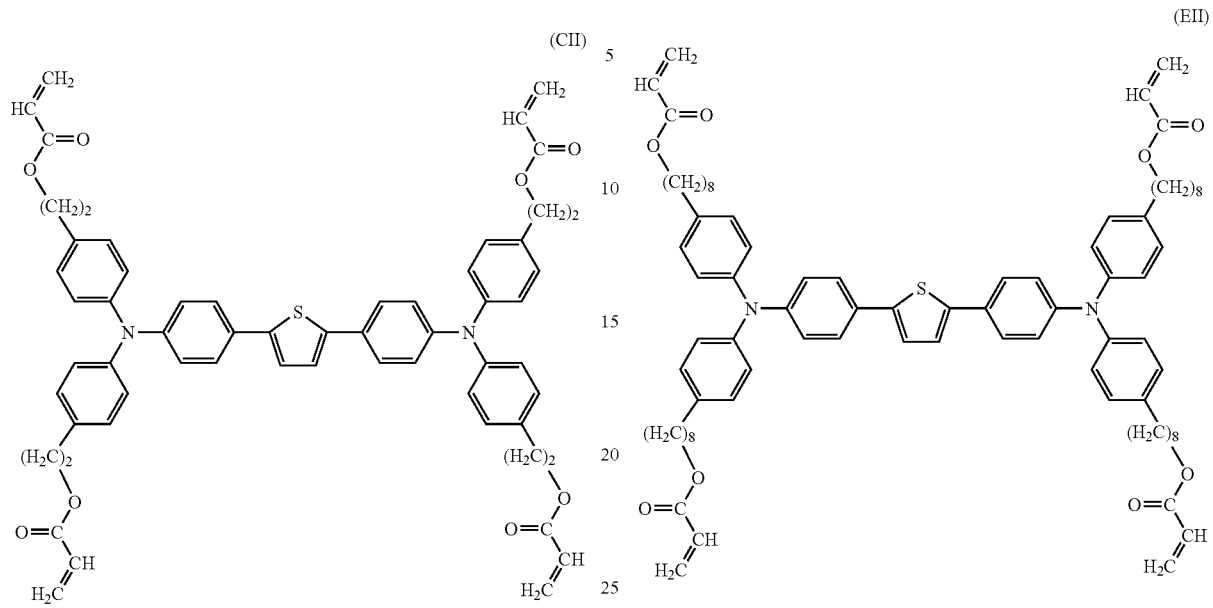

<Compound (DII)>

A compound (DII) was obtained in the same manner as the compound (CII) except that 2-(p-aminophenyl)ethanol was changed to 2-(2',6'-dimethyl-4'-aminophenyl)ethanol.

<Compound (EII)>

A compound (EII) was obtained in the same manner as the compound (AII) except that 6-(p-aminophenyl)hexanol was changed to 8-(p-aminophenyl)octanol and 6-(p-bromophenyl)hexanol was changed to 8-(p-bromophenyl)octanol, respectively.

<Compound (FII)>

A compound (FII) was obtained in the same manner as the compound (AII) except that 6-(p-aminophenyl)hexanol was changed to 8-(p-aminophenyl)octanol.

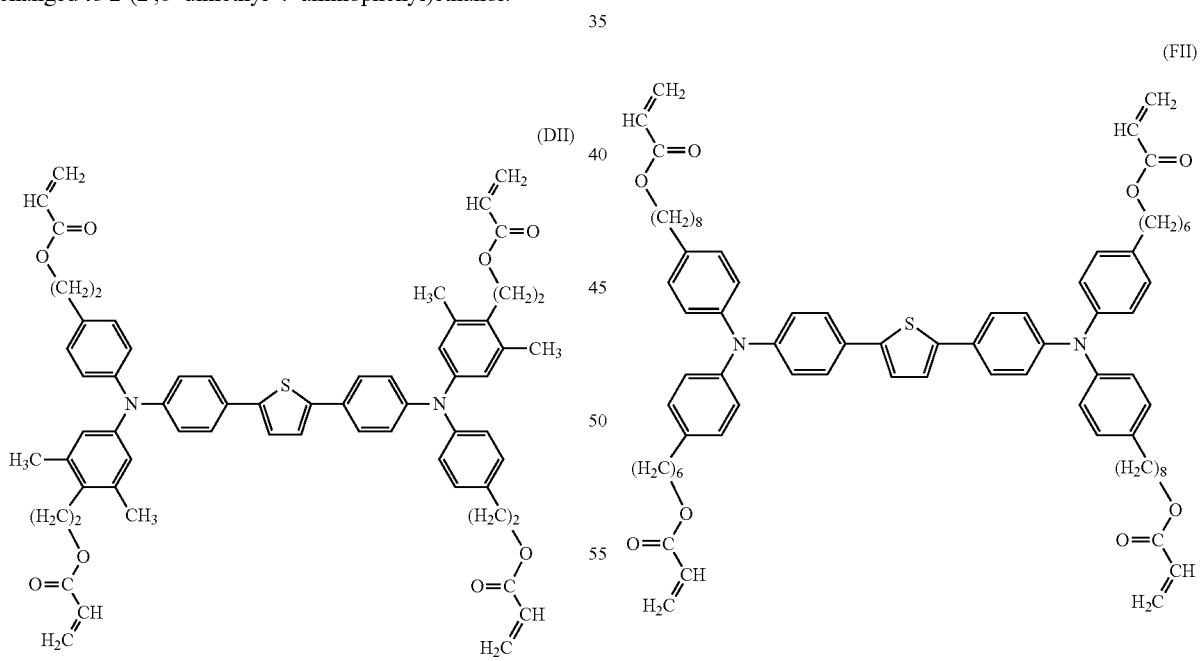

<Compound (GII)>

A compound (GII) was obtained in the same manner as the compound (AII) except that 6-(p-aminophenyl)hexanol was changed to 1-(p-aminophenyl)methanol and 6-(p-bromophenyl)hexanol was changed to 1-(p-bromophenyl)methanol, respectively.

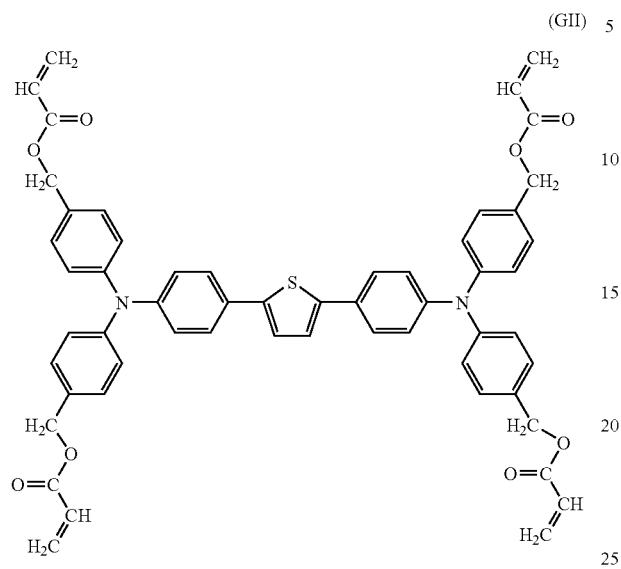
(GII)
<Compound (HII)>
A compound (HII) was obtained in the same manner as the compound (AII) except that 2,5-bis(4-iodophenyl)-thiophene was changed to 5,5''-bis(4-iodophenyl)-2,2':5',2''-terthiophene.
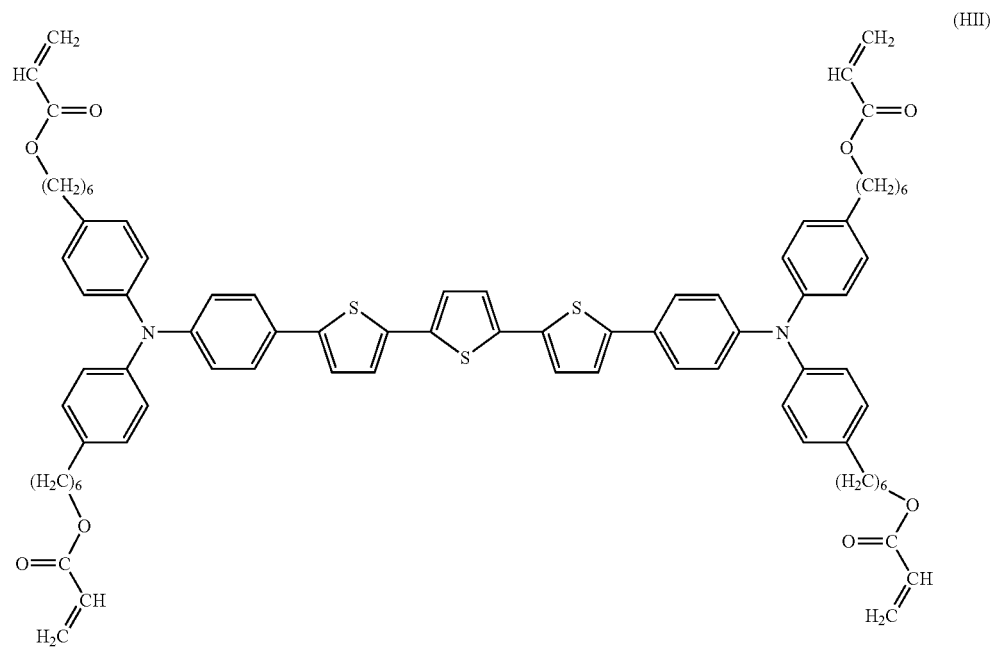
(HII)

<Compound (III)>

A compound (III) was obtained in the same manner as the compound (AII) except that 2,5-bis(4-iodophenyl)-thiophene was changed to 3,5-diiodo-1,2,4-triazole.

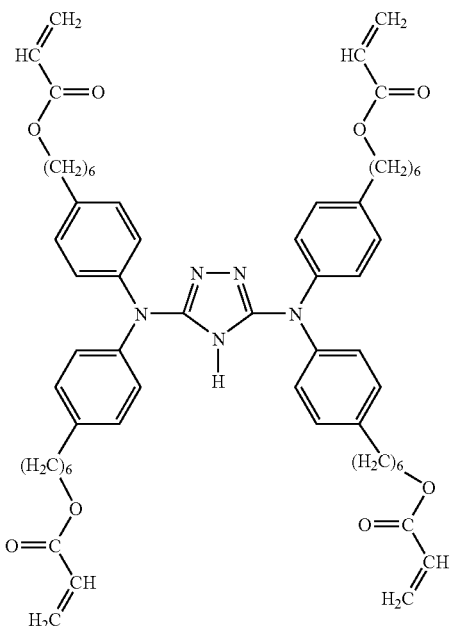

<Compound (JII)>

A compound (JII) was obtained in the same manner as the compound (AII) except that 2,5-bis(4-iodophenyl)-thiophene was changed to 2,5-bis(4-iodophenyl)-1,3,4-oxadiazole.

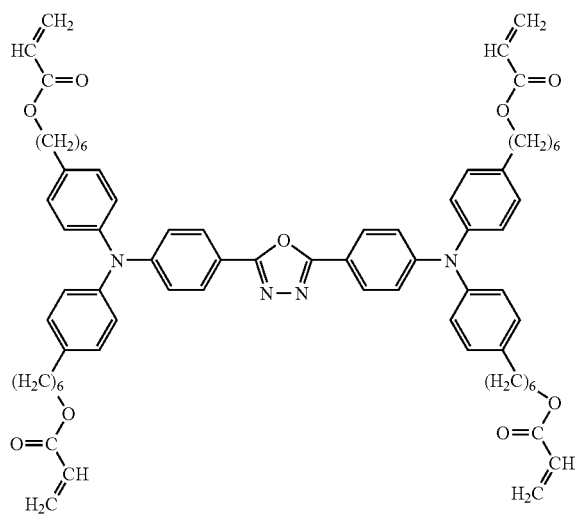

<Compound (KII)>

A compound (KII) was obtained in the same manner as the compound (AII) except that 2,5-bis(4-iodophenyl)-thiophene was changed to 3,3'-diiodo-1,1'-biisobenzothiophene.

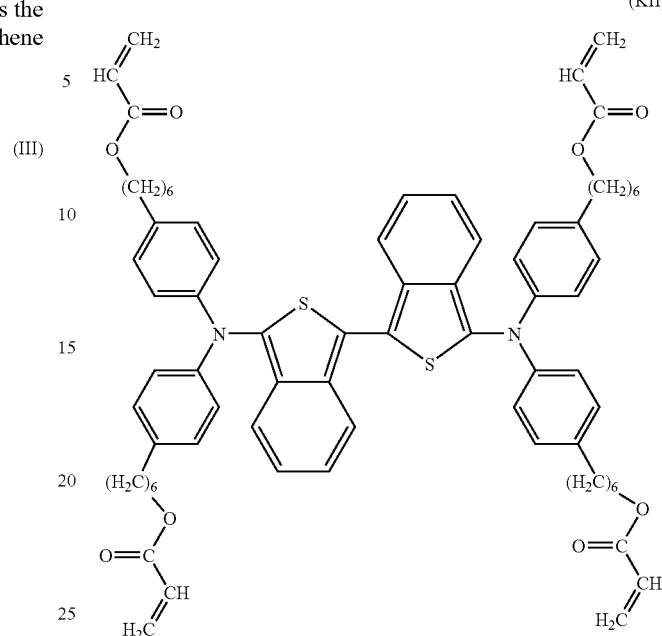

<Compound (LII)>

A compound (LII) was obtained in the same manner as the compound (KII) except that 6-(p-aminophenyl)hexanol was changed to 2-(p-aminophenyl)ethanol and 6-(p-bromophenyl)hexanol was changed to 2-(p-bromophenyl)ethanol, respectively.

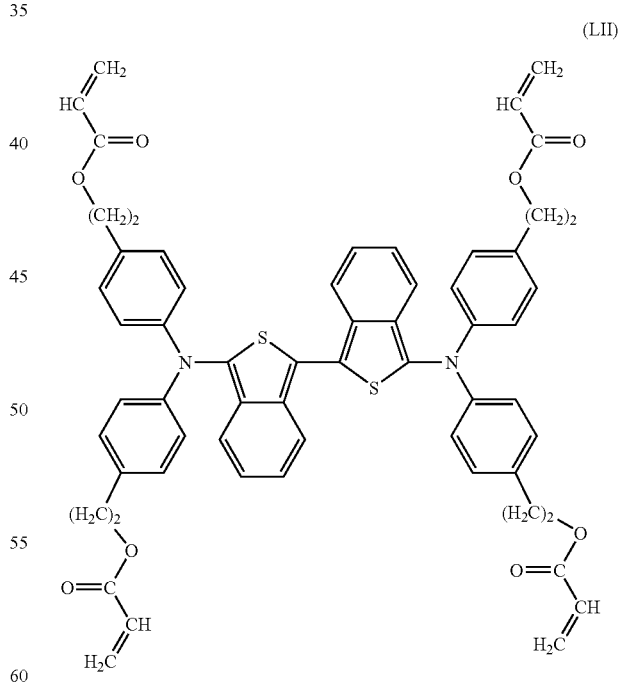

<Compound (MII)>

A compound (MII) was obtained in the same manner as the compound (KII) except that 6-(p-aminophenyl)hexanol was changed to 8-(p-aminophenyl)octanol and 6-(p-bromophenyl)hexanol was changed to 8-(p-bromophenyl)octanol, respectively.

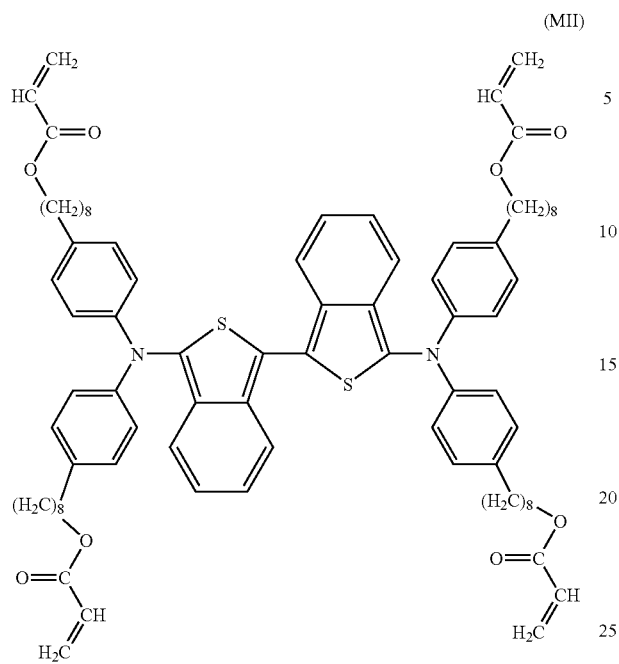

<Compound (NII)>

A compound (NII) was obtained in the same manner as the compound (KII) except that 6-(p-aminophenyl)hexanol was changed to 8-(p-aminophenyl)octanol.

<Compound (OII)>

A compound (OII) was obtained in the same manner as the compound (KII) except that 6-(p-aminophenyl)hexanol was changed to 1-(p-aminophenyl)methanol and 6-(p-bromophenyl)hexanol was changed to 1-(p-bromophenyl)methanol, respectively.

<Compound (PII)>

A compound (PII) was obtained in the same manner as the compound (AII) except that 2,5-bis(4-iodophenyl)-thiophene was changed to 5,5'-diiodo-2,2'-bi(3,4-dioxyethyleneselenophene).

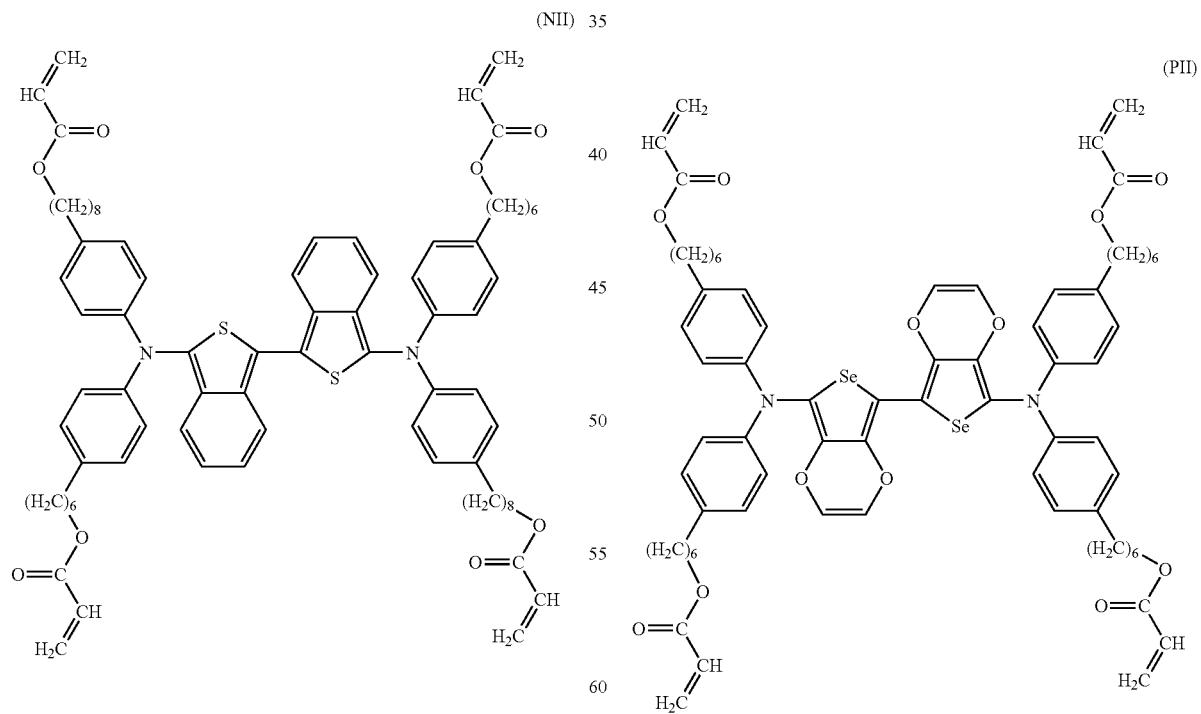

<QII)

A compound (QII) was obtained in the same manner as the compound (AII) except that 2,5-bis(4-iodophenyl)-thiophene was changed to 5,5"-diiodo-2,2':5',2"-ter-selenophene.

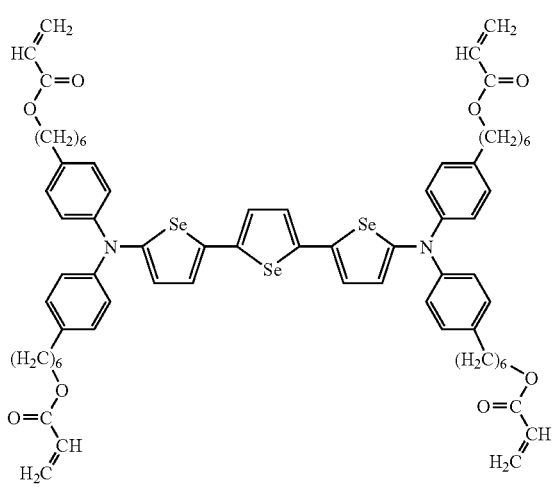

(QII)

<Compound (RII)>

A compound (RII) was obtained in the same manner as the compound (AII) except that 2,5-bis(4-iodophenyl)-thiophene was changed to 5,5"-diiodo-3,3':5',3"-ter-(4-phenyl-1,2,4-triazole).

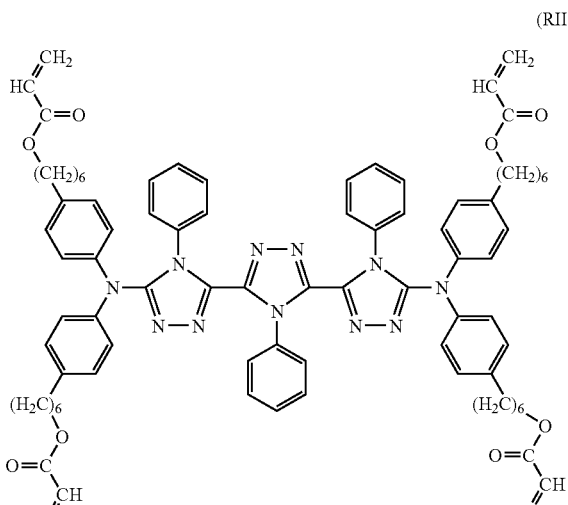

(RII)

<Compound (SII)>

1 mol of 1-amino-4-methylbenzene was dissolved in 150 mL of acetic acid, and acetic anhydride was dropped therein at room temperature, and then they were stirred. After the completion of the reaction, solid matter precipitated was filtered, and was then dried after washing with water.

Next, 0.37 mol of the thus obtained substance, 0.66 mol of 1-bromo-4-methylbenzene, 1.1 mol of potassium carbonate, copper powder, and iodine were mixed and heated at 200° C. After the mixture was allowed to cool, 130 mL of isoamyl alcohol, 50 mL of pure water, and 0.73 mol of potassium hydroxide were added to the mixture, and then they were stirred and dried.

Further, 130 mmol of the thus obtained compound, 62 mmol of 2,5-bis(4-iodophenyl)-thiophene, 1.3 mmol of palladium acetate, 5.2 mmol of t-butylphosphine, 260 mmol of sodium t-butoxide, and 700 mL of xylene were mixed, and then they were stirred at 120° C.

Thereafter, the mixture was allowed to cool for crystallization to obtain a compound.

Then, the obtained compound was found to be the following compound (SII) by means of a mass spectrum (MS) method, a $^1$H-nuclear magnetic resonance ($^1$H-NMR) spectrum method, a $^{13}$C-nuclear magnetic resonance ($^{13}$C-NMR) spectrum method, and a Fourier transform infrared absorption (FT-IR) spectrum method.

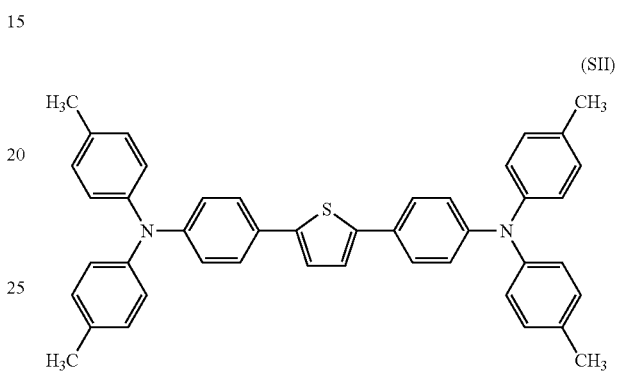

(SII)

<Compound (TII)>

Poly(3,4-ethylenedioxythiophene/styrenesulfonic acid) ("BAYTRON P CH800", Bayer) was prepared as the following compound (TII).

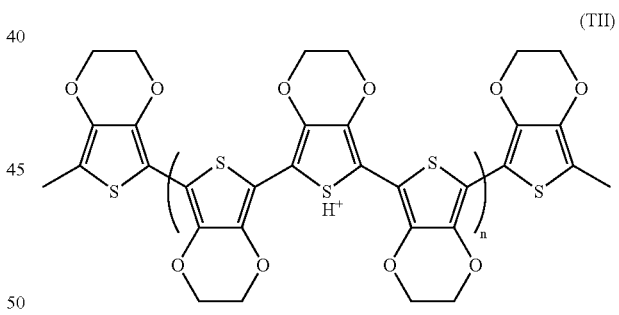

(TII)

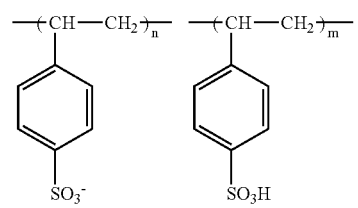

<Compound (UII)>

A compound (UII) was obtained in the same manner as the compound (SII) except that 2,5-bis(4-iodophenyl)-thiophene was changed to 3,5-diiodo-1,2,4-triazole.

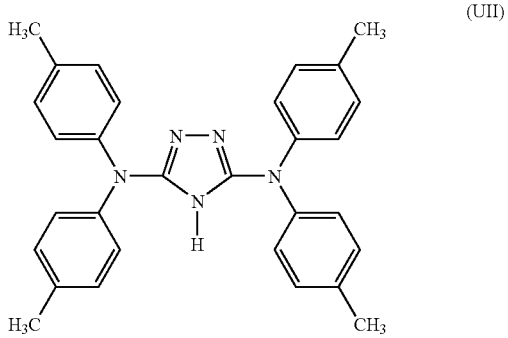

(UII)

2. Manufacture of Organic EL Device

Five organic EL devices were manufactured in each of the following Examples and Comparative Examples.

Example 1A

Preparation of Hole Transport Material

The compound (AI) was used as an arylamine derivative, and the compound (AI) and a radical polymerization initiator ("Irgacure 651" produced by Nagase & Co., Ltd.) in a weight ratio of 95:5 were mixed with dicloethane to obtain a hole transport material (that is, a composition for conductive materials).

<Manufacture of Organic EL Device>

1A First, an ITO electrode (that is, an anode) was formed on a transparent glass substrate having an average thickness of 0.5 mm by vacuum evaporation so as to have an average thickness of 100 nm.

2A Next, the hole transport material was applied onto the ITO electrode by a spin coating method, and was then dried. Then, the hole transport material was irradiated with ultraviolet rays having a wavelength of 185 nm from a mercury lamp ("UM-452", USHIO Inc.) through a filter at an intensity of irradiation of 3 mW/cm$^2$ for 400 seconds in the atmosphere to polymerize the compound (AI), so that a hole transport layer having an average thickness of 50 nm was formed.

3A Next, a 1.7 wt % xylene solution of poly(9,9-dioctyl-2,7-divinylenefluorenyl-alt-co(anthracene-9,10-diyl) (Weight average molecular weight: 200,000) was applied onto the hole transport layer by a spin coating method, and was then dried to form a light emitting layer having an average thickness of 50 nm.

4A Next, an electron transport layer having an average thickness of 20 nm was formed on the light emitting layer by a vacuum evaporation of 3,4,5-triphenyl-1,2,4-triazole.

5A Next, an AlLi electrode (that is, a cathode) was formed on the electron transport layer by vacuum evaporation so as to have an average thickness of 300 nm.

6A Next, a protection cover made of polycarbonate was provided so as to cover these layers described above, and was then secured and sealed with an ultraviolet curable resin to obtain an organic EL device.

Examples 2A to 6A

In each of Examples 2A to 6A, organic EL devices were manufactured after a hole transport material was prepared in the same manner as in Example 1A except that as for the arylamine derivatives for use in the hole transport material were changed to those shown in Table 1.

Comparative Example 1A

Preparation of Hole Transport Material

A hole transport material was obtained by dissolving the compound (H1).

<Manufacture of Organic EL Device>

Organic EL devices were manufactured in the same manner as in Example 1A except that the hole transport material prepared in the step 2A was used and the irradiation of ultraviolet rays from the mercury lamp was omitted.

Comparative Example 2A

Preparation of Hole Transport Material

The compound (TII) was dispersed in water to prepare a 2.0 wt % water dispersion of the compound (TII) as a hole transport material.

In this regard, it is to be noted that the weight ratio of 3,4-ethylenedioxythiophene to styrenesulfonic acid in the compound (TII) was 1:20.

<Manufacture of Organic EL Device>

Organic EL devices were manufactured in the same manner as in Comparative Example 1A except that the hole transport material was changed to the hole transport material prepared in this Comparative Example 2A.

Comparative Example 3A

Preparation of Hole Transport Material

The compound (HI) was used as an arylamine derivative, a polyester acrylate based cross-linking agent ("ARONIX M-8030" produced by TOAGOSEI CO., LTD.) was used as a photocrosslinking agent, and the compound (HI), the polyester acrylate based cross-linking agent and a radical polymerization initiator ("Irgacure 651" produced by Nagase & Co., Ltd.) in a weight ratio of 30:65:5 were mixed with dicloethane to obtain a hole transport material.

<Manufacture of Organic EL Device>

Organic EL devices were manufactured in the same manner as in Comparative Example 1A except that the hole transport material was changed to the hole transport material prepared in this Comparative Example 3A.

Comparative Example 4A

Organic EL devices were manufactured after a hole transport material was prepared in the same manner as in Example 1A except that the compound (GI) was used as an arylamine derivative.

Example 1B

Preparation of Hole Transport Material

The compound (AI) was used as an arylamine derivative, a polyester acrylate based cross-linking agent represented by the above-mentioned general formula (B1) (where $n^3$ is 10 to 15, and the two $A^1$s are hydrogen atoms) (hereinafter, this cross-linking agent will be referred to as "cross-linking agent A1") was used as a polyester(meth)acrylate-based cross-linking agent, and a radical polymerization initiator ("Irgacure 651" produced by Nagase & Co., Ltd.) was used as a photopolymerization initiator, and then they were dissolved with dicloethane to obtain a hole transport material (that is, a composition for conductive materials).

In this regard, it is to be noted that the mixing ratio of the compound (AI) and the cross-linking agent A1 was 17:2 in a mole ratio, and the weight ratio of the total weight of the compound (AI) and the cross-linking agent A1 with respect to the radical polymerization initiator was 19:1.

<Manufacture of Organic EL Device>

1B First, an ITO electrode (that is, an anode) was formed on a transparent glass substrate having an average thickness of 100 nm in the same manner as the step 1A described above.

2B Next, the prepared hole transport material was applied onto the ITO electrode by a spin coating method, and was then dried.

Then, the hole transport material was irradiated with ultraviolet rays having a wavelength of 185 nm from a mercury lamp ("UM-452", USHIO Inc.) through a filter at an intensity of irradiation of 2 mW/cm$^2$ for 300 seconds in the atmosphere to polymerize the compound (AI) and the cross-linking agent A1, so that a hole transport layer having an average thickness of 50 nm was formed.

3B Next, a light emitting layer having an average thickness of 50 nm was formed on the hole transport layer in the same manner as the step 3A described above.

4B Next, an electron transport layer having an average thickness of 20 nm was formed on the light emitting layer in the same manner as the step 4A described above.

5B Next, an AlLi electrode (that is, a cathode) having an average thickness of 300 nm was formed on the electron transport layer in the same manner as the step 5A described above.

6B Next, a protection cover made of polycarbonate was provided so as to cover these layers described above, and was then secured and sealed in the same manner as the step 6A described above to obtain an organic EL device.

Examples 2B to 18B

In each of Examples 2B to 18B, organic EL devices were manufactured after a hole transport material was prepared in the same manner as in Example 1B except that the arylamine derivatives for use in the hole transport material and the mixing ratio (mole ratio) of the arylamine derivatives and the cross-linking agent were changed to those shown in Table 2.

Examples 1B' to 6B'

Organic EL devices were manufactured after a hole transport material was prepared in the same manner as in Example 1B except that the addition of the cross-liking agent A1 to the hole transport material was omitted and the arylamine derivatives for use in the hole transport material were changed to those shown in Table 2.

Comparative Example 1B

Organic EL devices were manufactured in the same manner as in Comparative Example 1A.

Comparative Example 2B

Organic EL devices were manufactured in the same manner as in Comparative Example 2A.

Comparative Example 3B

Preparation of Hole Transport Material

The compound (AI) and a polycarbonate resin ("PANLITE-1250" produced by TEIJIN CHEMICALS LTD.) in a weight ratio of 3:7 were mixed with dicloethane to obtain a hole transport material.

<Manufacture of Organic EL Device>

Organic EL devices were manufactured in the same manner as in Comparative Example 1A except that the hole transport material was changed to the hole transport material prepared in this Comparative Example 3B.

Comparative Example 4B

Organic EL devices were manufactured after a hole transport material was prepared in the same manner as in Example 1B except that the compound (HI) was used as an arylamine derivative.

Comparative Example 5B

Organic EL devices were manufactured after a hole transport material was prepared in the same manner as in Example 1B except that the addition of the cross-liking agent A1 to the hole transport material was omitted and that the compound (GI) was used as an arylamine derivative.

Comparative Examples 6B to 8B

In each of Comparative Examples 6B to 8B, organic EL devices were manufactured after a hole transport material was prepared in the same manner as in Example 1B except that the compound (GI) was used as an arylamine derivative for use in the hole transport material and the mixing ratio (mole ratio) of the compound (GI) and the cross-linking agent A1 were changed to those shown in Table 2.

Example 1C

Organic EL devices were manufactured after a hole transport material was prepared in the same manner as in Example 1B except that instead of the cross-linking agent A1 an epoxy acrylate-based cross-linking agent represented by the above-mentioned general formula (B4) (where $n^6$ is 1, and the two $A^1$s are hydrogen atoms) (hereinafter, this cross-linking agent will be referred to as "cross-linking agent A2") was used.

Examples 2C and 3C

In each of Examples 2C and 3C, organic EL devices were manufactured after a hole transport material was prepared in the same manner as in Example 1C except that the mixing ratio (mole ratio) of the arylamine derivatives and the cross-linking agent A2 were changed to those shown in Table 3, respectively.

Example 4C

Organic EL devices were manufactured after a hole transport material was prepared in the same manner as in Example 1C except that as for an epoxy acrylate-based cross-linking agent represented by the general formula (B4) which is to be added to the hole transport material, a cross-linking agent B2

(where $n^6$ is 5, and the two $A^1$s are hydrogen atoms) was used instead of the cross-linking agent A2.

Example 5C

Organic EL devices were manufactured after a hole transport material was prepared in the same manner as in Example 1C except that as for an epoxy acrylate-based cross-linking agent represented by the general formula (B4) which is to be added to the hole transport material, a cross-linking agent C2 (where $n^6$ is 12, and the two $A^1$s are hydrogen atoms) was used instead of the cross-linking agent A2.

Examples 6C to 20C

In each of Examples 6C to 20C, organic EL devices were manufactured after a hole transport material was prepared in the same manner as in Example 1C except that the arylamine derivatives for use in the hole transport material and the mixing ratio (mole ratio) of the arylamine derivatives and the cross-linking agent A2 were changed to those shown in Table 3, respectively.

Comparative Example 1C

Organic EL devices were manufactured in the same manner as in Comparative Example 1A.

Comparative Example 2C

Organic EL devices were manufactured in the same manner as in Comparative Example 2A.

Comparative Example 3C

Organic EL devices were manufactured in the same manner as in Comparative Example 3B.

Comparative Examples 4C to 7C

In each of Comparative Examples 4C to 7C, organic EL devices were manufactured after a hole transport material was prepared in the same manner as in Example 1C except that the arylamine derivatives for use in the hole transport material and the mixing ratio (mole ratio) of the arylamine derivatives and the cross-linking agent A2 were changed to those shown in Table 3.

Example 1D

Organic EL devices were manufactured after a hole transport material was prepared in the same manner as in Example 1B except that instead of the cross-linking agent A1 an urethane acrylate-based cross-linking agent represented by the above-mentioned general formula (B10) (where $n^{10}$ is 20 to 30, and the two $A^1$s are hydrogen atoms) (hereinafter, this cross-linking agent will be referred to as "cross-linking agent A3") was used.

Examples 2D and 3D

In each of Examples 2D and 3D, organic EL devices were manufactured after a hole transport material was prepared in the same manner as in Example 1D except that the mixing ratio (mole ratio) of the arylamine derivatives and the cross-linking agent were changed to those shown in Table 4, respectively.

Example 4D

Organic EL devices were manufactured after a hole transport material was prepared in the same manner as in Example 1D except that as for an urethane acrylate-based cross-linking agent represented by the general formula (B10) which is to be added to the hole transport material, a cross-linking agent B3 (where $n^{10}$ is 60 to 70, and the two $A^1$s are hydrogen atoms) was used instead of the cross-linking agent A3.

Example 5D

Organic EL devices were manufactured after a hole transport material was prepared in the same manner as in Example 1D except that as for an epoxy acrylate-based cross-linking agent represented by the general formula (B10) which is to be added to the hole transport material, a cross-linking agent C3 (where $n^{10}$ is 120 to 140, and the two $A^1$s are hydrogen atoms) was used instead of the cross-linking agent A3.

Examples 6D to 20D

In each of Examples 6D to 20D, organic EL devices were manufactured after a hole transport material was prepared in the same manner as in Example 1D except that the arylamine derivatives for use in the hole transport material and the mixing ratio (mole ratio) of the arylamine derivatives and the cross-linking agent A3 were changed to those shown in Table 4, respectively.

Comparative Example 1D

Organic EL devices were manufactured in the same manner as in Comparative Example 1A.

Comparative Example 2D

Organic EL devices were manufactured in the same manner as in Comparative Example 2A.

Comparative Example 3D

Organic EL devices were manufactured in the same manner as in Comparative Example 3B.

Comparative Examples 4D to 7D

In each of Comparative Examples 4D to 7D, organic EL devices were manufactured after a hole transport material was prepared in the same manner as in Example 1D except that the arylamine derivatives for use in the hole transport material and the mixing ratio (mole ratio) of the arylamine derivatives and the cross-linking agent A3 were changed to those shown in Table 4, respectively.

Example 1E

Preparation of Hole Transport Material

The compound (AII) was used as an arylamine derivative, and the compound (AII) and a radical polymerization initiator ("Irgacure 651" produced by Nagase & Co., Ltd.) in a weight ratio of 95:5 were mixed with dicloethane to obtain a hole transport material (that is, a composition for conductive materials).

<Preparation of Electron Transport Material>

An electron transport material (that is, a composition for conductive materials) was obtained in the same manner as the hole transport material prepared in this example except that the compound (III) was used as an arylamine derivative.

<Manufacture of Organic EL Device>

1C First, an ITO electrode (that is, an anode) was formed on a transparent glass substrate having an average thickness of 100 nm in the same manner as the step 1A described above.

2C Next, the prepared hole transport material was applied onto the ITO electrode by a spin coating method, and was then dried.

Then, the hole transport material was irradiated with ultraviolet rays having a wavelength of 185 nm from a mercury lamp ("UM-452", USHIO Inc.) through a filter at an intensity of irradiation of 3 mW/cm$^2$ for 400 seconds in the atmosphere to polymerize the compound (AII), so that a hole transport layer having an average thickness of 50 nm was formed.

3C Next, a light emitting layer having an average thickness of 50 nm was formed on the hole transport layer in the same manner as the step 3A described above.

4C Next, an electron transport layer having an average thickness of 20 nm was formed on the light emitting layer by the polymerization of the compound (III) in the same manner as the step 2C described above except that the prepared electron transport material was used instead of the hole transport material.

5C Next, an AlLi electrode (that is, a cathode) having an average thickness of 300 nm was formed on the electron transport layer in the same manner as the step 5A described above.

6C Next, a protection cover made of polycarbonate was provided so as to cover these layers described above, and was then secured and sealed in the same manner as the step 6A described above to obtain an organic EL device.

Examples 2E to 14E

In each of Examples 2E to 14E, organic EL devices were manufactured after a hole transport material was prepared in the same manner as in Example 1E except that as for the arylamine derivatives for use in the hole transport material and the electron transport material, those shown in Table 1 are used, respectively.

Comparative Example 1E

Preparation of Hole Transport Material

A hole transport material was obtained by dissolving the compound (SII).

<Manufacture of Organic EL Device>

Organic EL devices were manufactured in the same manner as in Example 1E except that a hole transport layer was formed using the prepared hole transport material but omitting the irradiation of ultraviolet rays at the step 2C and an electron transport layer was formed using the compound (UII) by vacuum evaporation at the step 4C.

Comparative Example 2E

Preparation of Hole Transport Material

The compound (TII) was dispersed in water to prepare a 2.0 wt % water dispersion of the compound (TII) as a hole transport material.

In this regard, it is to be noted that the weight ratio of 3,4-ethylenedioxythiophene to styrenesulfonic acid in the compound (TII) was 1:20.

<Manufacture of Organic EL Device>

Organic EL devices were manufactured in the same manner as in Comparative Example 1E except that the hole transport material was changed to the hole transport material prepared in this Comparative Example.

Comparative Example 3E

Preparation of Hole Transport Material

The compound (SII) was used as an arylamine derivative, and a polyester acrylate based cross-linking agent ("ARONIX M-8030" produced by TOAGOSEI CO., LTD.) was used as a photocrosslinking agent, and the compound (SII), polyester acrylate based cross-linking agent and a radical polymerization initiator ("Irgacure 651" produced by Nagase & Co., Ltd.) in a weight ratio of 30:65:5 were mixed with dicloethane to obtain a hole transport material.

<Manufacture of Organic EL Device>

Organic EL devices were manufactured in the same manner as in Comparative Example 1E except that the hole transport material was changed to the hole transport material prepared in the above-mentioned step 2C and an electron transport layer was formed using the compound (UII) by vacuum evaporation in the step 4C.

Comparative Example 4E

Organic EL devices were manufactured after a hole transport material was prepared in the same manner as in Example 3E except that the compound (GII) was used as an arylamine derivative to be used for the hole transport material.

Example 1F

Preparation of Hole Transport Material

The compound (AII) was used as an arylamine derivative, the compound (AI) was used as an acrylic based cross-linking agent and a radical polymerization initiator ("Irgacure 651" produced by Nagase & Co., Ltd.) was used as a photopolimerization initiator, respectively, and then they were mixed with dicloethane to obtain a hole transport material (that is, a composition for conductive materials).

In this regard, it is to be noted that the mixing ratio of the compound (AII) and the cross-linking agent A1 was 17:2 in a mole ratio, and the weight ratio of the total weight of the compound (AII) and the cross-linking agent A1 with respect to the radical polymerization initiator was 19:1.

<Preparation of Electron Transport Material>

An electron transport material (that is, a composition for conductive materials) was obtained in the same manner as the hole transport material prepared in this example except that the compound (III) was used as an arylamine derivative.

<Manufacture of Organic EL Device>

1D First, an ITO electrode (that is, an anode) having an average thickness of 100 nm was formed on a transparent glass substrate in the same manner as the step 1A described above.

2D Next, the hole transport material was applied onto the ITO electrode by a spin coating method, and was then dried.

Then, the hole transport material was irradiated with ultraviolet rays having a wavelength of 185 nm from a mercury lamp ("UM-452", USHIO Inc.) through a filter at an intensity of irradiation of 2 mW/cm$^2$ for 300 seconds in the atmosphere to polymerize the compound (AII) and the cross-linking agent A1, so that a hole transport layer having an average thickness of 50 nm was formed.

3D Next, a light emitting layer having an average thickness of 50 nm was formed on the hole transport layer in the same manner as the step 3A described above.

4D Next, an electron transport layer having an average thickness of 20 nm was formed on the light emitting layer by polymerizing the compound (III) and the cross-linking agent A1 in the same manner as the step 2D described above except that the prepared electron transport material was used instead of the hole transport material.

5D Next, an AlLi electrode (that is, a cathode) was formed on the electron transport layer so as to have an average thickness of 300 nm in the same manner as the step 5A described above.

6D Next, a protection cover made of polycarbonate was provided so as to cover these layers described above, and was then secured and sealed with an ultraviolet curable resin to obtain an organic EL device.

Examples 2F to 18F

In each of Examples 2F to 18F, organic EL devices were manufactured after a hole transport material was prepared in the same manner as in Example 1F except that the arylamine derivatives for use in the hole transport material and the mole ratio of the arylamine derivatives to the cross-linking agent A1 were changed to those shown in Table 6 (Table A).

Examples 1F' to 14F'

In each of Examples 1F' to 14F', organic EL devices were manufactured after a hole transport material was prepared in the same manner as in Example 1F except that the addition of the cross-liking agent A1 to the hole transport material was omitted and the arylamine derivatives for use in the hole transport material were changed to those shown in Table 6 (Table B).

Comparative Example 1F

Organic EL devices were manufactured in the same manner as in Example 1E.

Comparative Example 2F

Organic EL devices were manufactured in the same manner as in Example 2E.

Comparative Examples 3F and 4F

In each of Comparative Examples 3F and 4F, organic EL devices were manufactured after a hole transport material and an electron transport material were prepared in the same manner as in Example 2F except that the arylamine derivatives for use in the hole transport material and the electron transport material were changed to those shown in Table 6(B).

Example 1G

Organic EL devices were manufactured after a hole transport material and an electron transport material were prepared in the same manner as in Example 1F except that the cross-linking agent A2 was used as an acrylic cross-linking agent instead of the cross-linking agent A1.

Examples 2G and 3G

In each of Examples 2G and 3G, organic EL devices were manufactured after a hole transport material and an electron transport material were prepared in the same manner as in Example 1G except that the mixing ratio (mole ratio) of the arylamine derivatives and the cross-linking agent A2 to be used for the hole transport material and the electron transport material were changed to those shown in Table 7(A), respectively.

Example 4G

Organic EL devices were manufactured after a hole transport material and an electron transport material were prepared in the same manner as in Example 1G except that as for the epoxy acrylate based cross-linking agent represented by the above-mentioned general formula (B4) which is to be added to the hole transport material and the electron transport material, a cross-linking agent B2 (where $n^6$ is 5, and the two $A^1$s are hydrogen atoms) was used instead of the cross-linking agent A2.

Example 5G

Organic EL devices were manufactured after a hole transport material and an electron transport material were prepared in the same manner as in Example 1G except that as for the epoxy acrylate based cross-linking agent represented by the general formula (B4) which is to be added to the hole transport material and the electron transport material, a cross-linking agent C2 (where $n^6$ is 12, and the two $A^1$s are hydrogen atoms) was used instead of the cross-linking agent A2.

Examples 6G to 20G

In each of Examples 6G to 20G, organic EL devices were manufactured after a hole transport material and an electron transfer material were prepared in the same manner as in Example 1G except that the arylamine derivatives for use in the hole transport material and the electron transport material and the mixing ratio (mole ratio) of the arylamine derivatives and the cross-linking agent A2 were changed to those shown in Table 7(A) and Table 7(B), respectively.

Comparative Example 1G

Organic EL devices were manufactured in the same manner as in Comparative Example 1E.

Comparative Example 2G

Organic EL devices were manufactured in the same manner as in Comparative Example 2E.

Comparative Examples 3G and 4G

In each of Comparative Examples, organic EL devices were manufactured after a hole transport material and an electron transport material were prepared in the same manner as in Comparative Example 2G except that the arylamine derivatives for use in the hole transport material and the electron transport material were changed to those shown in FIG. 7(B), respectively.

Example 1H

Organic EL devices were manufactured after a hole transport material and an electron transport material were prepared in the same manner as in Example 1F except that the cross-linking agent A3 was used as an acrylic cross-linking agent instead of the cross-linking agent A1.

Examples 2H and 3H

In each of Examples 2H and 3H, organic EL devices were manufactured after a hole transport material and an electron transport material were prepared in the same manner as in Example 1H except that the mixing ratio (mole ratio) of the arylamine derivatives and the cross-linking agent A3 to be used for the hole transport material and the electron transport material were changed to those shown in Table 8(A), respectively.

Example 4H

Organic EL devices were manufactured after a hole transport material and an electron transport material were prepared in the same manner as in Example 1H except that as for the urethane acrylate based cross-linking agent represented by the above-mentioned general formula (B10) which is to be added to the hole transport material and the electron transport material, a cross-linking agent B3 (where $n^{10}$ is 60 to 70, and the two $A^1$s are hydrogen atoms) was used instead of the cross-linking agent A3.

Example 5H

Organic EL devices were manufactured after a hole transport material and an electron transport material were prepared in the same manner as in Example 1H except that as for the urethane acrylate based cross-linking agent represented by the above-mentioned general formula (B10) which is to be added to the hole transport material and the electron transport material, a cross-linking agent C3 (where $n^{10}$ is 120 to 140, and the two $A^1$s are hydrogen atoms) was used instead of the cross-linking agent A3.

Examples 6H to 20H

In each of Examples 6H to 20H, organic EL devices were manufactured after a hole transport material and an electron transport material were prepared in the same manner as in Example 1H except that the arylamine derivatives for use in the hole transport material and the electron transport material and the mixing ratio (mole ratio) of the arylamine derivatives and the cross-linking agent A3 were changed to those shown in Table 8(A) and Table 8(B), respectively.

Comparative Example 1H

Organic EL devices were manufactured in the same manner as in Comparative Example 1E.

Comparative Example 2H

Organic EL devices were manufactured in the same manner as in Comparative Example 2E.

Comparative Examples 3H and 4H

In each of Comparative Examples, organic EL devices were manufactured after a hole transport material and an electron transport material were prepared in the same manner as in Comparative Example 2H except that the arylamine derivatives for use in the hole transport material and the electron transport material were changed to those shown in FIG. 8(B), respectively.

3. Evaluation of Organic EL Device

The luminous brightness ($cd/m^2$), the maximum luminous efficiency (lm/W), and the time that elapsed before the luminous brightness became half of the initial value (that is, a half-life) of each of the organic EL devices obtained in Examples and Comparative Examples mentioned above were measured. Based on the measurement values for the five organic EL devices, an average was calculated.

In this regard, it is to be noted that the luminous brightness was measured by applying a voltage of 6V across the ITO electrode and the AlLi electrode.

The measurement values (that is, the luminous brightness, the maximum luminous efficiency, and the half-life) of each of Examples 1A to 6A and Comparative Examples 2A to 4A were evaluated based on the measurement values of Comparative Example 1A according to the following four criteria, respectively.

A: The measurement value was 1.5 times or more that of Comparative Example 1A.

B: The measurement value was 1.25 times or more but less than 1.5 times that of Comparative Example 1A.

C: The measurement value was 1.00 times or more but less than 1.25 times that of Comparative Example 1A.

D: The measurement value was 0.75 times or more but less than 1.00 times that of Comparative Example 1A.

The evaluation results are shown in the attached Table 1.

As shown in Table 1, all the organic EL devices of Examples (that is, organic EL devices including a hole transport layer which was formed using the conductive material according to the present invention as a main material) were superior to the organic EL devices of Comparative Examples in their luminous brightness, maximum luminous efficiency, and half-life.

From the result, it has been found that interaction between the adjacent main skeletons of the organic EL device according to the present invention was properly decreased. In addition, it has also been found that in the organic EL device according to the present invention mutual dissolution between the hole transport layer and the light emitting layer was properly prevented.

Further, it has been also found that in the organic EL devices of Examples having the adjacent main skeletons that exist at a suitable interval, the luminous brightness and the maximum luminous efficiency were more improved and the half-life was more prolonged.

In addition, organic EL devices were manufactured by preparing a hole transport material in the same manner as in Examples 1A to 6A except that a compound having a (meth)acryloyl group as a functional group of a substituent X was used. These organic EL devices were also evaluated in the same manner as described above, and as a result substantially the same results could be obtained.

The measurement values (that is, the luminous brightness, the maximum luminous efficiency, and the half-life) of each of Examples 1B to 18B, Examples 1B' to 6B' and Comparative Examples 2B to 8B were evaluated based on the measurement values of Comparative Example 1B according to the following four criteria, respectively.

A: The measurement value was 1.5 times or more that of Comparative Example 1B.

B: The measurement value was 1.25 times or more but less than 1.5 times that of Comparative Example 1B.

C: The measurement value was 1.00 times or more but less than 1.25 times that of Comparative Example 1B.

D: The measurement value was 0.75 times or more but less than 1.00 times that of Comparative Example 1B.

The evaluation results are shown in the attached Table 2.

As shown in Table 2, all the organic EL devices of Examples (that is, organic EL devices including a hole transport layer which was formed using the conductive material according to the present invention as a main material) were superior to the organic EL devices of Comparative Examples in their luminous brightness, maximum luminous efficiency, and half-life.

From the result, it has been found that interaction between the adjacent main skeletons of the organic EL device according to the present invention was properly decreased. In addition, it has also been found that in the organic EL device according to the present invention mutual dissolution between the hole transport layer and the light emitting layer was properly prevented.

Further, each of the organic EL devices of Examples 1B to 18B shows a tendency that the maximum luminous efficiency was improved as compared with the organic EL devices of Examples 1B' to 6B'. Such a result suggests that in the organic EL devices of Examples 1B to 18B the interval between the adjacent main skeletons could be maintained at a more suitable interval due to the addition of the polyester acrylate-based cross-linking agent.

Furthermore, the organic EL devices of Examples 2B, 5B, 8B, 11B, 14B and 17B which were formed from the hole transport material in which the compound represented by the above-mentioned general formula (A1) and the polyester acrylate-based cross-linking agent were mixed with a particularly preferable mixing ratio show a tendency that the luminous brightness and the maximum luminous efficiency were further improved and the half-life was further prolonged.

Moreover, in the case where the evaluation results are reviewed from the view point of the substituent X, there is a tendency that the compositions of Examples which contain the substituents X each having an appropriate $n^1$ value in the general formula (A2), that is the compositions containing the substituents X by which the adjacent main skeletons are allowed to exist at a suitable interval, could have more superior luminous brightness, maximum luminous efficiency, and half-life as compared with the compositions which do not have such a substituent X.

In addition, organic EL devices were manufactured by preparing a hole transport material in the same manner as in Examples 1B to 18B except that a compound having a (meth)acryloyl group as a functional group of a substituent X was used as the compound represented by the above-mentioned general formula (A1) and a polyester methacrylate compound was used as the polyester(meth)acrylate based cross-linking agent. These organic EL devices were also evaluated in the same manner as described above, and as a result substantially the same results could be obtained.

The measurement values (that is, the luminous brightness, the maximum luminous efficiency, and the half-life) of each of Examples 1C to 20C and Comparative Examples 2C to 7C were evaluated based on the measurement values of Comparative Example 1C according to the following four criteria, respectively.

A: The measurement value was 1.5 times or more that of Comparative Example 1C.

B: The measurement value was 1.25 times or more but less than 1.5 times that of Comparative Example 1C.

C: The measurement value was 1.00 times or more but less than 1.25 times that of Comparative Example 1C.

D: The measurement value was 0.75 times or more but less than 1.00 times that of Comparative Example 1C.

The evaluation results are shown in the attached Table 3.

As shown in Table 3, all the organic EL devices of Examples (that is, organic EL devices including a hole transport layer which was formed using the conductive material according to the present invention as a main material) were superior to the organic EL devices of Comparative Examples in their luminous brightness, maximum luminous efficiency, and half-life.

From the result, it has been found that interaction between the adjacent main skeletons of the organic EL device according to the present invention was properly decreased. In addition, it has also been found that in the organic EL device according to the present invention mutual dissolution between the hole transport layer and the light emitting layer was properly prevented.

Further, each of the organic EL devices of Examples 1C to 20C shows a tendency that the maximum luminous efficiency was improved as compared with the organic EL devices of Examples 1B' to 6B'. Such a result suggests that the interval between the adjacent main skeletons could be maintained at a more suitable interval due to the addition of the epoxy(meth)acrylate based cross-linking agent.

In this regard, it is to be noted that in the case where the length of the epoxy(meth)acrylate based cross-linking agent (that is, the interval between substituents X) is more appropriate, there is a tendency that the maximum luminous efficiency is was more conspicuously improved.

Furthermore, the organic EL devices of Examples 2C, 7C, 10C, 13C, 16C and 19C which were formed from the hole transport material in which the compound represented by the above-mentioned general formula (A1) and the epoxy acrylate based cross-linking agent were mixed with a particularly preferable mixing ratio show a tendency that the luminous brightness and the maximum luminous efficiency were further improved and the half-life was further prolonged.

Moreover, in the case where the evaluation results are reviewed from the view point of the substituent X, there is a tendency that the compositions of Examples which contain the substituents X each having an appropriate $n^1$ value in the general formula (A2), that is the compositions containing the substituents X by which the adjacent main skeletons are allowed to exist at a suitable interval, could have more superior luminous brightness, maximum luminous efficiency, and half-life as compared with the compositions which do not have such a substituent X.

In addition, organic EL devices were manufactured by preparing a hole transport material in the same manner as in Examples 1C to 20C except that a compound having a (meth)acryloyl group as a functional group of a substituent X was used as the compound represented by the above-mentioned general formula (A1) and an epoxy methacrylate compound was used as the epoxy(meth)acrylate-based cross-linking agent. These organic EL devices were also evaluated in the same manner as described above, and as a result substantially the same results could be obtained.

The measurement values (that is, the luminous brightness, the maximum luminous efficiency, and the half-life) of each of Examples 1D to 20D and Comparative Examples 2D to 7D were evaluated based on the measurement values of Comparative Example 1D according to the following four criteria, respectively.

A: The measurement value was 1.5 times or more that of Comparative Example 1D.

B: The measurement value was 1.25 times or more but less than 1.5 times that of Comparative Example 1D.

C: The measurement value was 1.00 times or more but less than 1.25 times that of Comparative Example 1D.

D: The measurement value was 0.75 times or more but less than 1.00 times that of Comparative Example 1D.

The evaluation results are shown in the attached Table 4.

As shown in Table 4, all the organic EL devices of Examples (that is, organic EL devices including a hole transport layer which was formed using the conductive material according to the present invention as a main material) were superior to the organic EL devices of Comparative Examples in their luminous brightness, maximum luminous efficiency, and half-life.

From the result, it has been found that interaction between the adjacent main skeletons of the organic EL device according to the present invention was properly decreased. In addition, it has also been found that in the organic EL device according to the present invention mutual dissolution between the hole transport layer and the light emitting layer was properly prevented.

Further, each of the organic EL devices of Examples 1D to 20D shows a tendency that the maximum luminous efficiency was improved as compared with the organic EL devices of Examples 1B' to 6B'. Such a result suggests that the interval between the adjacent main skeletons could be maintained at a more suitable interval due to the addition of the urethane acrylate-based cross-linking agent.

In this regard, it is to be noted that in the case where the length of the urethane acrylate-based cross-linking agent (that is, the interval between substituents X) is more appropriate, there is a tendency that the maximum luminous efficiency was more conspicuously improved.

Furthermore, the organic EL devices of Examples 2D, 7D, 10D, 13D, 16D and 19D which were formed from the hole transport material in which the compound represented by the above-mentioned general formula (A1) and the epoxy(meth)acrylate based cross-linking agent were mixed with a particularly preferable mixing ratio show a tendency that the luminous brightness and the maximum luminous efficiency were further improved and the half-life was further prolonged.

Moreover, in the case where the evaluation results are reviewed from the view point of the substituent X, there is a tendency that the compositions of Examples which contain the substituents X each having an appropriate $n^1$ value in the general formula (A2), that is the compositions containing the substituents X by which the adjacent main skeletons are allowed to exist at a suitable interval, could have more superior luminous brightness, maximum luminous efficiency, and half-life as compared with the compositions which do not have such a substituent X.

In addition, organic EL devices were manufactured by preparing a hole transport material in the same manner as in Examples 1D to 20D except that a compound having a (meth)acryloyl group as a functional group of a substituent X was used as the compound represented by the above-mentioned general formula (A1) and an urethane methacrylate compound was used as the urethane(meth)acrylate based cross-linking agent. These organic EL devices were also evaluated in the same manner as described above, and as a result substantially the same results could be obtained.

The measurement values (that is, the luminous brightness, the maximum luminous efficiency, and the half-life) of each of Examples 1E to 14E and Comparative Examples 2E to 4E were evaluated based on the measurement values of Comparative Example 1E according to the following four criteria, respectively.

A: The measurement value was 1.5 times or more that of Comparative Example 1E.

B: The measurement value was 1.25 times or more but less than 1.5 times that of Comparative Example 1E.

C: The measurement value was 1.00 times or more but less than 1.25 times that of Comparative Example 1E.

D: The measurement value was 0.75 times or more but less than 1.00 times that of Comparative Example 1E.

The evaluation results are shown in the attached Table 5.

As shown in Table 5, all the organic EL devices of Examples (that is, organic EL devices including a hole transport layer which was formed using the conductive material according to the present invention as a main material) were superior to the organic EL devices of Comparative Examples in their luminous brightness, maximum luminous efficiency, and half-life.

From the result, it has been found that interaction between the adjacent main skeletons of the organic EL device according to the present invention was properly decreased. In addition, it has been also found that in the organic EL device according to the present invention mutual dissolution between the hole transport layer and the light emitting layer was properly prevented.

Further, in the case where the evaluation results are reviewed from the view point of the substituent X, there is a tendency that the compositions of Examples which contain the substituents X each having an appropriate $n^1$ value in the general formula (A2), that is the compositions containing the substituents X by which the adjacent main skeletons are allowed to exist at a suitable interval, could have more superior luminous brightness, maximum luminous efficiency, and half-life as compared with the compositions which do not have such a substituent X.

Furthermore, by appropriately selecting conductive materials for respectively constituting the hole transport material and the electron transport material, namely, by appropriately selecting the group Y of the compound represented by the above-mentioned general formula (A1), the organic EL devices in the Examples which have a preferred combination of the hole transport layer and the electron transport layer could have superior luminous brightness, maximum luminous efficiency, and half-life.

In addition, organic EL devices were manufactured by preparing a hole transport material in the same manner as in Examples 1E to 14E except that a compound having a (meth)acryloyl group as a functional group of a substituent X was used as the compound represented by the above-mentioned general formula (A1). These organic EL devices were also evaluated in the same manner as described above, and as a result substantially the same results could be obtained.

The measurement values (that is, the luminous brightness, the maximum luminous efficiency, and the half-life) of each of Examples 1F to 18F, Examples 1F' to 14F' and Comparative Examples 2F to 4F were evaluated based on the measurement values of Comparative Example 1F according to the following four criteria, respectively.

A: The measurement value was 1.5 times or more that of Comparative Example 1F.

B: The measurement value was 1.25 times or more but less than 1.5 times that of Comparative Example 1F.

C: The measurement value was 1.00 times or more but less than 1.25 times that of Comparative Example 1F.

D: The measurement value was 0.75 times or more but less than 1.00 times that of Comparative Example 1F.

The evaluation results are shown in the attached Table 6(A) and Table 6(B).

As shown in Table 6(A) and Table 6(B), all the organic EL devices of Examples (that is, organic EL devices including a hole transport layer which was formed using the conductive material according to the present invention as a main material) were superior to the organic EL devices of Comparative Examples in their luminous brightness, maximum luminous efficiency, and half-life.

From the result, it has been found that interaction between the adjacent main skeletons of the organic EL device according to the present invention was properly decreased. In addition, it has been also found that in the organic EL device according to the present invention mutual dissolution between the hole transport layer and the light emitting layer was properly prevented.

Further, each of the organic EL devices of Examples 1F to 18F shows a tendency that the maximum luminous efficiency was improved as compared with the organic EL devices of Examples 1F' to 14F'. In this regard, it is to be noted that such a tendency was conspicuously confirmed in the organic EL devices formed of a hole transport material in which the compound represented by the above-mentioned general formula (A1) and the polyester(meth)acrylate based cross-linking agent were mixed so as to have a mixing ratio of 1:1. Such a result suggests that the interval between the adjacent main skeletons could be maintained at a more suitable interval due to the addition of the polyester(meth)acrylate based cross-linking agent.

Further, in the case where the evaluation results are reviewed from the view point of the substituent X, there is a tendency that the compositions of Examples which contain the substituents X each having an appropriate $n^1$ value in the general formula (A2), that is the compositions containing the substituents X by which the adjacent main skeletons are allowed to exist at a suitable interval, could have more superior luminous brightness, maximum luminous efficiency, and half-life as compared with the compositions which do not have such a substituent X.

Furthermore, by appropriately selecting conductive materials for respectively constituting the hole transport material and the electron transport material, namely, by appropriately selecting the group Y of the compound represented by the above-mentioned general formula (A1), the organic EL devices in the Examples which have a preferred combination of the hole transport layer and the electron transport layer could have superior luminous brightness, maximum luminous efficiency, and half-life.

In addition, organic EL devices were manufactured by preparing a hole transport material in the same manner as in Examples 1F to 18F and Examples 1F' to 14F' except that a compound having a (meth)acryloyl group as a functional group of a substituent X was used as the compound represented by the above-mentioned general formula (A1) and a polyester methacrylate compound was used as the polyester (meth)acrylate based cross-linking agent. These organic EL devices were also evaluated in the same manner as described above, and as a result substantially the same results could be obtained.

The measurement values (that is, the luminous brightness, the maximum luminous efficiency, and the half-life) of each of Examples 1G to 20G and Comparative Examples 2G to 4G were evaluated based on the measurement values of Comparative Example 1G according to the following four criteria, respectively.

A: The measurement value was 1.5 times or more that of Comparative Example 1G.

B: The measurement value was 1.25 times or more but less than 1.5 times that of Comparative Example 1G.

C: The measurement value was 1.00 times or more but less than 1.25 times that of Comparative Example 1G.

D: The measurement value was 0.75 times or more but less than 1.00 times that of Comparative Example 1G.

The evaluation results are shown in the attached Table 7(A) and Table 7(B).

As shown in Table 7(A) and Table 7(B), all the organic EL devices of Examples (that is, organic EL devices including a hole transport layer which was formed using the conductive material according to the present invention as a main material) were superior to the organic EL devices of Comparative Examples in their luminous brightness, maximum luminous efficiency, and half-life.

From the result, it has been found that interaction between the adjacent main skeletons of the organic EL device according to the present invention was properly decreased. In addition, it has been also found that in the organic EL device according to the present invention mutual dissolution between the hole transport layer and the light emitting layer was properly prevented.

Further, each of the organic EL devices of Examples 1G to 20G shows a tendency that the maximum luminous efficiency was improved as compared with the organic EL devices of Examples 1F' to 14F'. In this regard, it is to be noted that such a tendency was conspicuously confirmed in the organic EL devices formed from a hole transport material in which the compound represented by the above-mentioned general formula (A1) and the epoxy(meth)acrylate based cross-linking agent were mixed so as to have a mixing ratio of 1:1. Such a result suggests that the interval between the adjacent main skeletons could be maintained at a more suitable interval due to the addition of the epoxy(meth)acrylate based cross-linking agent.

In this regard, it is to be noted that in the case where the length of the epoxy acrylate-based cross-linking agent (that is, the interval between substituents X) is more appropriate, there is a tendency that the maximum luminous efficiency was more conspicuously improved.

Further, in the case where the evaluation results are reviewed from the view point of the substituent X, there is a tendency that the compositions of Examples which contain the substituents X each having an appropriate $n^1$ value in the general formula (A2), that is the compositions containing the substituents X by which the adjacent main skeletons are allowed to exist at a suitable interval, could have more superior luminous brightness, maximum luminous efficiency, and half-life as compared with the compositions which do not have such a substituent X.

Moreover, by appropriately selecting conductive materials for respectively constituting the hole transport material and the electron transport material, namely, by appropriately selecting the group Y of the compound represented by the above-mentioned general formula (A1), the organic EL devices in the Examples which have a preferred combination of the hole transport layer and the electron transport layer could have superior luminous brightness, maximum luminous efficiency, and half-life.

In addition, organic EL devices were manufactured by preparing a hole transport material in the same manner as in Examples 1G to 20G except that a compound having a (meth) acryloyl group as a functional group of a substituent X was used as the compound represented by the above-mentioned general formula (A1) and an epoxy methacrylate compound was used as the epoxy(meth)acrylate based cross-linking agent. These organic EL devices were also evaluated in the same manner as described above, and as a result substantially the same results could be obtained.

The measurement values (that is, the luminous brightness, the maximum luminous efficiency, and the half-life) of each of Examples 1H to 20H and Comparative Examples 2H to 4H were evaluated based on the measurement values of Comparative Example 1H according to the following four criteria, respectively.

A: The measurement value was 1.5 times or more that of Comparative Example 1H.

B: The measurement value was 1.25 times or more but less than 1.5 times that of Comparative Example 1H.

C: The measurement value was 1.00 times or more but less than 1.25 times that of Comparative Example 1H.

D: The measurement value was 0.75 times or more but less than 1.00 times that of Comparative Example 1H.

The evaluation results are shown in the attached Table 8(A) and Table 8(B).

As shown in Table 8(A) and Table 8(B), all the organic EL devices of Examples (that is, organic EL devices including a hole transport layer which was formed using the conductive material according to the present invention as a main material) were superior to the organic EL devices of Comparative Examples in their luminous brightness, maximum luminous efficiency, and half-life.

From the result, it has been found that interaction between the adjacent main skeletons of the organic EL device according to the present invention was properly decreased. In addition, it has been also found that in the organic EL device according to the present invention mutual dissolution between the hole transport layer and the light emitting layer was properly prevented.

Further, each of the organic EL devices of Examples 1H to 20H shows a tendency that the maximum luminous efficiency was improved as compared with the organic EL devices of Examples 1F' to 14F'. In this regard, it is to be noted that such a tendency was conspicuously confirmed in the organic EL devices formed of a hole transport material in which the compound represented by the above-mentioned general formula (A1) and the urethane(meth)acrylate based cross-linking agent were mixed so as to have a mixing ratio of 1:1. Such a result suggests that the interval between the adjacent main skeletons could be maintained at a more suitable interval due to the addition of the urethane(meth)acrylate based cross-linking agent.

In this regard, it is to be noted that in the case where the length of the urethane acrylate-based cross-linking agent (that is, the interval between substituents X) is more appropriate, there is a tendency that the maximum luminous efficiency was more conspicuously improved.

Further, in the case where the evaluation results are reviewed from the view point of the substituent X, there is a tendency that the compositions of Examples which contain the substituents X each having an appropriate $n^1$ value in the general formula (A2), that is the compositions containing the substituents X by which the adjacent main skeletons are allowed to exist at a suitable interval, could have more superior luminous brightness, maximum luminous efficiency, and half-life as compared with the compositions which do not have such a substituent X.

Moreover, by appropriately selecting conductive materials for respectively constituting the hole transport material and the electron transport material, namely, by appropriately selecting the group Y of the compound represented by the above-mentioned general formula (A1), the organic EL devices in the Examples which have a preferred combination of the hole transport layer and the electron transport layer could have superior luminous brightness, maximum luminous efficiency, and half-life.

In addition, organic EL devices were manufactured by preparing a hole transport material in the same manner as in Examples 1H to 20H except that a compound having a (meth) acryloyl group as a functional group of a substituent X was used as the compound represented by the above-mentioned general formula (A1) and an urethane methacrylate compound was used as the urethane(meth)acrylate based cross-linking agent. These organic EL devices were also evaluated in the same manner as described above, and as a result substantially the same results could be obtained.

4. Manufacture of Organic TFT

Five organic TFTs were manufactured in each of the following Examples and Comparative Examples.

Example 1I

Preparation of Organic Semiconductor Material

The compound (KII) was used as an arylamine derivative, and the compound (KII) and a radical polymerization initiator ("Irgacure 651" produced by Nagase & Co., Ltd.) in a weight ratio of 95:5 were mixed with dicloethane to obtain an organic semiconductor material (that is, a composition for conductive materials).

<Manufacture of Organic TFT>

1E First, a glass substrate having an average thickness of 1 mm was prepared, and was then washed with water (that is, with a cleaning fluid).

Next, a photoresist was applied onto the glass substrate by a spin coating method, and then the photoresist was prebaked to form a film.

Next, the film was irradiated with (or exposed to) ultraviolet rays through a photomask and was then developed. In this way, a resist layer having openings where a source electrode and a drain electrode were to be provided was formed.

2E Next, an aqueous gold colloidal solution was supplied to the openings by an inkjet method. Then, the glass substrate to which the aqueous gold colloidal solution had been supplied was dried by heating to obtain a source electrode and a drain electrode.

3E Next, the resist layer was removed by oxygen plasma treatment. Then, the glass substrate on which the source electrode and the drain electrode had been formed was washed with water, and was then washed with methanol.

4E Next, the prepared organic semiconductor material was applied onto the substrate by a spin coating method and then it was dried.

Then, the organic semiconductor material was irradiated with ultraviolet rays having a wavelength of 185 nm from a mercury lamp ("UM-452", USHIO Inc.) through a filter at an intensity of irradiation of 3 mW/cm$^2$ for 400 seconds in the atmosphere to polymerize the compound (KII), so that an organic semiconductor layer having an average thickness of 50 nm was formed on the glass substrate.

5E Next, a butyl acetate solution of polymethylmethacrylate (PMMA) was applied onto the organic semiconductor layer by a spin coating method, and was then dried to form a gate insulating layer having an average thickness of 500 nm.

6E Next, a water dispersion of polyethylenedioxythiophene was applied to an area on the gate insulating layer corresponding to the area between the source electrode and the drain electrode by an inkjet method, and was then dried to form a gate electrode having an average thickness of 100 nm.

In this way, an organic TFT was manufactured.

Examples 2I to 8I

In each of Examples 2I to 8I, organic TFTs were manufactured after the organic semiconductor material was prepared in the same manner as in Example 1I except that as for arylamine derivative for use in preparing the organic semiconductor material, those shown in Table 9 were used.

Comparative Example 1I

Preparation of Organic Semiconductor Material

The compound (SII) was dissolved in dichloroethane to prepare an organic semiconductor material.

<Manufacture of Organic TFT>

Organic TFTs were manufactured in the same manner as in Example 1I except that the organic semiconductor material was changed to the organic semiconductor material prepared in the step 4E and the organic semiconductor material was not irradiated with ultraviolet rays from a mercury lamp in the step 4E.

Comparative Example 2I

Preparation of Organic Semiconductor Material

The compound (SII) was used as an arylamine derivative, and polyester acrylate based cross-linking agent ("ARONIX M-8030" produced by TOAGOSEI CO., LTD.) was used as a photocrosslinking agent, and the compound (SII), the polyester acrylate based cross-linking agent and a radical polymerization initiator ("Irgacure 651" produced by Nagase & Co., Ltd.) in a weight ratio of 30:65:5 were mixed with dicloethane to obtain an organic semiconductor material.

<Manufacture of Organic TFT>

Organic TFTs were manufactured in the same manner as in Example 1I except that the organic semiconductor material prepared in this Comparative Example was used as the organic semiconductor material.

Comparative Example 3I

Organic TFTs were manufactured after the organic semiconductor material was prepared in the same manner as in Example 1I except that the compound (OII) was used as an arylamine derivative for use in preparing the organic semiconductor material, those shown in Table 2 were used.

Example 1J

Preparation of Organic Semiconductor Material

The compound (KII) was used as an arylamine derivative, an cross-linking agent A1 was used as the acrylate based cross-linking agent, and a radical polymerization initiator ("Irgacure 651" produced by Nagase & Co., Ltd.) was used as a photopolymerization initiator, and then they were dissolved with dicloethane to obtain an organic semiconductor material (that is, a composition for conductive materials).

In this regard, it is to be noted that the mixing ratio of the compound (KII) and the cross-linking agent A1 was 17:2 in a mole ratio, and the weight ratio of the radical polymerization initiator and the total weight of the compound (KII) and the cross-linking agent A1 was 19:1.

<Manufacture of Organic TFT>

1F First, in the same manner as the step 1E described above, a resist layer having openings where a source electrode and a drain electrode were to be provided was formed on a glass substrate.

2F Next, in the same manner as the step 2E described above, a source electrode and a drain electrode were formed on the substrate.

3F Next, in the same manner as the step 3E described above, the resist layer was removed, and then the glass substrate on which the source electrode and the drain electrode had been formed was washed with water.

4F Next, in the same manner as the step 4E described above, the prepared organic semiconductor material was applied onto the substrate by a spin coating method and then it was dried.

Then, the organic semiconductor material was irradiated with ultraviolet rays having a wavelength of 185 nm from a mercury lamp ("UM-452", USHIO Inc.) through a filter at an intensity of irradiation of 2 mW/cm$^2$ for 300 seconds in the atmosphere to polymerize the compound (KII) and the cross-linking agent A1, so that an organic semiconductor layer having an average thickness of 50 nm was formed on the glass substrate.

5F Next, in the same manner as the step 5E described above, a gate insulating layer having an average thickness of 500 nm was formed on the organic semiconductor layer.

6F Next, in the same manner as the step 5F described above, a gate electrode having an average thickness of 100 nm was formed on an area on the gate insulating layer corresponding to the area between the source electrode and the drain electrode.

Examples 2J to 10J

In each of Examples 2J to 10J, organic TFTs were manufactured after the organic semiconductor material was prepared in the same manner as in Example 1J except that the arylamine derivative for use in preparing the organic semiconductor material and the mixing ratio (mole ratio) of the arylamine derivative and the cross-linking agent A1 were changed to those shown in Table 10 were used.

Examples 1J' to 8J'

In each of Examples 1J' to 8J', organic TFTs were manufactured after the organic semiconductor material was prepared in the same manner as in Example 1J except that the addition of the cross-linking agent A1 to the organic semiconductor material was omitted and the arylamine derivative for use in preparing the organic semiconductor material was changed to those shown in Table 10.

Comparative Example 1J

Organic TFTs were manufactured in the same manner as Comparative Example 1I.

Comparative Examples 2J and 3J

In each of Examples 2J and 3J, organic TFTs were manufactured after the organic semiconductor material was prepared in the same manner as in Example 2J except that the arylamine derivative for use in preparing the organic semiconductor material was changed to those shown in Table 10.

Example 1K

Organic TFTs were manufactured after the organic semiconductor material was prepared in the same manner as in Example 1J except that the cross-linking agent A2 was used as the acrylic cross-linking agent instead of the cross-linking agent A1.

Examples 2K and 3K

In each of Examples 2K and 3K, organic TFTs were manufactured after the organic semiconductor material was prepared in the same manner as in Example 1I except that the mixing ratio (mole ratio) of the arylamine derivative for use in preparing the organic semiconductor material and the cross-linking agent A2 was changed as shown in Table 11.

Example 4K

Organic TFTs were manufactured after the organic semiconductor material was prepared in the same manner as in Example 1K except that the cross-linking agent B2 in which $n^6$ was 5 and two $A^1$s were hydrogen atoms were used as the epoxy acrylate-based cross-linking agent represented by the above-mentioned general formula (B4) and to be added to the organic semiconductor material instead of the cross-linking agent A2.

Example 5K

Organic TFTs were manufactured after the organic semiconductor material was prepared in the same manner as in Example 1K except that the cross-linking agent C2 in which $n^6$ was 12 and two $A^1$s were hydrogen atoms were used as the epoxy acrylate-based cross-linking agent represented by the above-mentioned general formula (B4) and to be added to the organic semiconductor material instead of the cross-linking agent A2.

Examples 6K to 12K

In each of Examples 6K to 12K, organic TFTs were manufactured after the organic semiconductor material was prepared in the same manner as in Example 1K except that the arylamine derivative for use in preparing the organic semiconductor material and the mixing ratio (mole ratio) of the arylamine derivative and the cross-linking agent A2 were changed as shown in Table 11.

Comparative Example 1K

Organic TFTs were manufactured in the same manner as Comparative Example 1I.

Comparative Examples 2K and 3K

In each of Comparative Examples 2K and 3K, organic TFTs were manufactured after the organic semiconductor material was prepared in the same manner as in Example 2K except that as for the arylamine derivative for use in preparing the organic semiconductor material, those shown in Table 11 were used.

Example 1L

Organic TFTs were manufactured after the organic semiconductor material was prepared in the same manner as in Example 1J except that the cross-linking agent A3 was used as the acrylic cross-linking agent instead of the cross-linking agent A1.

Examples 2L and 3L

In each of Examples 2L and 3L, organic TFTs were manufactured after the organic semiconductor material was prepared in the same manner as in Example 1L except that the mixing ratio (mole ratio) of the arylamine derivative for use in preparing the organic semiconductor material and the cross-linking agent A3 was changed as shown in Table 12.

Example 4L

Organic TFTs were manufactured after the organic semiconductor material was prepared in the same manner as in Example 1L except that the cross-linking agent B3 in which $n^{10}$ was 60 to 70 and two $A^1$s were hydrogen atoms were used as the urethane acrylate based cross-linking agent represented by the above-mentioned general formula (B10) and to be added to the organic semiconductor material instead of the cross-linking agent A3.

Example 5L

Organic TFTs were manufactured after the organic semiconductor material was prepared in the same manner as in Example 1L except that the cross-linking agent C3 in which $n^{10}$ was 120 to 140 and two $A^1$s were hydrogen atoms were used as the urethane acrylate based cross-linking agent represented by the above-mentioned general formula (B10) and to be added to the organic semiconductor material instead of the cross-linking agent A3.

Examples 6L to 12L

In each of Examples 6L to 12L, organic TFTs were manufactured after the organic semiconductor material was prepared in the same manner as in Example 1L except that the arylamine derivative for use in preparing the organic semiconductor material and the mixing ratio (mole ratio) of the arylamine derivative and the cross-linking agent A3 were changed as shown in Table 12.

Comparative Example 1L

Organic TFTs were manufactured in the same manner as Comparative Example 1I.

Comparative Examples 2L and 3L

In each of Comparative Examples 2L and 3L, organic TFTs were manufactured after the organic semiconductor material was prepared in the same manner as in Example 2L except that as for the arylamine derivative for use in preparing the organic semiconductor material, those shown in Table 12 were used.

5. Evaluation of Organic TFT

The OFF-state current and the ON-state current of each of the organic TFTs manufactured in Examples and Comparative Examples were measured.

Here, the word "OFF-state current" means the value of current flowing between the source electrode and the drain electrode when a gate voltage is not applied, and the word "ON-state current" means the value of current flowing between the source electrode and the drain electrode when a gate voltage is applied.

Therefore, a larger value of ratio of the absolute value of an ON-state current to the absolute value of an OFF-state current (hereinafter, simply referred to as a "value of ON/OFF ratio") means that an organic TFT has better characteristics.

The OFF-state current was measured at a potential difference between the source electrode and the drain electrode of 30 V, and the ON-state current was measured at a potential difference between the source electrode and the drain electrode of 30 V and an absolute value of gate voltage of 40 V.

The value of ON/OFF ratio of each of Examples and Comparative Examples was evaluated according to the following four criteria.

A: The value of ON/OFF ratio was $10^4$ or more.
B: The value of ON/OFF ratio was $10^3$ or more but less than $10^4$.
C: The value of ON/OFF ratio was $10^2$ or more but less than $10^3$.
D: The value of ON/OFF ratio was less than $10^2$.

The evaluation results are shown in Table 9 to Table 12.

As shown in Table 9, the values of ON/OFF ratio of all the organic TFTs obtained in Examples were larger than those of the organic TFTs obtained in Comparative Examples. This means that all the organic TFTs of Examples had better characteristics.

From the result, it has been found that interaction between the adjacent main skeletons was properly decreased. In addition, it is also apparent that in the organic EL device according to the present invention mutual dissolution between the organic semiconductor layer and the gate insulating layer was properly prevented.

Further, in the case where the evaluation results are reviewed from the view point of the substituent X, there is a tendency that the compositions of Examples which contain the substituents X each having an appropriate $n^1$ value in the general formula (A2), that is the compositions containing the substituents X by which the adjacent main skeletons are allowed to exist at a suitable interval, the value of ON/OFF ratio was more increased, that is, the characteristics of the organic TFT were further improved.

In addition, organic TFTs were manufactured after the organic semiconductor material was prepared in the same manner as in Examples 1I to 8I except that a compound in which the substituent X has a methacryloyl group as a functional group was used as the compound represented by the above-mentioned general formula (A1). Then, these organic TFTs were evaluated in the same manner described above, and as a result the same results shown in Table 11 were obtained.

Further, as shown in Table 10, the values of ON/OFF ratio of all the organic TFTs obtained in Examples were larger than those of the organic TFTs obtained in Comparative Examples. This means that all the organic TFTs of Examples had better characteristics.

From the result, it has been found that interaction between the adjacent main skeletons was properly decreased. In addition, it is also apparent that in the organic TFT according to the present invention mutual dissolution between the organic semiconductor layer and the gate insulating layer was properly prevented.

Further, there is a tendency that the organic TFTs of Examples 1J to 10J were improved in the value of ON/OFF ratio as compared to the organic TFTs of Examples 1J' to 8J'. This suggests that the addition of the polyester(meth)acrylate based cross-linking agent allowed the adjacent main skeletons to exist at a more suitable interval.

Further, in the case where the evaluation results are reviewed from the view point of the substituent X, there is a tendency that the compositions of Examples which contain the substituents X each having an appropriate $n^1$ value in the general formula (A2), that is the compositions containing the substituents X by which the adjacent main skeletons are allowed to exist at a suitable interval, the value of ON/OFF ratio was more increased, that is, the characteristics of the organic TFT were further improved.

In addition, organic TFTs were manufactured after the organic semiconductor material was prepared in the same manner as in Examples 1J to 10J and Examples 1J' to 8J' except that a compound in which the substituent X has a methacryloyl group as a functional group was used as the compound represented by the above-mentioned general formula (A1) and a polyester methacrylate compound was used as the polyester(meth)acrylate based cross-linking agent. Then, these organic TFTs were evaluated in the same manner described above, and as a result the same results shown in Table 12 were obtained.

Further, as shown in Table 11, the values of ON/OFF ratio of all the organic TFTs obtained in Examples were larger than those of the organic TFTs obtained in Comparative Examples. This means that all the organic TFTs of Examples had better characteristics.

From the result, it has been found that interaction between the adjacent main skeletons was properly decreased. In addition, it is also apparent that in the organic TFT according to the present invention mutual dissolution between the organic semiconductor layer and the gate insulating layer was properly prevented.

Further, there is a tendency that the organic TFTs of Examples 1K to 12K were improved in the value of ON/OFF ratio as compared to the organic TFTs of Reference Examples 1J' to 8J'. This suggests that the addition of the epoxy(meth) acrylate based cross-linking agent allowed the adjacent main skeletons to exist at a more suitable interval.

In this regard, it is to be noted that in the case where the length of the epoxy acrylate-based cross-linking agent (that is, the interval between substituents X) is more appropriate, there is a tendency that the ON/OFF ratio was conspicuously improved.

Further, in the case where the evaluation results are reviewed from the view point of the substituent X, there is a tendency that the compositions of Examples which contain the substituents X each having an appropriate $n^1$ value in the general formula (A2), that is the compositions containing the substituents X by which the adjacent main skeletons are allowed to exist at a suitable interval, could have more increased value of ON/OFF ratio, that is, the characteristics of the organic TFT were further improved.

In addition, organic TFTs were manufactured after the organic semiconductor material was prepared in the same manner as in Examples 1K to 12K except that a compound in which the substituent X has a methacryloyl group as a functional group was used as the compound represented by the above-mentioned general formula (A1) and an epoxy methacrylate compound was used as the epoxy(meth)acrylate based cross-linking agent. Then, these organic TFTs were evaluated in the same manner described above, and as a result the same results shown in Table 10 were obtained.

Furthermore, as shown in Table 12, the values of ON/OFF ratio of all the organic TFTs obtained in Examples were larger than those of the organic TFTs obtained in Comparative Examples. This means that all the organic TFTs of Examples had better characteristics.

From the result, it has been found that interaction between the adjacent main skeletons was properly decreased. In addition, it is also apparent that in the organic TFT according to the present invention mutual dissolution between the organic semiconductor layer and the gate insulating layer was properly prevented.

Further, there is a tendency that the organic TFTs of Examples 1L to 12L were improved in the value of ON/OFF ratio as compared to the organic TFTs of Reference Examples 1J' to 8J'. This suggests that the addition of the urethane(meth) acrylate based cross-linking agent allowed the adjacent main skeletons to exist at a more suitable interval.

In this regard, it is to be noted that in the case where the length of the urethane acrylate-based cross-linking agent (that is, the interval between substituents X) is more appropriate, there is a tendency that the ON/OFF ratio was conspicuously improved.

Further, in the case where the evaluation results are reviewed from the view point of the substituent X, there is a tendency that the compositions of Examples which contain the substituents X each having an appropriate $n^1$ value in the general formula (A2), that is the compositions containing the substituents X by which the adjacent main skeletons are allowed to exist at a suitable interval, could have more increased value of ON/OFF ratio, that is, the characteristics of the organic TFT were further improved.

In addition, organic TFTs were manufactured after the organic semiconductor material was prepared in the same manner as in Examples 1L to 12L except that a compound in which the substituent X has a methacryloyl group as a functional group was used as the compound represented by the above-mentioned general formula (A1) and an urethane methacrylate compound was used as the urethane(meth)acrylate based cross-linking agent. Then, these organic TFTs were evaluated in the same manner described above, and as a result the same results shown in Table 10 were obtained.

INDUSTRIAL APPLICABILITY

According to the present invention, the polymer contained in the conductive material has a structure in which adjacent main skeletons of compounds are repeatedly linked through a chemical structure which is produced by the direct polymerization reaction between any one or more of the respective substituents $X^1$, $X^2$, $X^3$ and $X^4$ of the compounds or a chemical structure which is produced by the polymerization reaction between the respective substituents X of the compounds via an acrylic cross-linking agent, that is, a structure in which adjacent main skeletons repeatedly exist at a suitable interval. Therefore, it is possible to decrease the interaction between the adjacent main skeletons in the polymer. Further, by forming the constituent material of the conductive layer from such a polymer, when an upper layer is formed on the conductive layer using a liquid material, it is possible to properly suppress or prevent the polymer from being swelled or dissolved by the solvent or dispersion medium contained in the liquid material. As a result, it is possible to prevent mutual dissolution from occurring between the conductive layer and the upper layer to be formed. For these reasons, the polymer can exhibit a high carrier transport ability, and thus a conductive material constituted from the polymer as its main material can also have a high carrier transport ability. Consequently, both an electronic device provided with such a conductive layer and an electronic equipment provided such an electronic device can have high reliability. Therefore, the present invention has industrial adaptability required by PCT.

TABLE 1

| | Hole transport material | Luminous brightness [Relative evaluation] | Maximum luminous efficiency [Relative evaluation] | Half-life [Relative evaluation] |
|---|---|---|---|---|
| Example 1A | Compound AI | A | A | A |
| Example 2A | Compound BI | A | A | A |
| Example 3A | Compound CI | A | A-B | A |
| Example 4A | Compound DI | A | A-B | A |
| Example 5A | Compound EI | B | B | B |
| Example 6A | Compound FI | A | B | A |
| Comp. Ex. 1A | Compound HI | 1.00 | 1.00 | 1.00 |
| Comp. Ex. 2A | Compound TII | D | C | D |
| Comp. Ex. 3A | Compound HI | C | C | C |
| Comp. Ex. 4A | Compound GI | C | C | C |

TABLE 2

| | Hole transport material | | | | |
|---|---|---|---|---|---|
| | Arylamine derivative | Mixing ratio with cross-linking agent A1*[1] | Luminous brightness [Relative evaluation] | Maximum luminous efficiency [Relative evaluation] | Half-life [Relative evaluation] |
| Example 1B | Compound AI | 17:2 | A | A | A |
| Example 2B | Compound AI | 1:1 | A | A | A |
| Example 3B | Compound AI | 2:17 | A | A | A |
| Example 4B | Compound BI | 17:2 | A | A | A |
| Example 5B | Compound BI | 1:1 | A | A | A |
| Example 6B | Compound BI | 2:17 | A | A | A |
| Example 7B | Compound CI | 17:2 | A | A | A |
| Example 8B | Compound CI | 1:1 | A | A | A |
| Example 9B | Compound CI | 2:17 | A | A | A |
| Example 10B | Compound DI | 17:2 | A | A | A |
| Example 11B | Compound DI | 1:1 | A | A | A |
| Example 12B | Compound DI | 2:17 | A | A | A |
| Example 13B | Compound EI | 17:2 | B | B | B |
| Example 14B | Compound EI | 1:1 | A | A | A |

TABLE 2-continued

|  | Hole transport material | | | | |
|---|---|---|---|---|---|
|  | Arylamine derivative | Mixing ratio with cross-linking agent A1[*1] | Luminous brightness [Relative evaluation] | Maximum luminous efficiency [Relative evaluation] | Half-life [Relative evaluation] |
| Example 15B | Compound EI | 2:17 | B | B | B |
| Example 16B | Compound FI | 17:2 | A | B | A |
| Example 17B | Compound FI | 1:1 | A | A | A |
| Example 18B | Compound FI | 2:17 | A | B | A |
| Example 1B' | Compound AI | — | A | B | B |
| Example 2B' | Compound BI | — | A | B | B |
| Example 3B' | Compound CI | — | A | B | B |
| Example 4B' | Compound DI | — | A | B | B |
| Example 5B' | Compound EI | — | B | C | B |
| Example 6B' | Compound FI | — | B | B | B |
| Comp. Ex. 1B | Compound HI | — | 1.00 | 1.00 | 1.00 |
| Comp. Ex. 2B | Compound TII | — | D | C | D |
| Comp. Ex. 3B | Compound AI | — | C | C | C |
| Comp. Ex. 4B | Compound HI | 17:2 | C | C | C |
| Comp. Ex. 5B | Compound GI | — | C | C | C |
| Comp. Ex. 6B | Compound GI | 17:2 | C | C | C |
| Comp. Ex. 7B | Compound GI | 1:1 | C | C | C |
| Comp. Ex. 8B | Compound GI | 2:17 | C | C | C |

—: Cross-linking agent A1 was not added.
[*1] As for acrylic cross-linking agent, a polyester acrylate-based cross-liking agent represented by the general formula (B1) (where $n^3$ is 10 to 15, and two $A^1$'s are hydrogen atoms) was used. Hereinafter, this cross-liking agent will be referred to as "cross-liking agent A1".

TABLE 3

|  | Hole transport material | | | | |
|---|---|---|---|---|---|
|  | Arylamine derivative | Mixing ratio with cross-linking agent A2[*2] | Luminous brightness [Relative evaluation] | Maximum luminous efficiency [Relative evaluation] | Half-life [Relative evaluation] |
| Example 1C | Compound AI | 17:2 | A | A | A |
| Example 2C | Compound AI | 1:1 | A | A | A |
| Example 3C | Compound AI | 2:17 | A | A | A |
| Example 4C | Compound AI | 17:2[*3] | A | A | A |
| Example 5C | Compound AI | 17:2[*4] | A | B | A |
| Example 6C | Compound BI | 17:2 | A | A | A |
| Example 7C | Compound BI | 1:1 | A | A | A |
| Example 8C | Compound BI | 2:17 | A | A | A |
| Example 9C | Compound CI | 17:2 | A | A | A |
| Example 10C | Compound CI | 1:1 | A | A | A |
| Example 11C | Compound CI | 2:17 | A | A | A |
| Example 12C | Compound DI | 17:2 | A | A | A |
| Example 13C | Compound DI | 1:1 | A | A | A |
| Example 14C | Compound DI | 2:17 | A | A | A |
| Example 15C | Compound EI | 17:2 | B | B | B |
| Example 16C | Compound EI | 1:1 | A | A | A |
| Example 17C | Compound EI | 2:17 | B | B | B |
| Example 18C | Compound FI | 17:2 | A | B | A |
| Example 19C | Compound FI | 1:1 | A | A | A |
| Example 20C | Compound FI | 2:17 | A | B | A |
| Comp. Ex. 1C | Compound HI | — | 1.00 | 1.00 | 1.00 |
| Comp. Ex. 2C | Compound TII | — | D | C | D |
| Comp. Ex. 3C | Compound AI | — | C | C | C |
| Comp. Ex. 4C | Compound HI | 17:2 | C | C | C |
| Comp. Ex. 5C | Compound GI | 17:2 | C | C | C |
| Comp. Ex. 6C | Compound GI | 1:1 | C | C | C |
| Comp. Ex. 7C | Compound GI | 2:17 | C | C | C |

—: Cross-linking agent A2 was not added.
[*2] As for acrylic cross-linking agent, an epoxy acrylate-based cross-liking agent represented by the general formula (B4) (where $n^6$ is 1, and two $A^1$'s are hydrogen atoms) was used. Hereinafter, this cross-liking agent will be referred to as "cross-liking agent A2".
[*3] Cross-linking agent B2 ($n^6$ is 5) was used instead of the cross-linking agent A2 ($n^6$ is 1).
[*4] Cross-linking agent C2 ($n^6$ is 12) was used instead of the cross-linking agent A2 ($n^6$ is 1).

TABLE 4

|  | Hole transport material | | Luminous brightness [Relative evaluation] | Maximum luminous efficiency [Relative evaluation] | Half-life [Relative evaluation] |
|---|---|---|---|---|---|
|  | Arylamine derivative | Mixing ratio with cross-linking agent A3*[5] | | | |
| Example 1D | Compound AI | 17:2 | A | A | A |
| Example 2D | Compound AI | 1:1 | A | A | A |
| Example 3D | Compound AI | 2:17 | A | A | A |
| Example 4D | Compound AI | 17:2*[6] | A | A | A |
| Example 5D | Compound AI | 17:2*[7] | A | B | A |
| Example 6D | Compound BI | 17:2 | A | A | A |
| Example 7D | Compound BI | 1:1 | A | A | A |
| Example 8D | Compound BI | 2:17 | A | A | A |
| Example 9D | Compound CI | 17:2 | A | A | A |
| Example 10D | Compound CI | 1:1 | A | A | A |
| Example 11D | Compound CI | 2:17 | A | A | A |
| Example 12D | Compound DI | 17:2 | A | A | A |
| Example 13D | Compound DI | 1:1 | A | A | A |
| Example 14D | Compound DI | 2:17 | A | A | A |
| Example 15D | Compound EI | 17:2 | B | B | B |
| Example 16D | Compound EI | 1:1 | A | A | A |
| Example 17D | Compound EI | 2:17 | B | B | B |
| Example 18D | Compound EI | 17:2 | A | B | A |
| Example 19D | Compound EI | 1:1 | A | A | A |
| Example 20D | Compound EI | 2:17 | A | B | A |
| Comp. Ex. 1D | Compound HI | — | 1.00 | 1.00 | 1.00 |
| Comp. Ex. 2D | Compound TII | — | D | C | D |
| Comp. Ex. 3D | Compound AI | — | C | C | C |
| Comp. Ex. 4D | Compound HI | 17:2 | C | C | C |
| Comp. Ex. 5D | Compound GI | 17:2 | C | C | C |
| Comp. Ex. 6D | Compound GI | 1:1 | C | C | C |
| Comp. Ex. 7D | Compound GI | 2:17 | C | C | C |

—: Cross-linking agent A3 was not added.

*[5] As for acrylic cross-linking agent, an urethane acrylate-based cross-liking agent represented by the general formula (B10) (where $n^{10}$ is 20 to 30, and two $A^1$s are hydrogen atoms) was used. Hereinafter, this cross-liking agent will be referred to as "cross-liking agent A3".

*[6] Cross-linking agent B3 ($n^{10}$ is 60 to 70) was used instead of the cross-linking agent A3 ($n^{10}$ is 20 to 30).

*[7] Cross-linking agent C3 ($n^{10}$ is 120 to 140) was used instead of the cross-linking agent A3 ($n^{10}$ is 20 to 30).

TABLE 5

|  | Hole transport material | Electron transport material | Luminous brightness [Relative evaluation] | Maximum luminous efficiency [Relative evaluation] | Half-life [Relative evaluation] |
|---|---|---|---|---|---|
| Example 1E | Compound AII | Compound III | A | A | A |
| Example 2E | Compound BII | Compound III | A | A | A |
| Example 3E | Compound CII | Compound III | B | B | B |
| Example 4E | Compound DII | Compound III | B | B | B |
| Example 5E | Compound EII | Compound III | B | B | B |
| Example 6E | Compound FII | Compound III | A | B | A |
| Example 7E | Compound HII | Compound JII | A | A | A |
| Example 8E | Compound AII | Compound JII | A | A | A |
| Example 9E | Compound HII | Compound III | A | A | A |
| Example 10E | Compound KII | Compound III | A | B | A |
| Example 11E | Compound KII | Compound JII | A | B | A |
| Example 12E | Compound AII | Compound RII | A | B | A |
| Example 13E | Compound HII | Compound RII | A | B | A |
| Example 14E | Compound KII | Compound RII | B | B | B |
| Comp. Ex. 1E | Compound SII | Compound UII | 1.00 | 1.00 | 1.00 |
| Comp. Ex. 2E | Compound TII | Compound UII | D | C | D |
| Comp. Ex. 3E | Compound SII | Compound UII | C | C | C |
| Comp. Ex. 4E | Compound GII | Compound UII | C | C | C |

TABLE 8(B)

| | Hole transport material | | Electron transport material | | Maximum Luminous brightness [Relative evaluation] | luminous efficiency [Relative evaluation] | Half-life [Relative evaluation] |
|---|---|---|---|---|---|---|---|
| | Arylamine derivative | Mixing ratio with cross-liknking agent A3*5 | Arylamine derivative | Mixing ratio with cross-liknking agent A3*5 | | | |
| Example 12H | Compound GII | 1:1 | Compound III | 1:1 | A | A | A |
| Example 13H | Compound AII | 1:1 | Compound III | 1:1 | A | A | A |
| Example 14H | Compound GII | 1:1 | Compound HII | 1:1 | A | A | A |
| Example 15H | Compound JII | 1:1 | Compound HII | 1:1 | A | B | A |
| Example 16H | Compound JII | 1:1 | Compound III | 1:1 | A | B | A |
| Example 17H | Compound AII | 1:1 | Compound PII | 1:1 | A | B | A |
| Example 18H | Compound GII | 1:1 | Compound PII | 1:1 | A | B | A |
| Example 19H | Compound JII | 1:1 | Compound PII | 1:1 | B | B | B |
| Comp. Ex. 1H | Compound QII | — | Compound SII | — | 1.00 | 1.00 | 1.00 |
| Comp. Ex. 2H | Compound RII | — | Compound SII | — | D | C | D |
| Comp. Ex. 3H | Compound QII | 1:1 | Compound SII | 1:1 | C | C | C |
| Comp. Ex. 4H | Compound FII | 1:1 | Compound SII | 1:1 | C | C | C |

—: Cross-linking agent A2 was not added.

*5 As for acrylic cross-linking agent, an urethane acrylate-based cross-liking agent represented by the general formula (B10) (where $n^{10}$ is 20 to 30, and two $A^1$s are hydrogen atoms) was used, that is the cross-liking agent A3 was used.

TABLE 6(B)

| | Hole transport material | | Electron transport material | | Maximum Luminous brightness [Relative evaluation] | luminous efficiency [Relative evaluation] | Half-life [Relative evaluation] |
|---|---|---|---|---|---|---|---|
| | Arylamine derivative | Mixing ratio with cross-linking agent A1*1 | Arylamine derivative | Mixing ratio with cross-linking agent A1*1 | | | |
| Example 1F' | Compound AII | — | Compound III | — | A | B | B |
| Example 2F' | Compound BII | — | Compound III | — | A | B | B |
| Example 3F' | Compound CII | — | Compound III | — | B | C | B |
| Example 4F' | Compound DII | — | Compound III | — | B | C | B |
| Example 5F' | Compound EII | — | Compound III | — | B | C | B |
| Example 6F' | Compound FII | — | Compound III | — | A | C | B |
| Example 7F' | Compound HII | — | Compound JII | — | A | B | B |
| Example 8F' | Compound AII | — | Compound JII | — | A | B | B |
| Example 9F' | Compound HII | — | Compound III | — | A | B | B |
| Example 10F' | Compound KII | — | Compound III | — | A | C | B |
| Example 11F' | Compound KII | — | Compound JII | — | A | C | B |
| Example 12F' | Compound AII | — | Compound RII | — | A | C | B |
| Example 13F' | Compound HII | — | Compound RII | — | A | C | B |
| Example 14F' | Compound KII | — | Compound RII | — | B | C | C |
| Comp. Ex. 1F | Compound SII | — | Compound UII | — | 1.00 | 1.00 | 1.00 |
| Comp. Ex. 2F | Compound TII | — | Compound UII | — | D | C | D |
| Comp. Ex. 3F | Compound SII | 1:1 | Compound UII | 1:1 | C | C | C |
| Comp. Ex. 4F | Compound GII | 1:1 | Compound UII | 1:1 | C | C | C |

—: Cross-linking agent A1 was not added.

*1 As for acrylic cross-linking agent, a polyester acrylate-based cross-liking agent represented by the general formula (B1) (where $n^3$ is 10 to 15, and two $A^1$s are hydrogen atoms) was used, that is the cross-liking agent A1 was used.

TABLE 7(A)

| | Hole transport material | | Electron transport material | | Maximum Luminous brightness [Relative evaluation] | luminous efficiency [Relative evaluation] | Half-life [Relative evaluation] |
|---|---|---|---|---|---|---|---|
| | Arylamine derivative | Mixing ratio with cross-linking agent A2*2 | Arylamine derivative | Mixing ratio with cross-linking agent A2*2 | | | |
| Example 1G | Compound AII | 17:2 | Compound III | 17:2 | A | A | A |
| Example 2G | Compound AII | 1:1 | Compound III | 1:1 | A | A | A |
| Example 3G | Compound AII | 2:17 | Compound III | 2:17 | A | A | A |
| Example 4G | Compound AII | 17:2*3 | Compound III | 17:2*3 | A | A | A |
| Example 5G | Compound AII | 17:2*4 | Compound III | 17:2*4 | A | B | A |
| Example 6G | Compound BII | 1:1 | Compound III | 1:1 | A | A | A |
| Example 7G | Compound CII | 1:1 | Compound III | 1:1 | A | A | A |
| Example 8G | Compound DII | 1:1 | Compound III | 1:1 | A | A | A |
| Example 9G | Compound EII | 17:2 | Compound III | 17:2 | B | B | B |

TABLE 7(A)-continued

|  | Hole transport material | | Electron transport material | | Maximum | | |
| --- | --- | --- | --- | --- | --- | --- | --- |
|  | Arylamine derivative | Mixing ratio with cross-linking agent A2*[2] | Arylamine derivative | Mixing ratio with cross-linking agent A2*[2] | Luminous brightness [Relative evaluation] | luminous efficiency [Relative evaluation] | Half-life [Relative evaluation] |
| Example 10G | Compound EII | 1:1 | Compound III | 1:1 | B | A | B |
| Example 11G | Compound EII | 2:17 | Compound III | 2:17 | B | B | B |

*[2] As for acrylic cross-linking agent, an epoxy acrylate-based cross-liking agent represented by the general formula (B4) (where $n^6$ is 1, and two $A^1$'s are hydrogen atoms) was used, that is the cross-liking agent A2 was used.

*[3] Cross-linking agent B2 ($n^6$ is 5) was used instead of the cross-linking agent A2 ($n^6$ is 1).

*[4] Cross-linking agent C2 ($n^6$ is 12) was used instead of the cross-linking agent A2 ($n^6$ is 1).

TABLE 7(B)

|  | Hole transport material | | Electron transport material | | Maximum | | |
| --- | --- | --- | --- | --- | --- | --- | --- |
|  | Arylamine derivative | Mixing ratio with cross-liknking agent A2*[2] | Arylamine derivative | Mixing ratio with cross-liknking agent A2*[2] | Luminous brightness [Relative evaluation] | luminous efficiency [Relative evaluation] | Half-life [Relative evaluation] |
| Example 12G | Compound FII | 1:1 | Compound III | 1:1 | A | A | B |
| Example 13G | Compound HII | 1:1 | Compound JII | 1:1 | A | A | A |
| Example 14G | Compound AII | 1:1 | Compound JII | 1:1 | A | A | A |
| Example 15G | Compound HII | 1:1 | Compound III | 1:1 | A | A | A |
| Example 16G | Compound KII | 1:1 | Compound III | 1:1 | A | B | A |
| Example 17G | Compound KII | 1:1 | Compound JII | 1:1 | A | B | A |
| Example 18G | Compound AII | 1:1 | Compound RII | 1:1 | A | B | A |
| Example 19G | Compound HII | 1:1 | Compound RII | 1:1 | A | B | A |
| Example 20G | Compound KII | 1:1 | Compound RII | 1:1 | B | B | B |
| Comp. Ex. 1G | Compound SII | — | Compound UII | — | 1.00 | 1.00 | 1.00 |
| Comp. Ex. 2G | Compound TII | — | Compound UII | — | D | C | D |
| Comp. Ex. 3G | Compound SII | 1:1 | Compound UII | 1:1 | C | C | C |
| Comp. Ex. 4G | Compound GII | 1:1 | Compound UII | 1:1 | C | C | C |

—: Cross-liking agent A2 was not added.

*[2] As for acrylic cross-linking agent, an epoxy acrylate-based cross-liking agent represented by the general formula (B4) (where $n^6$ is 1, and two $A^1$'s are hydrogen atoms) was used, that is the cross-liking agent A2 was used.

TABLE 8(A)

|  | Hole transport material | | Electron transport material | | Maximum | | |
| --- | --- | --- | --- | --- | --- | --- | --- |
|  | Arylamine derivative | Mixing ratio with cross-linking agent A3*[5] | Arylamine derivative | Mixing ratio with cross-linking agent A3*[5] | Luminous brightness [Relative evaluation] | luminous efficiency [Relative evaluation] | Half-life [Relative evaluation] |
| Example 1H | Compound AII | 17:2 | Compound III | 17:2 | A | A | A |
| Example 2H | Compound AII | 1:1 | Compound III | 1:1 | A | A | A |
| Example 3H | Compound AII | 2:17 | Compound III | 2:17 | A | A | A |
| Example 4H | Compound AII | 17:2*[6] | Compound III | 17:2*[6] | A | A | A |
| Example 5H | Compound AII | 17:2*[7] | Compound III | 17:2*[7] | A | B | A |
| Example 6H | Compound BII | 1:1 | Compound III | 1:1 | A | A | A |
| Example 7H | Compound CII | 1:1 | Compound III | 1:1 | A | A | A |
| Example 8H | Compound DII | 1:1 | Compound III | 1:1 | A | A | A |
| Example 9H | Compound EII | 17:2 | Compound III | 17:2 | B | B | B |
| Example 10H | Compound EII | 1:1 | Compound III | 1:1 | B | A | B |
| Example 11H | Compound EII | 2:17 | Compound III | 2:17 | B | B | B |

*[5] As for acrylic cross-linking agent, an urethane acrylate-based cross-liking agent represented by the general formula (B10) (where $n^{10}$ is 20 to 30, and two $A^1$'s are hydrogen atoms) was used, that is the cross-liking agent A3 was used.

*[6] Cross-linking agent B3 ($n^{10}$ is 60 to 70) was used instead of the cross-linking agent A3 ($n^{10}$ is 20 to 30).

*[7] Cross-linking agent C3 ($n^{10}$ is 120 to 140) was used instead of the cross-linking agent A3 ($n^{10}$ is 20 to 30).

TABLE 8(B)

| | Hole transport material | | Electron transport material | | Maximum | | |
|---|---|---|---|---|---|---|---|
| | Arylamine derivative | Mixing ratio with cross-linking agent A3*[5] | Arylamine derivative | Mixing ratio with cross-linking agent A3*[5] | Luminous brightness [Relative evaluation] | luminous efficiency [Relative evaluation] | Half-life [Relative evaluation] |
| Example 12H | Compound FII | 1:1 | Compound JII | 1:1 | A | A | B |
| Example 13H | Compound HII | 1:1 | Compound JII | 1:1 | A | A | A |
| Example 14H | Compound AII | 1:1 | Compound JII | 1:1 | A | A | A |
| Example 15H | Compound HII | 1:1 | Compound III | 1:1 | A | A | A |
| Example 16H | Compound KII | 1:1 | Compound III | 1:1 | A | B | A |
| Example 17H | Compound KII | 1:1 | Compound JII | 1:1 | A | B | A |
| Example 18H | Compound AII | 1:1 | Compound RII | 1:1 | A | B | A |
| Example 19H | Compound HII | 1:1 | Compound RII | 1:1 | A | B | A |
| Example 20H | Compound KII | 1:1 | Compound RII | 1:1 | B | B | B |
| Comp. Ex. 1H | Compound SII | — | Compound UII | — | 1.00 | 1.00 | 1.00 |
| Comp. Ex. 2H | Compound TII | — | Compound UII | — | D | C | D |
| Comp. Ex. 3H | Compound SII | 1:1 | Compound UII | 1:1 | C | C | C |
| Comp. Ex. 4H | Compound GII | 1:1 | Compound UII | 1:1 | C | C | C |

—: Cross-linking agent A2 was not added.
*[5]As for acrylic cross-linking agent, an urethane acrylate-based cross-liking agent represented by the general formula (B10) (where $n^{10}$ is 20 to 30, and two $A^1$s are hydrogen atoms) was used, that is the cross-liking agent A3 was used.

TABLE 9

| | Organic semiconductor material | ON/OFF ratio |
|---|---|---|
| Example 1I | Compound KII | A |
| Example 2I | Compound LII | B |
| Example 3I | Compound MII | B |
| Example 4I | Compound NII | B |
| Example 5I | Compound PII | A |
| Example 6I | Compound QII | A |
| Example 7I | Compound RII | A |
| Example 8I | Compound HII | A |
| Comp. Ex. 1I | Compound SII | D |
| Comp. Ex. 2I | Compound SII | C |
| Comp. Ex. 3I | Compound OII | C |

TABLE 10

| | Organic semiconductor material | | |
|---|---|---|---|
| | Arylamine derivative | Mixing ratio with cross-liknking agent A1*[1] | ON/OFF ratio |
| Example 1J | Compound KII | 17:2 | A-B |
| Example 2J | Compound KII | 1:1 | A |
| Example 3J | Compound KII | 2:17 | A-B |
| Example 4J | Compound LII | 1:1 | A |
| Example 5J | Compound MII | 1:1 | A-B |
| Example 6J | Compound NII | 1:1 | A-B |
| Example 7J | Compound PII | 1:1 | A |
| Example 8J | Compound QII | 1:1 | A |
| Example 9J | Compound RII | 1:1 | A |
| Example 10J | Compound HII | 1:1 | A |
| Example 1J' | Compound KII | — | B |
| Example 2J' | Compound LII | — | B-C |
| Example 3J' | Compound MII | — | B-C |
| Example 4J' | Compound NII | — | B-C |
| Example 5J' | Compound PII | — | B |
| Example 6J' | Compound QII | — | B |
| Example 7J' | Compound RII | — | B |
| Example 8J' | Compound HII | — | B |
| Comp. Ex. 1J | Compound SII | — | D |
| Comp. Ex. 2J | Compound SII | 1:1 | C |
| Comp. Ex. 3J | Compound OII | 1:1 | C |

—: Cross-linking agent A1 was not added.
*[1]As for acrylic cross-linking agent, a polyester acrylate-based cross-liking agent represented by the general formula (B1) (where $n^3$ is 10 to 15, and two $A^1$s are hydrogen atoms) was used, that is the cross-liking agent A1 was used.

TABLE 11

| | Organic semiconductor material | | |
|---|---|---|---|
| | Arylamine derivative | Mixing ratio with cross-liknking agent A2*[2] | ON/OFF ratio |
| Example 1K | Compound KII | 17:2 | A-B |
| Example 2K | Compound KII | 1:1 | A |
| Example 3K | Compound KII | 2:17 | A-B |
| Example 4K | Compound KII | 17:2*[3] | A-B |
| Example 5K | Compound KII | 17:2*[4] | B |
| Example 6K | Compound LII | 1:1 | A |
| Example 7K | Compound MII | 1:1 | A-B |
| Example 8K | Compound NII | 1:1 | A-B |
| Example 9K | Compound PII | 1:1 | A |
| Example 10K | Compound QII | 1:1 | A |
| Example 11K | Compound RII | 1:1 | A |
| Example 12K | Compound HII | 1:1 | A |
| Comp. Ex. 1K | Compound SII | — | D |
| Comp. Ex. 2K | Compound SII | 1:1 | C |
| Comp. Ex. 3K | Compound OII | 1:1 | C |

—: Cross-linking agent A2 was not added.
*[2]As for acrylic cross-linking agent, an epoxy acrylate-based cross-liking agent represented by the general formula (B4) (where $n^6$ is 1, and two $A^1$s are hydrogen atoms) was used, that is the cross-liking agent A2 was used.
*[3]Cross-linking agent B2 ($n^6$ is 5) was used instead of the cross-linking agent A2 ($n^6$ is 1).
*[4]Cross-linking agent C2 ($n^6$ is 12) was used instead of the cross-linking agent A2 ($n^6$ is 1).

TABLE 12

| | Organic semiconductor material | | |
|---|---|---|---|
| | Arylamine derivative | Mixing ratio with cross-liknking agent A3*[5] | ON/OFF ratio |
| Example 1L | Compound KII | 17:2 | A-B |
| Example 2L | Compound KII | 1:1 | A |
| Example 3L | Compound KII | 2:17 | A-B |
| Example 4L | Compound KII | 17:2*[6] | A-B |
| Example 5L | Compound KII | 17:2*[7] | B |
| Example 6L | Compound LII | 1:1 | A |
| Example 7L | Compound MII | 1:1 | A-B |
| Example 8L | Compound NII | 1:1 | A-B |
| Example 9L | Compound PII | 1:1 | A |
| Example 10L | Compound QII | 1:1 | A |
| Example 11L | Compound RII | 1:1 | A |
| Example 12L | Compound HII | 1:1 | A |
| Comp. Ex. 1L | Compound SII | — | D |

TABLE 12-continued

| | Organic semiconductor material | | |
|---|---|---|---|
| | Arylamine derivative | Mixing ratio with cross-liknking agent A3*[5] | ON/OFF ratio |
| Comp. Ex. 2L | Compound SII | 1:1 | C |
| Comp. Ex. 3L | Compound OII | 1:1 | C |

—: Cross-linking agent A3 was not added.
*[5]As for acrylic cross-linking agent, an urethane acrylate-based cross-liking agent represented by the general formula (B10) (where $n^{10}$ is 20 to 30, and two A[1]'s are hydrogen atoms) was used, that is the cross-liking agent A3 was used.
*[6]Cross-linking agent B3 ($n^{10}$ is 60 to 70) was used instead of the cross-linking agent A3 ($n^{10}$ is 20 to 30).
*[7]Cross-linking agent C3 ($n^{10}$ is 120 to 140) was used instead of cross-linking agent A3 ($n^{10}$ is 20 to 30).

What is claimed is:

1. A method of manufacturing an electronic device, comprising:
    applying a composition for conductive materials containing a compound represented by the following general formula (A1) onto a first electrode;
    polymerizing the composition for conductive materials to form a conductive layer having a carrier transport ability;
    forming a light emitting layer on the conductive layer;
    forming an electron transport layer on the light emitting layer; and
    forming a second electrode on the electron transport layer to obtain the electronic device;

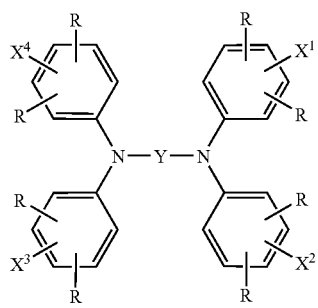

(A1)

wherein eight Rs are the same or different and each independently represents a hydrogen atom, a methyl group or an ethyl group, Y represents a group containing at least one substituted or unsubstituted aromatic hydrocarbon ring or substituted or unsubstituted heterocycle, and $X^1$, $X^2$, $X^3$ and $X^4$ are the same or different and each independently represents a substituent represented by the following general formula (A2):

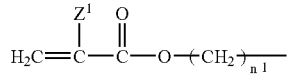

(A2)

wherein $n^1$ is an integer of 2 to 8 and $Z^1$ represents a hydrogen atom or a methyl group.

2. The method of manufacturing an electronic device as claimed in claim 1 wherein the light emitting layer is formed by applying a light emitting layer material containing a solvent or dispersion medium onto the conductive layer.

3. The method of manufacturing an electronic device as claimed in claim 2, wherein the conductive layer does not swell-up nor dissolve due to the solvent or dispersion medium.

4. The method of manufacturing an electronic device as claimed in claim 1, wherein the substituent $X^1$ and the substituent $X^3$ are identical with each other.

5. The method of manufacturing an electronic device as claimed in claim 1, wherein the substituent $X^2$ and the substituent $X^4$ are identical with each other.

6. The method of manufacturing an electronic device as claimed in claim 1, wherein the substituent $X^1$, the substituent $X^2$, the substituent $X^3$ and the substituent $X^4$ are identical with each other.

7. The method of manufacturing an electronic device as claimed in claim 1, wherein each of the substituent $X^1$, the substituent $X^2$, the substituent $X^3$ and the substituent $X^4$ is bonded to the 3-, 4- or 5-position of the benzene ring.

8. The method of manufacturing an electronic device as claimed in claim 1, wherein the group Y contains carbon atoms and hydrogen atoms.

9. The method of manufacturing an electronic device as claimed in claim 1, wherein the group Y contains 6 to 30 carbon atoms in total.

10. The method of manufacturing an electronic device as claimed in claim 1, wherein the group Y contains 1 to 5 aromatic hydrocarbon rings.

11. The method of manufacturing an electronic device as claimed in claim 1, wherein the group Y is a biphenylene group or derivative thereof.

12. The method of manufacturing an electronic device as claimed in claim 1, wherein the average thickness of the conductive layer is in the range of 10 to 150 nm.

13. The method of manufacturing an electronic device as claimed in claim 1, wherein the electronic device is a light emitting device or semiconductor device.

14. The method of manufacturing an electronic device as claimed in claim 13, wherein the light emitting device is an organic electroluminescent device.

15. Electronic equipment comprising the electronic device defined by claim 1.

* * * * *

UNITED STATES PATENT AND TRADEMARK OFFICE
CERTIFICATE OF CORRECTION

PATENT NO. : 8,012,528 B2
APPLICATION NO. : 11/661099
DATED : September 6, 2011
INVENTOR(S) : Yuji Shinohara, Koichi Terao and Takashi Shinohara It is certified that error appears in the above-identified patent and that said Letters Patent is hereby corrected as shown below:

Title Page, Item (73) Assignee:

Please change "Toyko" to --Tokyo--.

Signed and Sealed this
Tenth Day of January, 2012

David J. Kappos
*Director of the United States Patent and Trademark Office*